(12) United States Patent
Pernia et al.

(10) Patent No.: US 7,719,371 B2
(45) Date of Patent: May 18, 2010

(54) SPREAD SPECTRUM CLOCK AND REFERENCE SIGNAL GENERATOR

(75) Inventors: Scott Michael Pernia, Pinckney, MI (US); Gordon Carichner, Saline, MI (US); Eric Marsman, Canton, MI (US); Michael Shannon McCorquodale, Ann Arbor, MI (US)

(73) Assignee: Integrated Device Technology, Inc., San Jose, CA (US)

( * ) Notice: Subject to any disclaimer, the term of this patent is extended or adjusted under 35 U.S.C. 154(b) by 11 days.

(21) Appl. No.: 11/967,234

(22) Filed: Dec. 30, 2007

(65) Prior Publication Data

US 2008/0100350 A1     May 1, 2008

Related U.S. Application Data

(63) Continuation-in-part of application No. 11/950,707, filed on Dec. 5, 2007, and a continuation-in-part of application No. 11/384,973, filed on Mar. 20, 2006, (Continued)

(60) Provisional application No. 60/555,193, filed on Mar. 22, 2004.

(51) Int. Cl.
  *H03B 29/00* (2006.01)
  *H03L 7/06* (2006.01)

(52) U.S. Cl. .................. 331/78; 331/18; 331/179

(58) Field of Classification Search .............. 331/1 A, 331/16–18, 25, 36 C, 44, 78, 117 R, 117 FE, 331/117 D, 177 R, 177 V, 179, 181, 185, 331/186

See application file for complete search history.

(56) References Cited

U.S. PATENT DOCUMENTS 3,737,791 A     6/1973   Becker (Continued)

FOREIGN PATENT DOCUMENTS

| EP | 0 727 872 A1 | 8/1996 |
| WO | WO02/03540 A1 | 1/2002 |

*Primary Examiner*—David Mis
(74) *Attorney, Agent, or Firm*—Gamburd Law Group LLC

(57) ABSTRACT

Exemplary embodiments of the invention provide a system, method and apparatus for spread spectrum functionality for a free-running, reference harmonic oscillator. In an exemplary embodiment, an apparatus comprises a reference oscillator adapted to provide a reference signal having a reference frequency; and a spread spectrum controller adapted to control the reference oscillator to generate a spread-spectrum reference signal at a plurality of different reference frequencies during a predetermined or selected time period. An exemplary apparatus may also include a coefficient register adapted to store a plurality of coefficients and a plurality of controlled reactance modules responsive to a corresponding coefficient of the plurality of coefficients to modify an amount of reactance effectively coupled to the reference oscillator. An exemplary spread spectrum controller is further adapted to sequentially modify the plurality of coefficients during the predetermined time period to provide the spread spectrum reference signal.

88 Claims, 38 Drawing Sheets

Related U.S. Application Data now Pat. No. 7,358,826, which is a continuation-in-part of application No. 11/232,407, filed on Sep. 20, 2005, now Pat. No. 7,456,699, which is a continuation-in-part of application No. 11/084,962, filed on Mar. 21, 2005, now Pat. No. 7,227,423, and a continuation-in-part of application No. 11/085,372, filed on Mar. 21, 2005, now Pat. No. 7,227,424, application No. 11/967,234, which is a continuation-in-part of application No. 11/384,758, filed on Mar. 20, 2006, now Pat. No. 7,365,614, which is a continuation-in-part of application No. 11/232,407, application No. 11/967,234, which is a continuation-in-part of application No. 11/384,605, filed on Mar. 20, 2006, now Pat. No. 7,504,899, which is a continuation-in-part of application No. 11/232,407, application No. 11/967,234, which is a continuation-in-part of application No. 11/805,368, filed on May 23, 2007, and a continuation-in-part of application No. 11/805,427, filed on May 23, 2007, now Pat. No. 7,548,125, said application No. 11/805,368 is a continuation-in-part of application No. 11/232,409, filed on Sep. 20, 2005, now Pat. No. 7,248,124, and a continuation-in-part of application No. 11/384,605, and a continuation-in-part of application No. 11/384,973, said application No. 11/805,427 is a continuation-in-part of application No. 11/232,409, and a continuation-in-part of application No. 11/232,409, which is a continuation-in-part of application No. 11/084,962, which is a continuation-in-part of application No. 11/085,372.

(56) References Cited

U.S. PATENT DOCUMENTS

| | | | |
|---|---|---|---|
| 4,387,350 | A | 6/1983 | Bessolo et al. |
| 4,978,930 | A | 12/1990 | Suter |
| 5,241,286 | A | 8/1993 | Mirow |
| 5,359,303 | A | 10/1994 | Mirow |
| 5,426,384 | A | 6/1995 | May |
| 5,534,822 | A | 7/1996 | Taniguchi et al. |
| 6,016,081 | A | 1/2000 | O'Shaughnessy |
| 6,066,991 | A | 5/2000 | Naito et al. |
| 6,147,567 | A | 11/2000 | Welland et al. |
| 6,225,871 | B1 | 5/2001 | Chien |
| 6,233,441 | B1 | 5/2001 | Welland |
| 6,292,065 | B1 | 9/2001 | Friedman et al. |
| 6,388,532 | B1 * | 5/2002 | Babcock .................... 331/44 |
| 6,498,539 | B2 | 12/2002 | Griffin |
| 6,559,730 | B1 | 5/2003 | Marvin et al. |
| 6,650,193 | B2 * | 11/2003 | Endo et al. .................... 331/78 |
| 6,753,738 | B1 | 6/2004 | Baird |
| 6,876,266 | B2 | 4/2005 | Koo et al. |
| 6,972,635 | B2 | 12/2005 | McCorquodale |
| 7,030,706 | B2 | 4/2006 | Yao |
| 7,042,301 | B2 | 5/2006 | Sutardja |
| 7,098,748 | B2 | 8/2006 | Schmidt |
| 7,148,763 | B2 | 12/2006 | Sutardja |
| 7,227,423 | B2 | 6/2007 | McCorquodale |
| 7,227,424 | B2 | 6/2007 | McCorquodale |
| 7,268,646 | B2 | 9/2007 | Lutz et al. |
| 7,307,486 | B2 | 12/2007 | Pernia et al. |
| 7,332,975 | B2 | 2/2008 | Marques |
| 7,336,134 | B1 | 2/2008 | Janesch et al. |
| 7,358,826 | B2 | 4/2008 | McCorquodale |
| 7,365,614 | B2 | 4/2008 | McCorquodale |
| 7,456,699 | B2 | 11/2008 | McCorquodale |
| 7,504,899 | B2 | 3/2009 | McCorquodale |
| 7,548,125 | B2 | 6/2009 | McCorquodale et al. |
| 2001/0041548 | A1 | 11/2001 | Bult et al. |
| 2002/0063608 | A1 | 5/2002 | Sutliffe et al. |
| 2003/0025566 | A1 | 2/2003 | Rogers |
| 2003/0030497 | A1 | 2/2003 | Duncan et al. |
| 2003/0119467 | A1 | 6/2003 | Welland et al. |
| 2004/0116093 | A1 | 6/2004 | Otaka |
| 2004/0150483 | A1 | 8/2004 | Cho |
| 2005/0059373 | A1 | 3/2005 | Nakamura et al. |
| 2005/0068118 | A1 | 3/2005 | Hein |
| 2007/0222528 | A1 | 9/2007 | Pernia et al. |

\* cited by examiner

EXPONENTIAL SPREADING PROFILE

SPREAD SPECTRUM CLOCK AND REFERENCE SIGNAL GENERATOR

CROSS-REFERENCE TO RELATED APPLICATIONS

This application is a continuation-in-part of and claims priority to U.S. patent application Ser. No. 11/950,707, filed Dec. 5, 2007, inventors Scott Michael Pernia et al., entitled "Clock, Frequency Reference, and Other Reference Signal Generator", which is commonly assigned herewith, the entire contents of which are incorporated herein by reference with the same full force and effect as if set forth in their entirety herein, and with priority claimed for all commonly disclosed subject matter.

This application is also a continuation-in-part of and claims priority to U.S. patent application Ser. No. 11/384, 973, filed Mar. 20, 2006, inventors Michael Shannon McCorquodale et al., entitled "Discrete Clock Generator and Timing/Frequency Reference", which is commonly assigned herewith, the entire contents of which are incorporated herein by reference with the same full force and effect as if set forth in their entirety herein, and with priority claimed for all commonly disclosed subject matter, and which is a continuation-in-part of and further claims priority to U.S. patent application Ser. No. 11/232,407, filed Sep. 20, 2005, which is a continuation-in-part of and claims priority to U.S. patent application Ser. No. 11/084,962 and U.S. patent application Ser. No. 11/085,372, filed Mar. 21, 2005 and with a further claim of priority to U.S. Provisional Patent Application Ser. No. 60/555,193, filed Mar. 22, 2004.

This application is also a continuation-in-part of and claims priority to U.S. patent application Ser. No. 11/384, 758, filed Mar. 20, 2006, inventors Michael Shannon McCorquodale et al., entitled "Integrated Clock Generator and Timing/Frequency Reference", which is commonly assigned herewith, the entire contents of which are incorporated herein by reference with the same full force and effect as if set forth in their entirety herein, and with priority claimed for all commonly disclosed subject matter, and which is a continuation-in-part of and further claims priority to U.S. patent application Ser. No. 11/232,407, filed Sep. 20, 2005, which is a continuation-in-part of and claims priority to U.S. patent application Ser. No. 11/084,962 and U.S. patent application Ser. No. 11/085,372, filed Mar. 21, 2005 and with a further claim of priority to U.S. Provisional Patent Application Ser. No. 60/555,193, filed Mar. 22, 2004.

This application is also a continuation-in-part of and claims priority to U.S. patent application Ser. No. 11/384, 605, filed Mar. 20, 2006, inventors Michael Shannon McCorquodale et al., entitled "Inductor and Capacitor-Based Clock Generator and Timing/Frequency Reference", which is commonly assigned herewith, the entire contents of which are incorporated herein by reference with the same full force and effect as if set forth in their entirety herein, and with priority claimed for all commonly disclosed subject matter, and which is a continuation-in-part of and further claims priority to U.S. patent application Ser. No. 11/232,407, filed Sep. 20, 2005, which is a continuation-in-part of and claims priority to U.S. patent application Ser. No. 11/084,962 and U.S. patent application Ser. No. 11/085,372, filed Mar. 21, 2005 and with a further claim of priority to U.S. Provisional Patent Application Ser. No. 60/555,193, filed Mar. 22, 2004.

This application is also a continuation-in-part of and claims priority to U.S. patent application Ser. No. 11/805, 368, filed May 23, 2007, inventors Scott Michael Pernia et al., entitled "Multi-Terminal Harmonic Oscillator Integrated Circuit with Frequency Calibration and Frequency Configuration", which is commonly assigned herewith, the entire contents of which are incorporated herein by reference with the same full force and effect as if set forth in their entirety herein, and with priority claimed for all commonly disclosed subject matter, and which is a continuation-in-part of and further claims priority to U.S. patent application Ser. No. 11/232, 409, filed Sep. 20, 2005, to U.S. patent application Ser. No. 11/384,605 and to U.S. patent application Ser. No. 11/384, 973, which are a continuations-in-part of and claims priority to U.S. patent application Ser. No. 11/084,962 and U.S. patent application Ser. No. 11/085,372, filed Mar. 21, 2005 and with a further claim of priority to U.S. Provisional Patent Application Ser. No. 60/555,193, filed Mar. 22, 2004.

This application is also a continuation-in-part of and claims priority to U.S. patent application Ser. No. 11/805, 427, filed May 23, 2007, inventors Scott Michael Pernia et al., entitled "Frequency Calibration For A Monolithic Clock Generator And Timing/Frequency Reference", which is commonly assigned herewith, the entire contents of which are incorporated herein by reference with the same full force and effect as if set forth in their entirety herein, and with priority claimed for all commonly disclosed subject matter, and which is a continuation-in-part of and further claims priority to U.S. patent application Ser. No. 11/232,409, filed Sep. 20, 2005, and to U.S. patent application Ser. No. 11/384,605, which are a continuations-in-part of and claims priority to U.S. patent application Ser. No. 11/084,962 and U.S. patent application Ser. No. 11/085,372, filed Mar. 21, 2005 and with a further claim of priority to U.S. Provisional Patent Application Ser. No. 60/555,193, filed Mar. 22, 2004.

FIELD OF THE INVENTION

The present invention, in general, relates to oscillation or clocking signal generation, and more particularly, relates to a spread spectrum clock signal generator and timing/frequency reference.

BACKGROUND OF THE INVENTION

Accurate clock generators or timing references have generally relied upon crystal oscillators, such as quartz oscillators, which provide a mechanical, resonant vibration at a particular frequency. The difficulty with such crystal oscillators is that they cannot be fabricated as part of the same integrated circuit ("IC") that is to be driven by their clock signal. For example, microprocessors such as the Intel Pentium processor require a separate clock IC. As a consequence, virtually every circuit requiring an accurate clock signal requires an off-chip clock generator. Accordingly, accurate and stable clocking capability is one of the last functional components in electronic systems that have not been subject to integration.

There are several consequences for such non-integrated solutions. For example, because such a processor must be connected through outside circuitry (such as on a printed circuit board (PCB)), power dissipation is comparatively increased. In applications which rely on a finite power supply, such as battery power in mobile communications, such additional power dissipation is detrimental.

In addition, such non-integrated solutions, by requiring an additional IC, increase space and area requirements, whether on the PCB or within the finished product, which is also detrimental in mobile environments. Moreover, such additional components increase manufacturing and production costs, as an additional IC must be fabricated and assembled with the primary circuitry (such as a microprocessor).

Other clock generators which have been produced as integrated circuits with other circuits are generally not sufficiently accurate, particularly over fabrication process, voltage, and temperature ("PVT") variations. For example, ring, relaxation and phase shift oscillators may provide a clock signal suitable for some low-sensitivity applications, but have been incapable of providing the higher accuracy required in more sophisticated electronics, such as in applications requiring significant processing capability or data communications. In addition, these clock generators or oscillators often exhibit considerable frequency drift, jitter, have a comparatively low Q-value, and are subject to other distortions from noise and other interference.

As a consequence, a need remains for a reference signal or clock generator which may be integrated monolithically with other circuitry, as a single IC, or which may be a discrete IC utilized to provide a clock or other reference signal to the other circuitry, and which is highly accurate over PVT variations. Such a reference signal or clock generator should be free-running and/or self-referencing, and should not require locking or referencing to another reference signal. Such a reference signal or clock generator should exhibit minimal frequency drift and have comparatively low jitter, and should be suitable for applications requiring a highly accurate system clock. Such a clock generator or timing reference should provide for control over output frequency, to provide a stable and desired frequency in response to variation in ambient or junction temperature or variation in other parameters such as voltage, fabrication process, frequency, and age. Lastly, such a clock generator or timing reference should also provide multiple operating modes, including a spread spectrum mode to reduce potential interference with other signals.

SUMMARY OF THE INVENTION

Exemplary embodiments of the invention provide a reference signal generator, system and method which provides a superior reference signal, and which is capable of being fully integrated with other electronics. The exemplary reference signal generator and system provides a very accurate reference and/or clock signal, with very low error, very low phase noise and period jitter, and with extremely fast rise and fall times, rendering the exemplary embodiments suitable for highly exacting applications. The exemplary embodiments also provide for accurate frequency control over variable parameters such as temperature, fabrication process variation, and IC aging. In various exemplary embodiments, the invention provides an apparatus which generates a frequency reference signal, which may be modified directly to generate a spread spectrum reference signal, such as for reducing interference with other signals.

As described in greater detail below, the exemplary embodiments of the invention provide a spread spectrum reference signal which is considered to be superb by those having skill in the art. For example, the measured spread spectrum power reduction at the seventh harmonic for the third system embodiment described below provided a power reduction of 12.2 dB, for a center or starting frequency of 24 MHz, spread at a 30 kHz rate and with a 1% modulation depth or range (240 kHz). Similarly, also as described in greater detail below, the spread spectrum functionality of the present invention did not generate any non-monotonic or spurious transitions, for a center or starting frequency of 12 MHz, spread at a 30 kHz rate and with a 1.2% modulation depth or range (144 kHz).

An exemplary apparatus embodiment comprises: a reference oscillator adapted to provide a reference signal having a reference frequency; and a spread spectrum controller adapted to control the reference oscillator to generate a spread spectrum reference signal at a plurality of different reference frequencies over a predetermined time period.

In an exemplary embodiment, the spread spectrum controller may be further adapted to modify a spread spectrum parameter of the reference oscillator to modify the reference frequency. For example, the spread spectrum parameter may be at least one of the following spread spectrum parameters: an effective reactance, a control voltage, an oscillation amplitude, a common mode voltage, or a transconductance.

The spread spectrum reference signal may be configurable to have a selected spread spectrum profile having a spreading direction, a depth of spreading, and a spreading modulation rate or period.

In an exemplary embodiment, the spread spectrum controller is further adapted to modify an amount of reactance effectively coupled to the reference oscillator, such as by switching a capacitance to or from the reference oscillator, or by selecting or modifying a plurality of coefficients to control switching of a capacitance to or from the reference oscillator. When the reference oscillator further comprises at least one varactor, the spread spectrum controller may be further adapted to modify the effective reactance by modifying a control voltage of the varactor. In some exemplary embodiments, the spread spectrum controller may be further adapted to select or modify a plurality of coefficients to modify the control voltage. In other exemplary embodiments, when the reference oscillator further comprises a control voltage generator having a variable resistance, the spread spectrum controller may be further adapted to modify the control voltage by varying the variable resistance.

In additional exemplary embodiments, the spread spectrum controller is further adapted to modify the effective reactance by switching an inductance to or from the reference oscillator. More generally, the spread spectrum controller may be further adapted to modify an effective impedance of the reference oscillator, or to modify an effective resistance of the reference oscillator, or to modify an amplitude of the reference signal of the reference oscillator, or to modify the amplitude by modifying a current of the reference oscillator, or to modify a common mode voltage of the reference oscillator, or to modify the common mode voltage by modifying a current of the reference oscillator. the spread spectrum controller is further adapted to modify a current of the reference oscillator by modifying a reference voltage. Yet in additional exemplary embodiments, the spread spectrum controller may be further adapted to modify a divide ratio of the reference signal of the reference oscillator, or to modify a transconductance of the reference oscillator.

In an exemplary embodiment, the apparatus further comprises: a coefficient register adapted to store a plurality of coefficients; and a plurality of controlled reactance modules coupled to the coefficient register, each controlled reactance module responsive to a corresponding coefficient of the plurality of coefficients to modify an amount of effective reactance of the reference oscillator. For this exemplary embodiment, the spread spectrum controller may be further adapted to select or modify at least one coefficient of the plurality of coefficients to control the reference oscillator to generate the spread-spectrum reference signal. In various exemplary embodiments, each controlled reactance module comprises a capacitance, an inductance, and/or a resistance; or comprises one or more capacitors, with each capacitor having a single predetermined unit of capacitance; or comprises one or more capacitors and a resistor, with each capacitor having a single predetermined unit of capacitance.

Also for this exemplary embodiment, the effective reactance also may be modified by switching a controlled reactance module to or from the reference oscillator in response to the corresponding coefficient; or when the reference oscillator further comprises a control voltage generator, the effective reactance also may be modified by changing a control voltage, in response to the corresponding coefficient, to a controlled reactance module coupled to the reference oscillator. Each controlled reactance module of the plurality of controlled reactance modules may be responsive to a corresponding coefficient of the plurality of coefficients to modify an amount of reactance coupled to the reference oscillator. The spread spectrum controller may be coupled to the coefficient register and may be further adapted to sequentially modify the plurality of coefficients during the predetermined time period to provide the spread-spectrum reference signal. For example, the spread spectrum controller may be further adapted to increment or decrement the plurality of coefficients to modify the reference frequency. In addition, the plurality of controlled reactance modules may be linearly responsive to the plurality of coefficients to modify substantially linearly the amount of reactance coupled to the reference oscillator. Also for example, the spread spectrum controller may be further adapted to sequentially increment and sequentially decrement at least one coefficient to provide a triangular spread spectrum profile.

In an exemplary embodiment, the apparatus further comprises: a memory adapted to store a plurality of increment values; and wherein the spread spectrum controller further comprises: a counter adapted to provide a plurality of time interval counts; an adder; and a state machine coupled to the counter, to the adder and to the memory, the state machine adapted, in response to a predetermined time interval count of the plurality of time interval counts, to signal the adder to add a corresponding increment value, of the plurality of increment values, to the plurality of coefficients to provide a next plurality of coefficients to the coefficient register. The state machine may be further adapted to modify or select the increment value, of the plurality of increment values, in response to a predetermined time interval count of the plurality of time interval counts.

In an exemplary embodiment, the spread spectrum controller may further comprise: a counter adapted to provide a plurality of time interval counts; and a state machine coupled to the counter, the state machine adapted, in response to a predetermined time interval count of the plurality of time interval counts, to select a next plurality of coefficients from the coefficient register.

Also in various exemplary embodiments, the spread-spectrum reference signal may have at least one of the following types of spread spectrum profiles: a triangular spread spectrum profile, a sinusoidal spread spectrum profile, an exponential spread spectrum profile, or a dual-inflection spread spectrum profile.

In another exemplary embodiment, an apparatus, comprises: a reference resonator adapted to provide a reference signal having a resonant frequency; a coefficient register adapted to store a plurality of coefficients; a plurality of controlled reactance modules coupled to the reference resonator and to the coefficient register; and a spread spectrum controller coupled to the coefficient register, the spread spectrum controller adapted to select or modify at least one coefficient of the plurality of coefficients to provide the reference signal at a plurality of different resonant frequencies during a selected or predetermined time period.

In this exemplary embodiment, each controlled reactance module of the plurality of controlled reactance modules may be responsive to a corresponding coefficient of the plurality of coefficients to modify an amount of reactance coupled to the reference resonator. The spread spectrum controller may be further adapted to increment or decrement the at least one coefficient to modify the resonant frequency, such as to sequentially increment and sequentially decrement the at least one coefficient to provide a triangular spread spectrum profile. The spread spectrum controller may be further adapted to increment or decrement the at least one coefficient to modify the resonant frequency and provide the plurality of different resonant frequencies having a selected spread spectrum profile during the selected time period.

For this exemplary embodiment, the plurality of controlled reactance modules also may be substantially linearly responsive to the plurality of coefficients to modify substantially linearly the amount of reactance coupled to the reference resonator, such as responsive to a corresponding coefficient of the plurality of coefficients to switch a corresponding reactance to the reference resonator, or responsive to a corresponding coefficient of the plurality of coefficients to switch a corresponding reactance to a control voltage. In another exemplary embodiment, a control voltage generator may be responsive to a corresponding coefficient of the plurality of coefficients to modify a control voltage for a corresponding controlled reactance module of the plurality of controlled reactance modules.

A wide variety of controlled reactance modules are within the scope of the present invention. In some exemplary embodiments, the plurality of controlled reactance modules further comprise a plurality of switchable capacitive modules coupled to the coefficient register and to the reference resonator, with each switchable capacitive module having a fixed capacitance and a variable capacitance, and with each switchable capacitive module responsive to a corresponding coefficient of the plurality of coefficients to switch between the fixed capacitance and the variable capacitance and to switch each variable capacitance to a control voltage. The plurality of controlled reactance modules also may further comprise a plurality of switchable resistive modules coupled to the coefficient register, with each switchable resistive module responsive to a corresponding coefficient of the plurality of coefficients to switch the switchable resistive module to a control voltage or to the reference resonator.

In other exemplary embodiments, the plurality of controlled reactance modules further comprises a plurality of switchable capacitive modules coupled to the coefficient register and to the reference resonator, with each switchable capacitive module having a first fixed capacitance and a second fixed capacitance, and with each switchable capacitive module responsive to a corresponding coefficient of the plurality of calibration coefficients to switch between the first fixed capacitance and the second fixed capacitance.

In additional exemplary embodiments, the plurality of controlled reactance modules further comprises an array having a plurality of switchable variable capacitive modules coupled to the coefficient register and to the reference resonator, each switchable variable capacitive module responsive to a corresponding coefficient of the plurality of calibration coefficients to switch between a first voltage and a second voltage. At least one of the first voltage and second voltage may be a fixed voltage or a variable voltage. In other exemplary embodiments, the plurality of controlled reactance modules further comprises an array having a plurality of variable capacitive modules coupled to the reference resonator and to a control voltage. The control voltage may be variable in response to the plurality of coefficients. Yet in other exemplary embodiments, the plurality of controlled reactance modules further comprises a plurality of switchable capacitive modules coupled to the coefficient register and to the reference resonator, each switchable capacitive module responsive to a corresponding coefficient of the plurality of calibration coefficients to switch to or from the reference resonator.

In an exemplary embodiment, the spread spectrum controller may further comprise: a counter adapted to provide a plurality of time interval counts; an adder; and a state machine coupled to the counter and to the memory, the state machine adapted, in response to a predetermined time interval count of the plurality of time interval counts, to signal the adder to add an increment value to the plurality of coefficients to provide a next plurality of coefficients to the coefficient register. The plurality of time interval counts may be determined by counting successive rising or falling edges of the reference signal. The state machine may be further adapted to modify or select the increment value in response to a predetermined time interval count of the plurality of time interval counts.

The memory also may be adapted to store a plurality of increment values corresponding to a plurality of predetermined time interval counts to form a spread spectrum profile. In this exemplary embodiment, the state machine may be further adapted, in response to each predetermined time interval count of the plurality of predetermined time interval counts, to signal the adder to add a corresponding increment value, of the plurality of increment values, to the plurality of coefficients to provide a next plurality of coefficients to the coefficient register In another exemplary embodiment, the spread spectrum controller further comprises a counter adapted to provide a plurality of time interval counts; and a state machine coupled to the counter, the state machine adapted, in response to a predetermined time interval count of the plurality of time interval counts, to select a next plurality of coefficients from the coefficient register or from a memory.

In other exemplary embodiments, the spread spectrum controller comprises a finite state machine and combinational logic circuitry. In yet additional exemplary embodiments, the spread spectrum controller comprises a processor.

The exemplary apparatus and systems may also be configurable or programmable, and may further comprise an input-output interface adapted to receive a plurality of spread spectrum parameters. For example, the plurality of spread spectrum parameters may comprises at least one or two of the following parameters: a spreading direction, a depth of spreading, and a spreading modulation rate or period.

In another exemplary embodiment, the apparatus may further comprise a second oscillator coupled to the spread spectrum controller and adapted to provide a clock signal at a substantially fixed frequency. An exemplary apparatus or system may also further comprise a frequency divider coupled to the reference resonator, the frequency divider adapted to divide the resonant frequency by a rational number into a plurality of second signals having a corresponding plurality of frequencies, the plurality of frequencies substantially equal to or lower than the resonant frequency.

In other exemplary embodiments, a spread spectrum clock generator is disclosed, comprising: a reference oscillator adapted to provide a reference signal having a reference frequency; a coefficient register adapted to store a plurality of coefficients; a plurality of controlled reactance modules coupled to the reference oscillator and to the coefficient register, each controlled reactance module responsive to a corresponding coefficient of the plurality of coefficients to modify an amount of effective reactance coupled to the reference oscillator; and a spread spectrum controller coupled to the coefficient register and adapted to modify the plurality of coefficients to control the reference oscillator to generate a reference signal at a plurality of different reference frequencies.

In other exemplary embodiments, a method of spread-spectrum clock generation is provided, comprising: generating a reference signal from a reference oscillator; and controlling the reference oscillator to generate a spread-spectrum reference signal at a plurality of different reference frequencies during a predetermined time period. The controlling step may further comprise sequentially modifying a plurality of coefficients during the predetermined time period to provide the spread-spectrum reference signal, or modifying a control voltage during the predetermined time period to provide the spread-spectrum reference signal, or modifying an effective reactance of the reference oscillator during the predetermined time period to provide the spread-spectrum reference signal, or modifying a current of the reference oscillator during the predetermined time period to provide the spread-spectrum reference signal, or modifying an oscillation amplitude of the reference signal during the predetermined time period to provide the spread-spectrum reference signal, or modifying a common mode voltage of the reference oscillator during the predetermined time period to provide the spread-spectrum reference signal, or modifying a divide ratio of the reference oscillator during the predetermined time period to provide the spread-spectrum reference signal.

The exemplary method also may further comprise: responding to a corresponding coefficient of the plurality of coefficients to modify an amount of reactance coupled to the reference oscillator; or switching a corresponding reactance to the reference oscillator or switching a corresponding reactance to a control voltage; incrementing or decrementing the plurality of coefficients to modify the reference frequency.

In other exemplary embodiments, the controlling step may further comprise: counting the reference signal to provide a plurality of time interval counts; and at predetermined time interval counts of the plurality of time interval counts, modifying a plurality of coefficients to modify an amount of reactance effectively coupled to the reference oscillator. The exemplary method may also include restoring an initial plurality of coefficients to generate the reference signal having a calibrated, starting or center reference frequency. The step of modifying also may further comprise: determining an increment value, of a plurality of increment values, corresponding to a predetermined time interval count of the plurality of time interval counts; and in response to the predetermined time interval count, incrementing or decrementing the plurality of coefficients.

In other exemplary embodiments, a spread spectrum controller is disclosed which is couplable to a reference oscillator, with the reference oscillator adapted to provide a reference signal having a reference frequency, and with the spread spectrum controller comprising: a memory adapted to store a plurality of coefficients; and a controller adapted to control the reference oscillator to generate a spread-spectrum reference signal at a plurality of different reference frequencies during a predetermined time period.

These and additional embodiments are discussed in greater detail below. Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings, wherein like reference numerals are used to identify identical components in the various views, and wherein reference numerals with alphabetic characters are utilized to identify additional types, instantiations or variations of a selected component embodiment in the various views, in which.

DETAILED DESCRIPTION OF EXEMPLARY EMBODIMENTS

Figure 1:
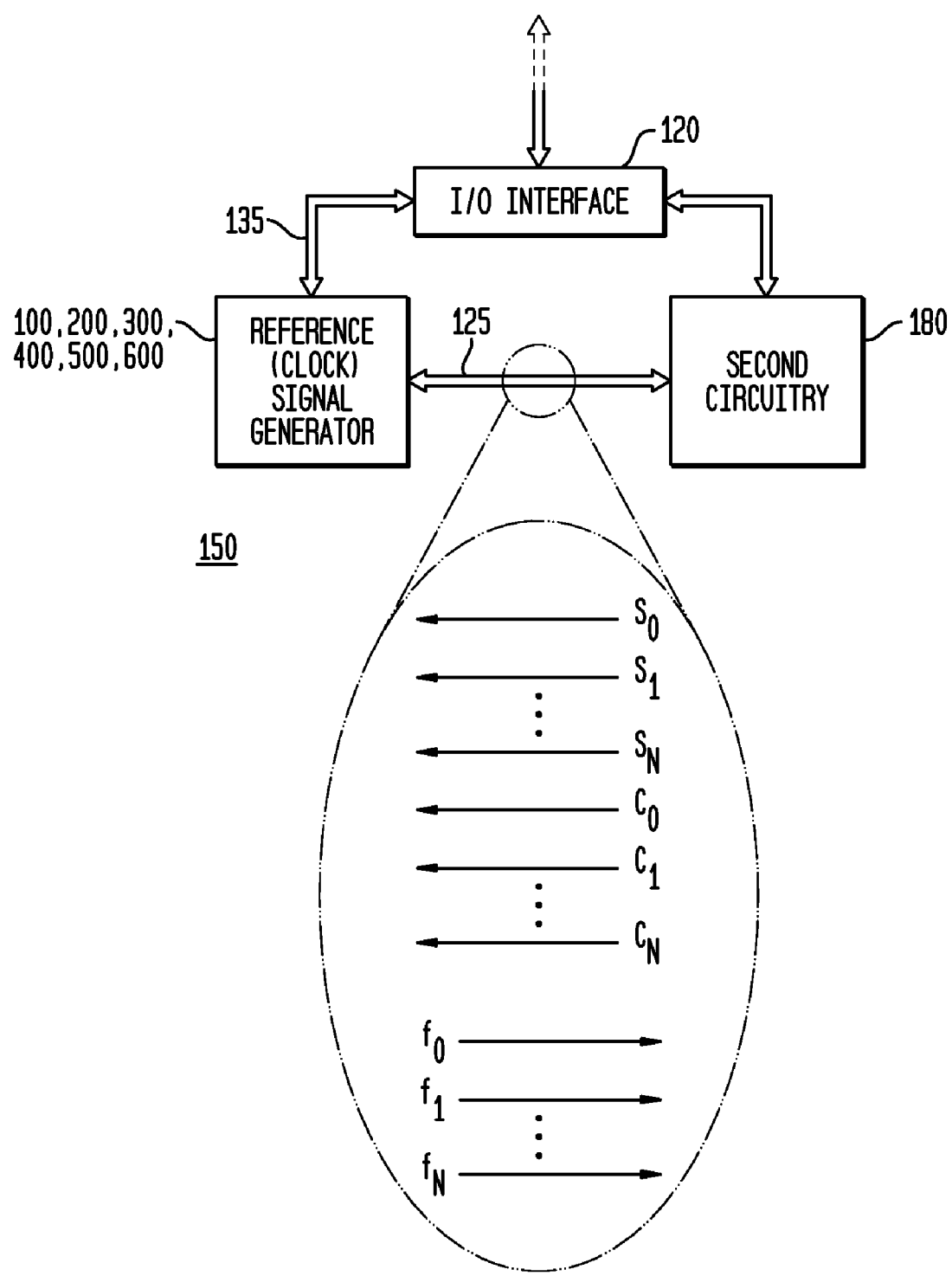
FIG. 1 a block diagram illustrating a first exemplary system embodiment in accordance with the teachings of the present invention.

While the present invention is susceptible of embodiment in many different forms, there are shown in the drawings and will be described herein in detail specific exemplary embodiments thereof, with the understanding that the present disclosure is to be considered as an exemplification of the principles of the invention and is not intended to limit the invention to the specific embodiments illustrated. In this respect, before explaining at least one embodiment consistent with the present invention in detail, it is to be understood that the invention is not limited in its application to the details of construction and to the arrangements of components set forth above and below, illustrated in the drawings, or as described in the examples. Methods and apparatuses consistent with the present invention are capable of other embodiments and of being practiced and carried out in various ways. Also, it is to be understood that the phraseology and terminology employed herein, as well as the abstract included below, are for the purposes of description and should not be regarded as limiting.

Figure 32:
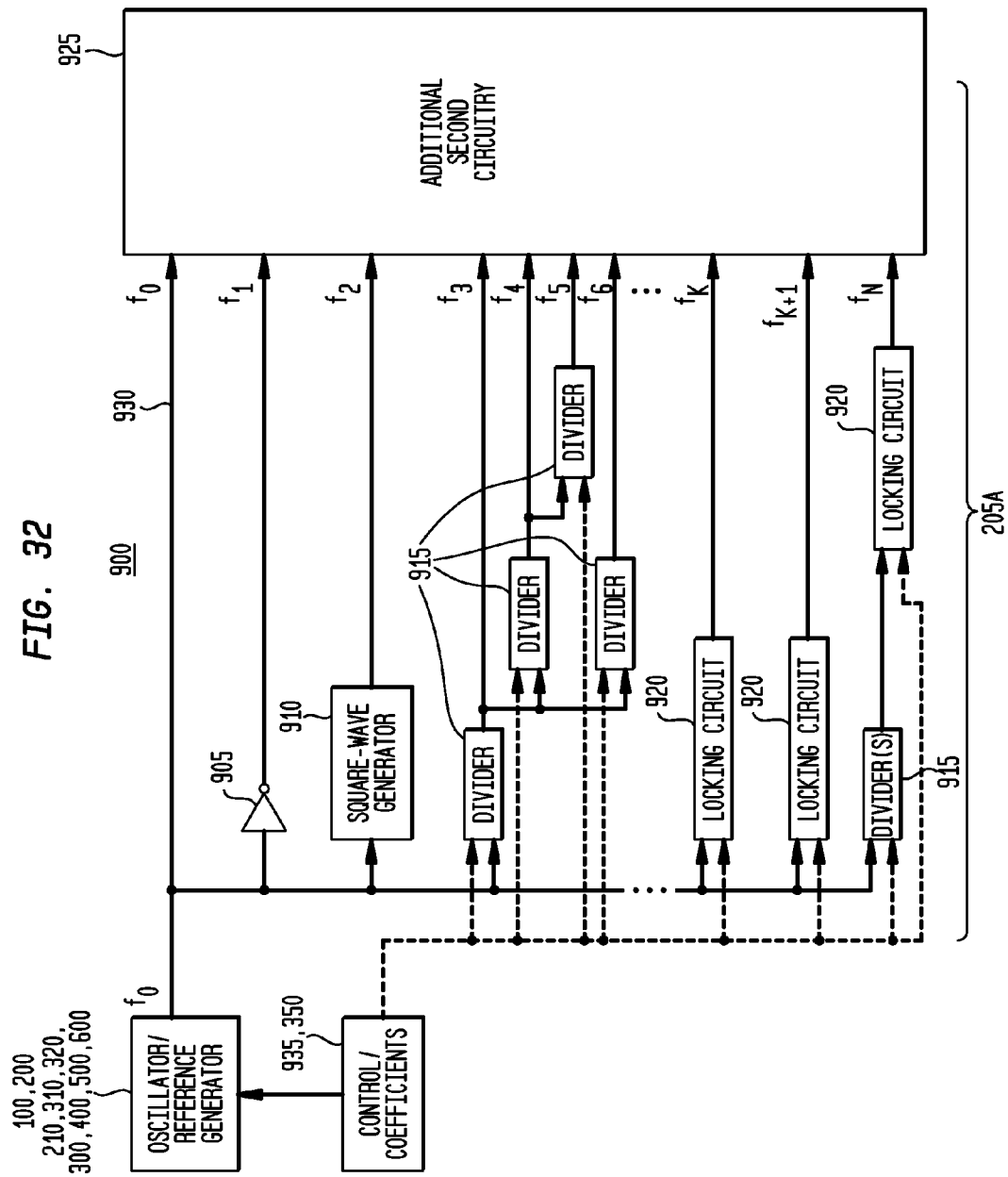
FIG. 32 is a block diagram illustrating an exemplary frequency (and mode) selector embodiment and an exemplary second system embodiment in accordance with the teachings of the present invention.

As indicated above, the various embodiments of the invention provide numerous advantages, including the ability to integrate a highly accurate (over PVT and age), low-jitter, free-running clock generator and/or a timing and frequency reference with other circuitry, such as illustrated in FIG. 1. FIG. 1 is a block diagram illustrating an exemplary first system embodiment 150 in accordance with the teachings of the present invention. The discussion below is also equally applicable to exemplary second and third system embodiments 900, 950 is illustrated in FIGS. 32 and 34. As illustrated in FIG. 1, the system 150 is a single integrated circuit, having a reference signal generator 100, 200, 300, 400, 500, 600 (e.g., clock generator and/or timing/frequency reference generator) of the present invention integrated with other, or second, circuitry 180, together with an input/output (I/O) interface 120 or other I/O circuitry. Exemplary reference signal generators 100, 200, 300, 400, 500, 600 are illustrated in FIGS. 2-6 and 33. Second circuitry 180 may be any type or kind of circuitry such as, for example, a microprocessor, a frequency divider, a phase or delay locked loop, switching circuitry, etc., with many examples illustrated and discussed below. The I/O interface 120 will generally provide power, such as from a power supply (not illustrated), ground, and other lines or busses to the reference signal generator 100, 200, 300, 400, 500, 600, such as for calibration and frequency selection, and other I/O functionality, such as driver circuitry and impedance matching. For example, the I/O interface 120 may be utilized for input/output communication, providing appropriate connection to a relevant channel, network or bus, and may provide additional functionality, such as impedance matching, drivers and other functions for a wireline interface, may provide demodulation and analog to digital conversion for a wireless interface, and may provide a physical interface with other devices for the second circuitry 180 or the reference signal generator 100, 200, 300, 400, 500, 600. In general, the I/O interface 120 is used for coupling to power and ground connections, and potentially also to receive and transmit data, depending upon the selected embodiment, such as control or calibration signals, for example. Also for example and without limitation, the I/O interface 120 may implement communication protocols such as DMX 512, DALI, I-squared C ($I^2C$), etc.

As illustrated, one or more output reference (or clock) signals are provided on bus 125, at one or more of a plurality of frequencies, such as a first frequency ($f_0$), a second frequency ($f_1$), and so on, through an $(n+1)^{th}$ frequency ($f_n$). In addition, the various one or more reference signals may have any of a plurality of shapes, such as substantially square or substantially sinusoidal, for example. The second circuitry 180 (or the I/O interface 120) may also provide input into the reference signal generator 100, 200, 300, 400, 500, 600, such as through selection signals ($S_0$, $S_1$, through $S_N$), and one or more calibration signals ($C_0$, $C_1$, through $C_N$). Alternatively, the selection signals ($S_0$, $S_1$, through $S_N$) and one or more calibration signals ($C_0$, $C_1$, through $C_N$) may be provided directly to the reference signal generator 100 through the interface 120, such as on bus 135, along with power and ground connections (not separately illustrated).

The reference signal generator 100, 200, 300, 400, 500, 600 may also have a plurality of modes, such as a low power mode and other modes discussed in greater detail below. For example, in a clock mode, the apparatus 100, 200, 300, 400, 500, 600 will provide one or more clock signals, as output signals, to the second circuitry 180. The second circuitry 180 also may be any type or kind of circuitry, such as a microprocessor, a digital signal processor ("DSP"), a radio-frequency circuit, for example, or any other circuit which could utilize the one or more output clock signals. Also for example, in a timing or frequency reference mode, the output signal from the apparatus 100, 200, 300, 400, 500, 600 may be a reference signal, such as a reference signal for synchronization for a second oscillator. As a consequence, the terminology reference signal generator, clock generator and/or timing/frequency reference will be utilized interchangeably herein, with the understanding that the clock generator will also generally provide a square-wave signal, which may or may not be provided with a reference signal generator or other timing/frequency reference, which may utilize a substantially sinusoidal signal instead. In addition, as discussed in greater detail below, the various embodiments of the invention also provided a pulsed mode, in which the output signal from reference signal generator 100, 200, 300, 400, 500, 600 is provided in bursts or intervals, for increased instruction processing efficiency and lower power consumption, for example.

It should be noted that the various signals, voltages, parameter-independent current sources, and so on, are referred to as "substantially" sinusoidal or square-wave signals, substantially constant control voltages, or substantially parameter-independent voltages or currents, for example. This is to accommodate the various fluctuations, noise sources and other distortions introduced which may cause such signals, voltages or currents to differ in practice from the more ideal depictions found in textbooks. For example, as discussed in greater detail below, exemplary "substantially" square-wave signals provided by the exemplary reference signal generator 100, 200, 300, 400, 500, 600 may and typically do exhibit a variety of distortions, such as undershoots, overshoots, and other variations, and are nonetheless considered to be very high quality square-waves in practice.

In other instances, "substantially constant" may be construed more broadly, to mean "within a predetermined variance" of a selected value or parameter. For example, a substantially constant magnitude of an amplitude, a substantially constant common mode voltage, or a substantially constant resonant frequency, will typically have some variance from a specific value, such as plus or minus a predetermined percentage or error, and will generally not be constant as a theoretical ideal. Accordingly, in practice, what is acceptable as substantially constant nonetheless has some degree of variance, and in accordance with the exemplary embodiments of the invention, should be understood to mean and be measured as having some measurable variance from, for example, a predetermined magnitude, a predetermined common mode voltage, and a calibrated or predetermined resonant frequency. The amount of allowable variance from a specified or predetermined value will depend upon product specifications or product requirements for a degree of allowable error. Continuing with the example, a substantially constant resonant frequency will depend upon the acceptable specifications, and the various exemplary embodiments will typically have some frequency error, such as on the order of 100 ppm in exemplary embodiments. Similar variations are to be expected with other parameters which are to be maintained substantially constant, such as the magnitude of the peak amplitude of the resonant signal and the common mode voltage of the reference resonator.

Several important features of the present invention are in system 150 (and 900, 950). First, a highly accurate, low-jitter, free-running reference signal generator 100, 200, 300, 400, 500, 600 is integrated monolithically with other (second) circuitry 180, to form a singular integrated circuit (system 150, 900, 950). This is in sharp contrast with the prior art, in which a reference oscillator is used to provide a clock signal, such as a crystal reference oscillator, which cannot be integrated with other circuitry and is off-chip, as a second and separate device which must be connected through a circuit board to any additional circuitry. For example, in accordance with the present invention, the system 150, 900, 950, including reference signal generator 100, 200, 300, 400, 500, 600, may be fabricated with other, second circuitry using conventional CMOS (complementary metal oxide semiconductor), BJT (bipolar junction transistor), BiCMOS (bipolar and CMOS), or other fabrication technologies utilized in modern IC manufacturing.

Second, no separate reference oscillator is required. Rather, in accordance with the invention, the reference signal generator 100, 200, 300, 400, 500, 600 is free-running, such that it is not referenced to or locked to another signal, such as being synchronized in a phase locked loop ("PLL"), delay locked loop ("DLL"), or via injection locking to a reference signal, which is typical of the prior art. Instead, the exemplary embodiments may be utilized as such a reference oscillator which generates the reference signal itself, which may then be locked to by one or more phase-locked or delay-locked loops, for example. In these latter embodiments, in which a PLL or DLL provides a secondary reference signal by locking to the reference signal provided by the reference signal generator 100, 200, 300, 400, 500, 600, the resulting system (150, 900, 950) may be viewed as "self-referencing", as no separate, external, or other independent source of a reference signal is required.

Third, the reference signal generator 100, 200, 300, 400, 500, 600 may provide a plurality of output frequencies and a power conservation mode, such that frequencies may be switched with low latency and in a glitch-free manner. For example, second circuitry 180 may shift to a power conservation mode, such as a battery or lower frequency mode, and request (through selection signals) a lower clock frequency for minimizing power consumption, or request a low power clock signal to enter a sleep mode. As discussed in greater detail below, such frequency switching is provided with substantially negligible latency, with low latency introduced for glitch prevention (in proportion to the number of glitch prevention stages utilized), using a merely a handful of clock cycles, rather than the thousands of clock cycles required to change the output frequency from a PLL/DLL.

Additional embodiments also provide for generating a plurality of frequency reference signals, whether sinusoidal or square-wave, such as for use as one or more clock signals or reference frequency sources. In exemplary embodiments, the clock/frequency reference of the invention is coupled to one or more phase-locked loops ("PLLs") or delay-locked loops ("DLLs"), to provide a corresponding plurality of output reference signals at selected frequencies. These exemplary embodiments are typically programmable, through control signals or stored coefficients, such as to adjust the divide ratios of the PLLs or DLLs for corresponding frequency selection.

In addition, given the significantly high available output frequencies of the reference signal generator 100, 200, 300, 400, 500, 600 discussed below, new operating modes are available. For example, clock start-up times are effectively or substantially negligible, allowing the reference signal generator 100, 200, 300, 400, 500, 600 to be repeatedly started and stopped, such as turned off entirely or to be pulsed for power conservation. For example, rather than running continuously as a clock, the reference signal generator 100, 200, 300, 400, 500, 600 can be operated in comparatively short, discrete intervals or bursts (i.e., pulsed), periodically or non-periodically, for instruction processing by a second circuit 180, such as a processor. As discussed in greater detail below, with the rapid start-up time, such pulsed operation provides a power savings, as more instructions (million instructions per second or MIPS) are processed per milliwatt (mW) of power consumption. In addition, such a pulsed mode may also be utilized to periodically synchronize a second clock or oscillator, in addition to other uses. As a consequence, the reference signal generator 100, 200, 300, 400, 500, 600 (and the other embodiments discussed below) has a plurality of operating modes, including a clock mode, a timing and/or frequency reference mode, a power conservation mode, and a pulsed mode.

Fourth, as discussed in greater detail below, the reference signal generator 100 includes features for highly accurate frequency generation over fabrication process, voltage, temperature ("PVT") and age variations. These features include frequency tuning and selection, and compensation for frequency variations which may be caused due to temperature and/or voltage fluctuations, fabrication process variations, and IC aging.

Fifth, the reference signal generator 100, 200, 300, 400, 500, 600 generates a significantly and comparatively high frequency, such as in the hundreds of MHz and GHz range, which then may be divided to a plurality of lower frequencies. Each such division by "N" (a rational number, as a ratio of integers) results in a significant noise reduction, with phase noise reduced by N and phase noise power reduced by $N^2$. As a consequence, the clock generator of the present invention results in significantly less relative period jitter than available with other oscillators that generate their output directly or through frequency multiplication.

Figure 2:
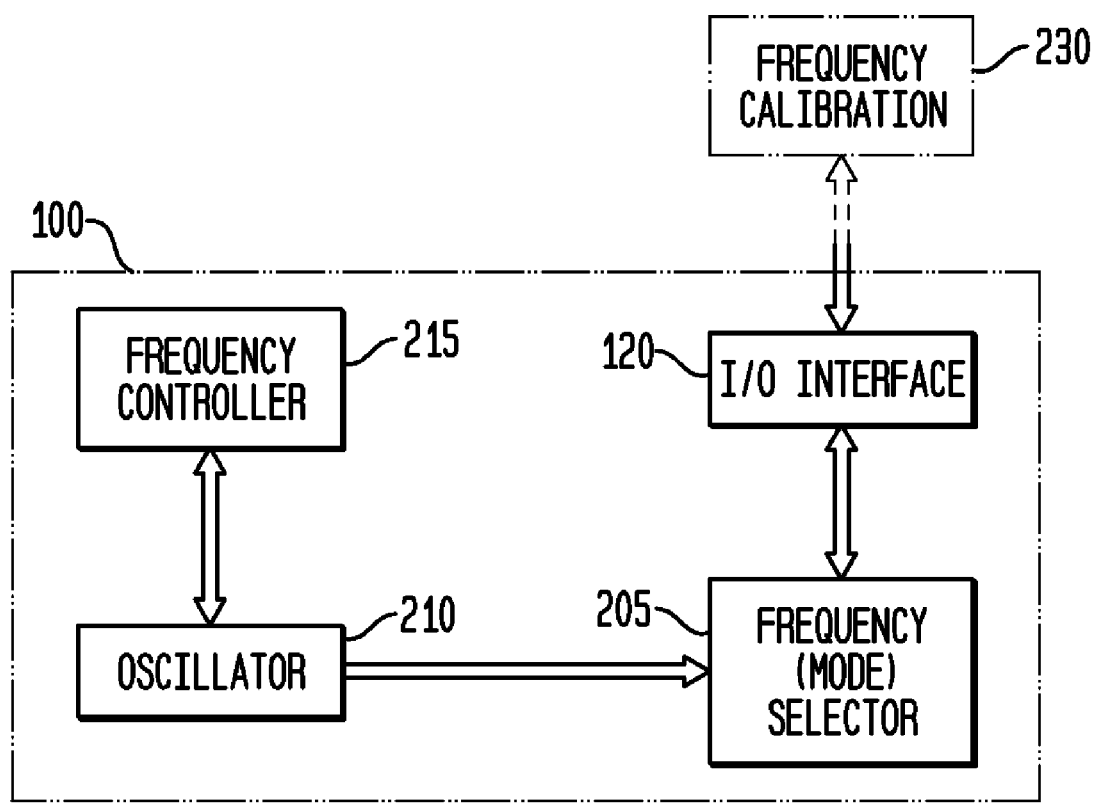
FIG. 2 a block diagram illustrating a first exemplary apparatus embodiment in accordance with the teachings of the present invention.

These features are illustrated in greater detail in FIG. 2, which is a block diagram illustrating in greater detail a first exemplary apparatus 100 embodiment in accordance with the teachings of the present invention, namely, a reference signal generator 100 which comprises an oscillator 210 (typically having a resonant element, such as an LC oscillator) and a frequency controller 215. The reference signal generator 100 may also include a frequency (and/or mode) selector 205. Depending on the selected embodiment, the reference signal generator 100 may also include an I/O interface 120 as previously discussed. In addition, the reference signal generator 100 may also include or be couplable to a module for frequency calibration (230), as described in the related applications and as discussed in greater detail below.

More specifically, the present application also refers to inventions, features and components disclosed in prior patents and patent applications filed by many of the inventors herein. In the interests of brevity, those disclosures will not be repeated herein, and interested readers may refer to the referenced applications as cited below. Accordingly, all of the following patents and patent applications (collectively referred to as the "related applications") are each incorporated in their entirety herein by reference, with the same full force and effect as if set forth in their entirety herein, as follows:

(1) McCorquodale, Michael S. et al., U.S. Pat. No. 7,227, 423, issued Jun. 5, 2007, entitled "Monolithic Clock Generator and Timing/Frequency Reference," from U.S. patent application Ser. No. 11/084,962, filed Mar. 21, 2005 (the "first related application"), which claims priority to McCorquodale, Michael S., U.S. Provisional Patent Application Ser. No. 60/555,193, filed Mar. 22, 2004, entitled "Monolithic and Top-Down Clock Synthesis with Micromachined Radio Frequency Reference";

(2) McCorquodale, Michael S. et al., U.S. Pat. No. 7,248, 124, issued Jul. 24, 2007, entitled "Frequency Calibration for a Monolithic Clock Generator and Timing/Frequency Reference," from U.S. patent application Ser. No. 11/232,409, filed Sep. 20, 2005 (the "second related application"), which is a continuation-in-part of and claims priority to U.S. patent application Ser. No. 11/084,962;

(3) Carichner, Gordon et al., U.S. patent application Ser. No. 11/805,427, filed May 23, 2007, entitled "Frequency Calibration for a Monolithic Clock Generator and Timing/Frequency Reference" (the "third related application"), U.S. Patent Application Publication No. 2007022529, which is a continuation-in-part of and claims priority to McCorquodale, Michael S. et al., U.S. patent application Ser. No. 11/232,409;

(4) McCorquodale, Michael S. et al., U.S. patent application Ser. No. 11/384,973, filed Mar. 20, 2006, entitled "Discrete Clock Generator and Timing/Frequency Reference" (the "fourth related application"), U.S. Patent Application Publication No. 20060158268, which is a continuation-in-part of and claims priority to McCorquodale, Michael S. et al., U.S. patent application Ser. No. 11/084,962;

(5) McCorquodale, Michael S. et al., U.S. patent application Ser. No. 11/384,758, filed Mar. 20, 2006, entitled "Integrated Clock Generator and Timing/Frequency Reference" (the "fifth related application"), U.S. Patent Application Publication No. 20060152293, which is a continuation-in-part of and claims priority to McCorquodale, Michael S. et al., U.S. patent application Ser. No. 11/084,962;

(6) McCorquodale, Michael S. et al., U.S. patent application Ser. No. 11/384,605, filed Mar. 20, 2006, entitled "Inductor and Capacitor-Based Clock Generator and Timing/Frequency Reference" (the "sixth related application"), U.S. Patent Application Publication No. 20060158267, which is a continuation-in-part of and claims priority to McCorquodale, Michael S. et al., U.S. patent application Ser. No. 11/084,962;

(7) Pernia, Scott M. et al., U.S. patent application Ser. No. 11/233,414, filed Sep. 21, 2005, entitled "Low-Latency Startup for a Monolithic Clock Generator and Timing/Frequency Reference" (the "seventh related application"), U.S. Patent Application Publication No. 20060017519, which is a continuation-in-part of and claims priority to McCorquodale, Michael S. et al., U.S. patent application Ser. No. 11/084,962;

(8) Pernia, Scott M. et al., U.S. patent application Ser. No. 11/950,707, filed Dec. 5, 2007, entitled "Clock, Frequency Reference, and Other Reference Signal Generator" (the "eighth related application"); and (9) McCorquodale, Michael S. et al., U.S. Pat. No. 7,227, 424, issued Jun. 5, 2007, entitled "Transconductance and Current Modulation for Resonant Frequency Control and Selection" from U.S. patent application Ser. No. 11/085,372, filed Mar. 21, 2005 (the "ninth related application"), which claims priority to McCorquodale, Michael S., U.S. Provisional Patent Application Ser. No. 60/555,193, filed Mar. 22, 2004, entitled "Monolithic and Top-Down Clock Synthesis with Micromachined Radio Frequency Reference".

In addition, the various control methodologies and other features, such as spread spectrum functionality, unit capacitance, and so on, are equally applicable to the circuit configurations of the related applications, and are also within the scope of the present invention.

As illustrated in FIG. 2, the reference signal generator 100 provides one or more output reference signals, such as a clock or reference signal having any of a plurality of frequencies, selected using frequency (and/or mode) selector 205. In accordance with the invention, the oscillator 210 generates a signal having a comparatively high frequency, $f_0$. Due to PVT or age variations mentioned above, the frequency controller 215 is utilized to frequency select or tune the oscillator 210, such that the oscillation frequency $f_0$ is selectable from a plurality of potential oscillation frequencies, i.e., the frequency controller 215 provides for output signals having frequencies which are accurate over PVT and age variations.

A variety of exemplary frequency controllers 215, 315 (FIG. 3) are discussed in greater detail below.

For example, given these PVT variations, the output frequency from an oscillator, such as oscillator 210, could potentially vary as much as plus or minus 5%. For some applications, such as those utilizing ring oscillators, such frequency variability may be acceptable. In accordance with the present invention, however, greater accuracy for the reference signal generator 100, 200, 300, 400, 500, 600 is desirable, particularly for more sensitive or complex applications, such as providing clock signals for integrated microprocessors, microcontrollers, digital signal processors, communication controllers, and so on. As a consequence, frequency controller 215, 315 is utilized to adjust for these PVT variations, such that the output frequency from the oscillator is the selected or desired frequency $f_0$ with much less variance by several orders of magnitude, such as ±0.25% or less, and having a comparatively low-jitter. In addition, various embodiments of the reference signal generator 100 also provide for such stable frequency control with the aging of the integrated circuitry.

To improve performance and decrease jitter (noise) and other interference, instead of generating a low frequency output and multiplying it up to a higher frequency, as is typically done using PLLs and DLLs, the present invention generates a comparatively high frequency output, $f_0$, which is then divided to one or more lower frequencies ($f_1$ through $f_n$), using frequency (and/or mode) selector 205, which may include a frequency divider (not separately illustrated) and may also include a square-wave generator, such as illustrated in the various related applications. Reference or clock signals having one or more of the plurality of frequencies from a frequency divider may then be selected, using frequency (and/or mode) selector 205. As indicated above, such frequency selection is provided glitch-free and with low latency, providing comparatively and significantly fast and glitch-free frequency switching. In addition, a plurality of operating modes are provided as an option, using mode selection capability of frequency (and/or mode) selector 205.

Alternatively, one or more reference signals provided directly as one or more output signals, with the frequency (and/or mode) selector 205 providing merely basic I/O functions such as impedance matching and output drivers, or the frequency (and/or mode) selector 205 may be omitted, with I/O functionality provided by an I/O interface 120.

Figure 3:
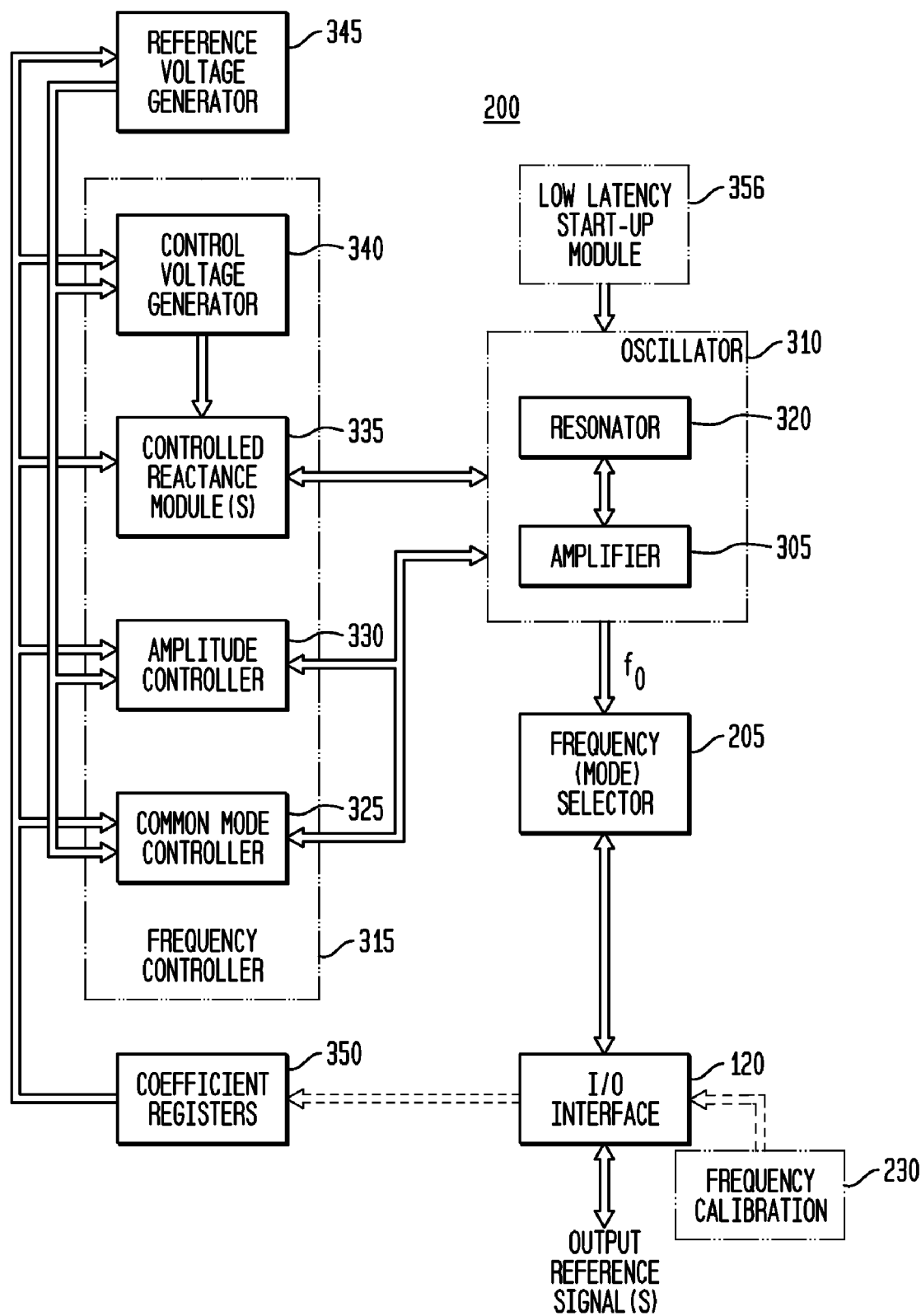
FIG. 3 a block diagram illustrating in greater detail a second exemplary apparatus embodiment in accordance with the teachings of the present invention.

FIG. 3 is a block diagram illustrating in greater detail a second exemplary apparatus embodiment, reference signal generator 200, in accordance with the teachings of the present invention. Referring to FIG. 3, reference signal generator 200 comprises a frequency controller 315, an oscillator 310, a reference voltage generator 345, and one or more coefficient registers 350 (as a more specific type or instantiation of a memory, as described/defined below). The reference signal generator 200 may also include a frequency (and/or mode) selector 205 and/or an I/O interface 120 as previously discussed, and may also include a low-latency start-up module 356 (as described in the seventh related application). The reference signal generator 200 may also comprise or be couplable to a frequency calibration module 230 (as described in the second and third related applications).

In this embodiment, the oscillator 310 comprises a resonator 320 and a sustaining amplifier 305, while the frequency controller 315 comprises a common mode controller 325, an amplitude controller 330, controlled reactance modules 335 (also referred to equivalently as controlled reactances), and a control voltage generator 340.

The amplitude controller 330 is utilized to sense and control the peak amplitude of the signal generated by the resonator 320, and thereby control the resonant frequency ($f_0$) of the resonator 320, by determining or varying the amount of current input into the resonator 320 in selected embodiments. By doing so, the amplitude controller 330 decreases the sensitivity of the resonator 320 to variations in bias voltage, power supply voltage and other voltages, providing for a substantially more constant, selected resonant frequency ($f_0$) of the resonator 320.

The common mode controller 325 is utilized to sense and control a common mode voltage level of the resonator 320, and also thereby control the resonant frequency ($f_0$) of the resonator 320, also by determining or varying the amount of current input into the resonator 320 in selected embodiments. By doing so, the common mode controller 325 decreases the sensitivity of the resonator 320 to variations in transistor gate-to-source and threshold voltages due to transistor (or device) aging, such as due to changes in transistor threshold voltage from sources such as oxide tunneling and hot carrier effect, thereby also providing for a substantially more constant, selected resonant frequency ($f_0$) of the resonator 320 over time, and especially over longer periods of time (years).

The exemplary controlled reactance modules 335 are one or more switchable or otherwise controllable modules having a reactance component (a reactive impedance), such as one or more inductors or capacitors, any or all of which may be fixed or variable. In accordance with the exemplary embodiments, and as discussed in greater detail below and in the related applications, the switching of the controlled reactance modules 335 to the resonator 320, or the modification of a control voltage ("$V_{CTL}$") applied to a controlled reactance module 335 coupled to the resonator 320, is utilized to select or alter the resonant frequency ($f_0$) of the resonator 320. For example, during an initial calibration, an amount of reactance is determined, for coupling to the resonator 320, to select the resonant frequency ($f_0$) of the resonator 320. Various calibration methods and systems are disclosed in the second and third related applications. The calibration determines a plurality of control coefficients, stored in control coefficient register(s) 350, which are then utilized to provide the corresponding switching of different amounts of capacitance (or other reactance) to the resonator 320 or switching to a control voltage or other voltage (e.g., $V_{DD}$ or ground). Through such a calibration process which determines the amount of reactance effectively coupled to the resonator 320, frequency control is provided for the resonator 320, enabling selection and adjustment of the oscillation frequency (resonant frequency ($f_0$)) separately and/or independently of process variations inherent in semiconductor fabrication technologies, including both process variations within a given foundry (e.g., batch or run variations, variations within a given wafer, and die-to-die variations within the same wafer) and process variations among different foundries and foundry processes (e.g., 130 nm and 90 nm processes)).

Also for example, in accordance with the present invention, a control voltage ("$V_{CTL}$") generated by control voltage generator 340 is utilized to determine an amount of variable capacitance presented or coupled to the resonator 320 by the controlled reactance modules 335, such that varying the control voltage correspondingly varies the amount of capacitance (of varactors comprising the controlled reactance modules 335) which, in turn, correspondingly varies the resonant frequency ($f_0$) of the resonator 320. A plurality of configurations of the controlled reactance modules 335 are discussed below and illustrated in FIGS. 27-31.

The control voltage generator 340 is also utilized to provide for a substantially more constant, selected resonant frequency ($f_0$) of the resonator 320 in response to variations in temperature (or another parameter), such as variations of the operating temperature of the system 150, 900, 950, as the system 150, 900, 950 may generate heat during operation, may be subject to heat from additional devices, and may be subject to temperature fluctuations due to ambient or other operating temperature variations. The control voltage generator 340 is utilized to provide a corresponding control voltage which tracks such temperature changes ($V_{CTL}(T)$) and which, in turn, affects the amount of effective capacitance or other reactance coupled to the resonator 320, with corresponding effects on the resonant frequency ($f_0$) of the resonator 320.

Such a temperature-dependent control voltage ($V_{CTL}(T)$) may be utilized to affect the resonant frequency $f_0$ through, for example, modifying the effective reactance or impedance (e.g., capacitance, inductance or resistance) coupled to and effectively forming part of the resonator 310. For example, the effective reactance (or impedance) may be modified by coupling to or decoupling from the resonator 320 fixed or variable capacitances, or by modifying the magnitudes of one or more reactances which are already coupled to the resonator, such as by modifying a control voltage or other continuous control parameter. In other embodiments, the control voltage ($V_{CTL}(T)$) may be utilized to modify the current through the resonator 310 and sustaining amplifier 305, also affecting the resonant frequency.

In the various illustrated embodiments discussed below, the control voltage generator 340 is generally implemented to utilize a temperature parameter, such that a substantially stable resonant frequency $f_0$ is provided over variations in operating temperature. It will be understood by those of skill in the art that the control voltage generator 340 and controllers 325, 330 may be implemented to provide a substantially stable resonant frequency $f_0$ as a function or in response to other variable parameters, such as variations due to fabrication process, voltage variations, aging, and other frequency variations.

The reference voltage generator 345 is utilized to provide reference voltages for use by the control voltage generator 340, the common mode controller 325, and the amplitude controller 330, in addition to other components. The reference voltage generator 345 includes a conditioning circuit structure used for some of the reference voltages, described below, such that the reference voltage which is generated also tracks and is a function of corresponding fabrication process variations, temperature fluctuations, and IC aging.

For clock signal generation, reference signal generator 100, 200, 300, 400, 500, 600 may utilize a frequency divider (in frequency (mode) selector 205) to convert the output oscillation frequency $f_0$ to a plurality of lower frequencies ($f_1$ through $f_n$), and may utilize a square wave generator (also in frequency (mode) selector 205) to convert a substantially sinusoidal oscillation signal to a substantially square wave signal for clock applications. Frequency (mode) selector 205 then provides for selection of one or more of the available output signals having the plurality of frequencies, and may also provide for operating mode selection, such as providing a low power mode, a pulsed mode, a reference mode, and so on. Using these components, the reference signal generator 100, 200, 300, 400, 500, 600 provides a plurality of highly accurate (over PVT), low jitter, and stable output frequencies, $f_0$, $f_1$ through $f_n$, with minimal to negligible frequency drift due to such PVT variations, thereby providing sufficient accuracy and stability for sensitive or complex applications, as mentioned above.

Figure 4:
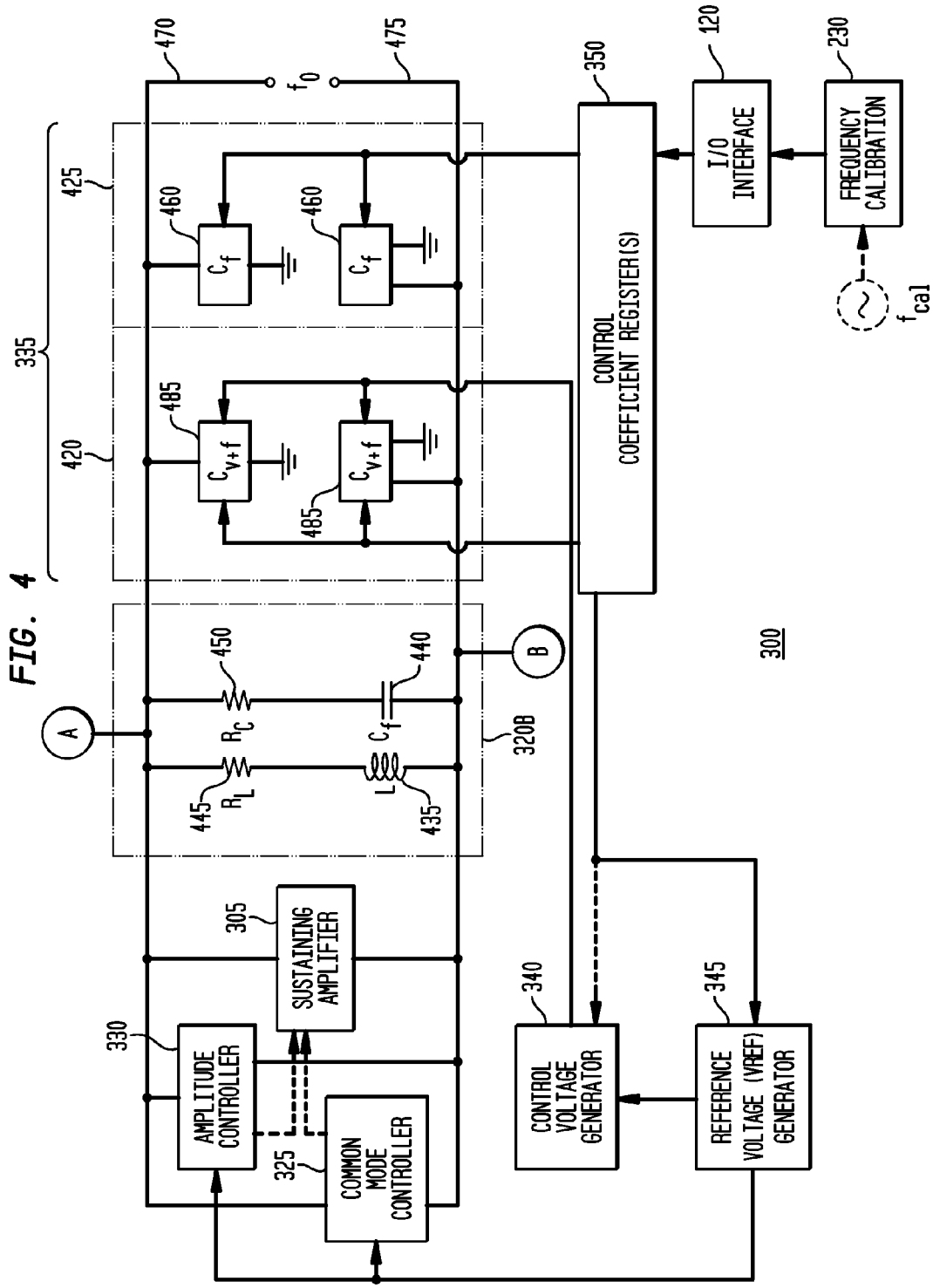
FIG. 4 is a high-level circuit and block diagram illustrating in greater detail an exemplary resonator, exemplary controlled reactance modules, and an exemplary frequency calibration module 230 in accordance with the teachings of the present invention.

The sustaining amplifier 305 provides for both start-up and sustaining amplification for the resonator 320. The resonator 320 may be any type of resonator which stores energy, such as an inductor (L) and a capacitor (C) coupled to form an LC-tank, where the LC-tank has a selected configuration of a plurality of LC-tank configurations, or is otherwise electrically or electromechanically equivalent to or otherwise typically represented in the art as an inductor coupled to a capacitor. Such an LC-resonator is illustrated as resonator 320B in FIG. 4. FIG. 4 is a high-level schematic and block diagram illustrating in greater detail such an exemplary resonator 320 (illustrated as resonator 320B), exemplary controlled reactance modules 335, illustrated as modules 420, 425, and an exemplary frequency calibration module 230 in accordance with the teachings of the present invention. In addition to LC resonators, other resonators are considered equivalent and within the scope of the present invention; for example, the resonator 320 may be a ceramic resonator, a mechanical resonator (e.g., XTAL), a microelectromechanical ("MEMS") resonator, or a film bulk acoustic resonator. In other cases, various resonators may be represented by electrical or electromechanical analogy as LC resonators, and are also within the scope of the present invention.

In exemplary embodiments, an LC-tank has been utilized as a resonator 320, to provide for a high Q-value for a completely integrated solution. A plurality of LC-tank configurations and other circuit configurations were described in the sixth related application, such as a double-balanced, differential LC configuration (also illustrated in FIGS. 4, 5 and 6 herein); a differential n-MOS cross-coupled topology; a differential p-MOS cross-coupled topology; a single-ended Colpitts LC configuration; a single-ended Hartley LC configuration; a differential, common base Colpitts LC configuration; a differential, common collector Colpitts LC configuration; a differential, common base Hartley LC configuration; a differential, common collector Hartley LC configuration; a single-ended Pierce LC oscillator, a quadrature LC oscillator configuration, and an active inductor configuration. Any and all such LC and active inductor configurations are considered equivalent and within the scope of the present invention.

Figure 5:
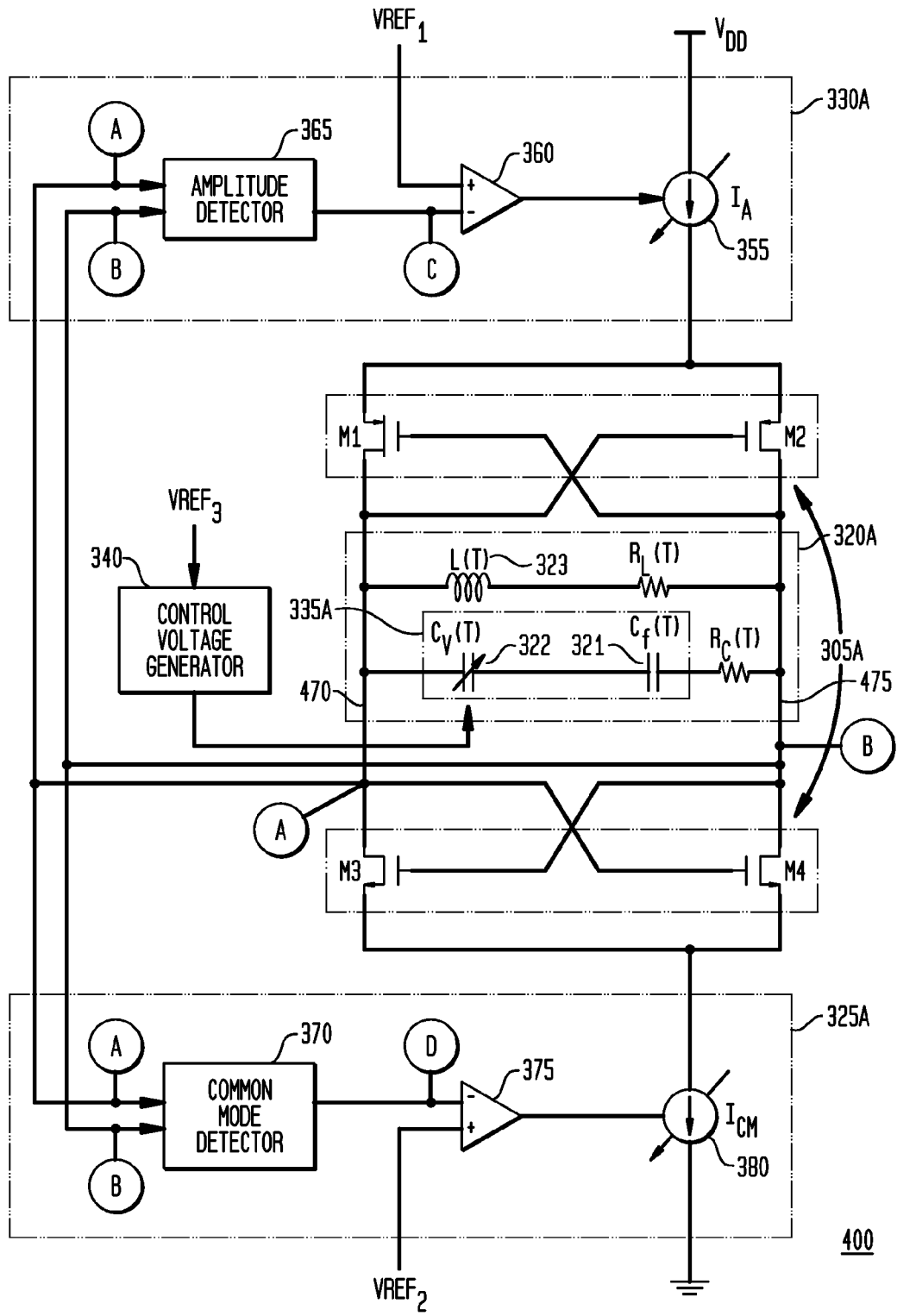
FIG. 5 is a circuit and block diagram illustrating a third exemplary apparatus embodiment in accordance with the teachings of the present invention.
Figure 6:
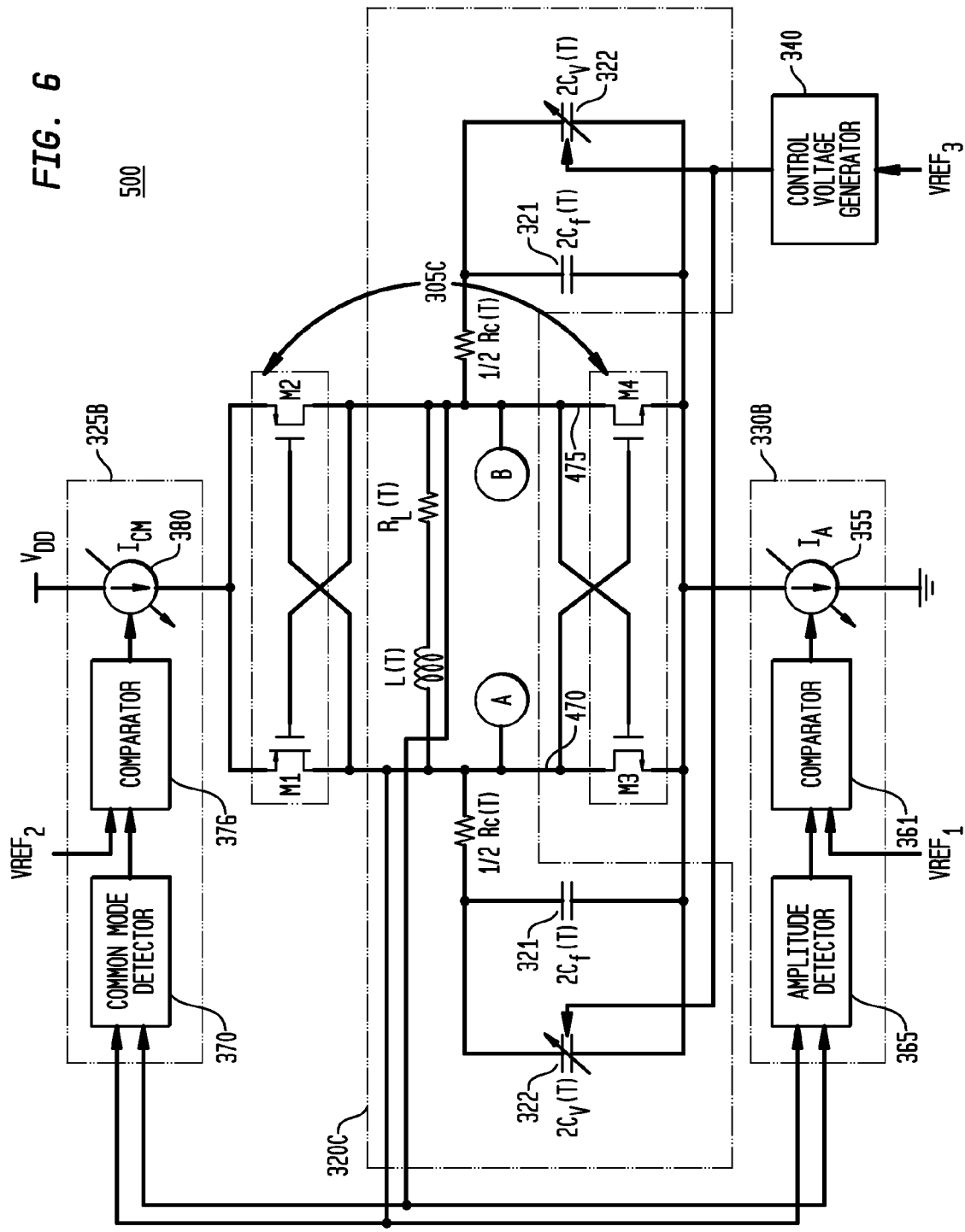
FIG. 6 is a circuit and block diagram illustrating a fourth exemplary apparatus embodiment in accordance with the teachings of the present invention.

For example, as illustrated in FIG. 4, the oscillator 310 is embodied as a resonant LC tank 320B with a sustaining amplifier 305, and may be equally described as a harmonic oscillator or harmonic core, and all such variations are within the scope of the present invention. It should be noted that while the resonant LC tank 320B is an inductor 435 in parallel with a capacitor 440, other circuit topologies are also known and equivalent to that illustrated, such as an inductance in series with a capacitance, and the other LC configurations mentioned above. Another such equivalent topology is illustrated in FIGS. 5 and 6. In addition, as indicated above, other types of resonators may be utilized and all are considered equivalent to the exemplary resonant LC tank illustrated herein. Moreover, as discussed in greater detail below, additional capacitances and/or inductances, both fixed and variable (and referred to more generally as impedances or reactances (or reactive elements)), are distributed in the various controlled reactance modules 335 and effectively form part of the resonant LC tank 320B (and 320A and 320C) and are utilized as part of the frequency controller 315 of the invention. In addition, corresponding resistances (resistive components of the various impedances) $R_L$ 445 and $R_C$ 450 are illustrated separately, but should be understood to be intrinsic to the inductor 435 and capacitor 440, respectively, occurring as part of fabrication, and are not additional or separate components from the respective inductor 435 and capacitor 440. In addition, such inductances, capacitances, and resistances may also vary with temperature, and are therefore illustrated as fixed and variable capacitances $C_f(T)$ 321, $C_v(T)$ 322, inductance $L(T)$ 323, and resistances $R_L(T)$ 445 and $R_C(T)$

450 in FIGS. 5 and 6. Conversely, such additional or intrinsic (parasitic) resistances can also be included as part of compensation for PVT variations, as discussed in the fourth, fifth and sixth related applications. Accordingly, while for ease of reference the various modules 335 are referred to as controlled "reactance" modules 335, it should be understood that in any selected embodiment, such reactances may more generally mean and include any type of impedance, whether reactive, resistive, or both, such as the modules 895 illustrated in FIG. 30. In addition, any of the various reactance modules illustrated with capacitances (or capacitors) may be equivalently implemented with inductances (or inductors).

The inductor 435, capacitor 440, and controlled reactance modules 335 of the resonant LC tank or oscillator 405 are sized to substantially or approximately provide the selected oscillation frequency, $f_0$, or range of oscillation frequencies around $f_0$. In addition, inductor 435, capacitor 440 and controlled reactance modules 335 may be sized to have or to meet IC layout area requirements, with higher frequencies requiring less area. Those of skill in the art will recognize that $f_0 \approx 1/2\pi\sqrt{LC}$, but only as a first order approximation because, as discussed below, other factors such as the resistances $R_L$ and $R_C$, any additional resistors (or, more generally, impedances), along with temperature and fabrication process variations and other distortions, affect $f_0$, and may be included in second and third order approximations. For example, the inductor 435 and capacitor 440 may be sized to generate a resonant frequency in the 1-5 GHz range; in other embodiments, higher or lower frequencies may be desirable, and all such frequencies are within the scope of the invention. In addition, the inductor 435 and capacitor 440 may be fabricated using any semiconductor or other circuitry process technology, and may be CMOS-compatible, bipolar-junction transistor-compatible, for example, while in other embodiments, the inductor 435 and capacitor 440 may be fabricated using silicon-on-insulator (SOI), metal-insulator-metal (MiM), polysilicon-insulator-polysilicon (PiP), GaAs, strained-silicon, semiconductor heterojunction technologies, or MEMS-based (microelectromechanical) technologies, also for example and without limitation. It should be understood that all such implementations and embodiments are within the scope of the invention. In addition, other resonator and/or oscillator embodiments, in addition to or instead of the resonant LC tank 320B, may also be utilized and are also within the scope of the present invention. As used herein, "LC tank" will mean and refer to any and all inductor and capacitor circuit layouts, configurations or topologies which may provide oscillation, however embodied. It should be noted that the capability of the oscillator 310 to be fabricated using a conventional process, such as CMOS technology, allows the reference signal generator 100, 200, 300, 400, 500, 600 to be fabricated integrally and monolithically with other circuitry, such as the second circuitry 180, and provides a distinct advantage of the present invention.

In addition, the capacitance 440 illustrated in FIG. 4 is only a portion of the overall capacitance involved in the resonance and frequency determination of the resonant LC tank 320B, and may be a fixed capacitance in an exemplary embodiment. In selected embodiments, this fixed capacitance may represent approximately 10% to 90% of the total capacitance ultimately utilized in the oscillator, as an example. Alternatively, the capacitance 440 may also be implemented as a variable capacitance, if desired. As discussed in greater detail below, the overall capacitance is distributed, such that additional fixed and variable capacitance is selectively included within the reference signal generator 100, 200, 300, 400, 500, 600, and is provided, for example, by components of the frequency controller 315, to provide for both selecting the resonant frequency $f_0$ and to allow the resonant frequency $f_0$ to be substantially stable over and substantially independent of temperature variations, aging, voltage variations, and fabrication process variations.

In the selected embodiments, the inductance 435 has been fixed, but also could be implemented in a variable manner, or as a combination of fixed and variable inductances. As a consequence, those of skill in the art will recognize that the detailed discussions of fixed and variable capacitance, for both frequency tuning and temperature and fabrication process independence, pertain similarly to inductance choices. For example, different inductances could be switched in or out of the oscillator, to similarly provide tuning. In addition, a single inductor's inductance may also be modulated. As a consequence, all such inductance and capacitance variations are within the scope of the present invention, and are illustrated as switchable, variable and/or fixed reactive elements or components. For ease of reference, such reactances are illustrated as inductance 323, fixed capacitance(s) 321 and variable capacitance(s) 322 in FIGS. 5 and 6.

It should be noted that the terms "fixed" and "variable" are utilized as known in the art, with "fixed" being understood to mean configured generally to be non-varying with respect to a selected parameter, and "variable" meaning configured generally to be varying with respect to the selected parameter. For example, a fixed capacitor generally means that its capacitance does not vary as a function of an applied voltage, while a variable capacitor (varactor) will have a capacitance which does vary as a function of applied voltage. Both, however, may have and generally will have capacitances which vary as a function of fabrication process variation. In addition, a fixed capacitor may be formed as a varactor coupled to a constant voltage, for example. Similarly, components may be coupled to each other either directly or indirectly or, stated another way, operatively coupled or coupled via signal transmission. For example, one component may be coupled to a second component via a third component, such as through a switching arrangement, a divider, a multiplier, etc. Those of skill in the art will recognize these various circumstances and contexts, as illustrated and as discussed below, and what is meant when such terms are utilized.

Also as illustrated in FIGS. 4-6, the resonant LC tank 320 (illustrated as specific instantiations 320A, 320B and 320C) and resulting output signal, referred to as a first (output) signal at nodes "A" and "B" (nodes or lines 470 and 475), is a differential signal and provides common-mode rejection. Other configurations, including non-differential or other single-ended configurations are also within the scope of the present invention. For example, in single-ended configurations, only one instantiation of the various modules (e.g., 485, 460) would be required, rather than the use of two for a balanced configuration as illustrated. Similarly, other components and features discussed below, such as frequency dividers, would also have a single-ended rather than differential configuration. Such additional exemplary LC oscillators, both differential and single-ended, are discussed below and in the related applications, in addition to the differential LC oscillators illustrated in FIGS. 4-6. In addition, various embodiments illustrated utilize MOSFET transistors (metal oxide semiconductor field effect transistors) in various forms (such as CMOS, accumulation-mode MOSFET ("AMOS"), inversion-mode MOSFET ("IMOS"), and so on); other implementations are also available, such as using bipolar junction transistors ("BJTs"), BiCMOS, etc. All such embodiments are considered equivalent and are within the scope of the present invention.

FIG. 5 is a circuit and block diagram illustrating a third exemplary apparatus embodiment, reference signal generator 400, in accordance with the teachings of the present invention. FIG. 6 is a circuit and block diagram illustrating a fourth exemplary apparatus embodiment, reference signal generator 500, in accordance with the teachings of the present invention. As illustrated in FIGS. 5 and 6, reference signal generator 400 and reference signal generator 500 differ with regard to the circuit configuration of the respective LC-tanks 320A and 320C, the circuit locations of amplitude controller 330A, 330B and common mode controller 325A, 325B, and the use of operational amplifiers 360, 375 (respectively in amplitude controller 330A and common mode controller 325A) in contrast with comparators 361, 376 (respectively in amplitude controller 330B and common mode controller 325B), and otherwise function substantially identically. In addition, FIGS. 5 and 6 illustrate in greater detail exemplary instantiations of an amplitude controller 330 and a common mode controller 325, illustrated in FIGS. 5 and 6 as amplitude controllers 330A, 330B and common mode controllers 325A, 325B, and an exemplary instantiation of a sustaining amplifier 305, illustrated as cross-coupled negative transconductance amplifiers 305A and 305C (comprising transistors M1, M2, M3, and M4). The following discussion of the operation of reference signal generators 400 and 500 is equally applicable to reference signal generator 300 of FIG. 4.

Figure 7:
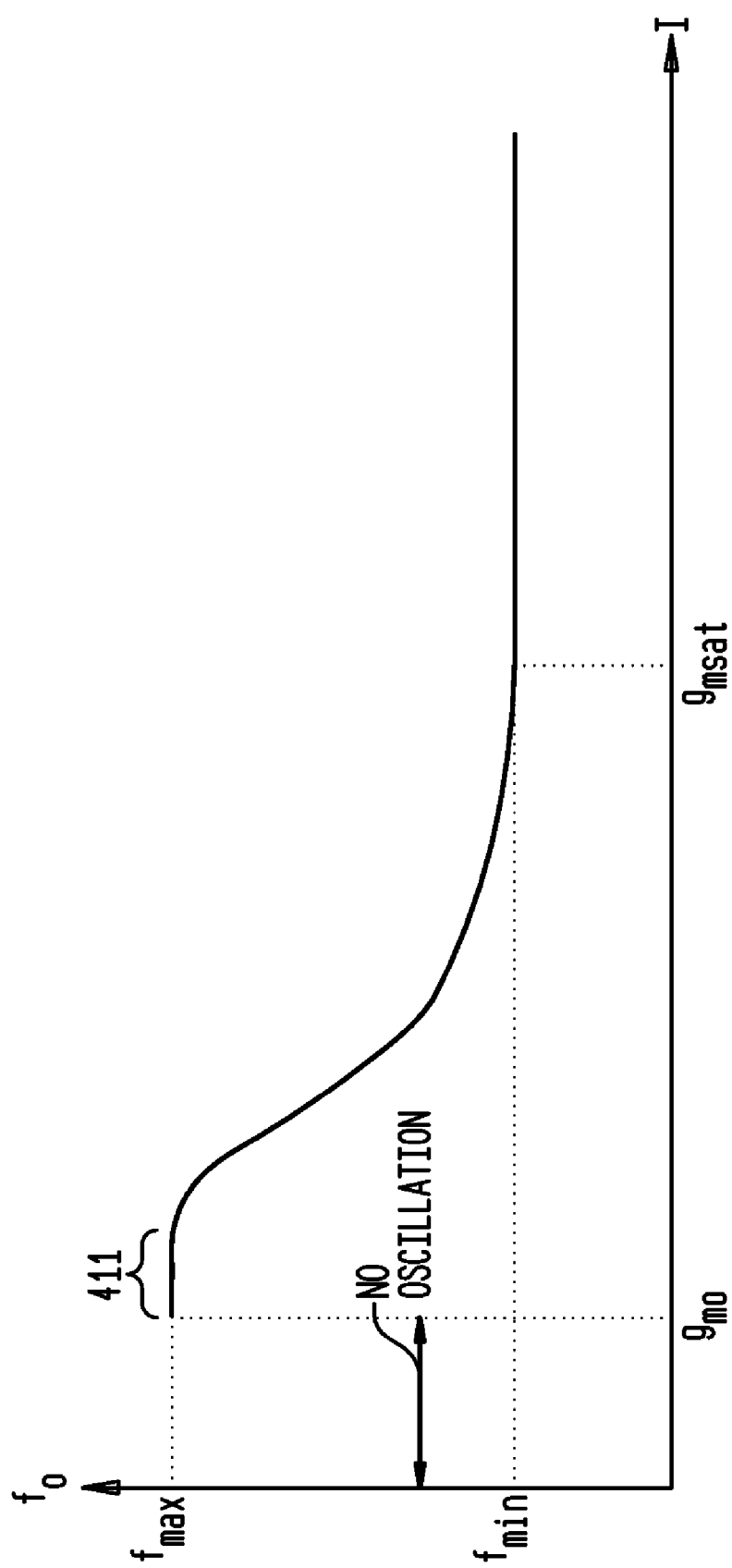
FIG. 7 is a graphical diagram illustrating resonant frequency as a function of current as utilized in accordance with the teachings of the present invention.

FIG. 7 is a graphical diagram illustrating resonant frequency as a function of current as utilized in accordance with the teachings of the present invention. More specifically, the amplitude controller 330 will regulate (and maintain substantially constant) the peak amplitude of the resonant frequency signal across differential nodes "A" and "B" (lines or nodes 470, 475), by comparing the peak amplitude with a first reference voltage (VREF$_1$) and, in turn, correspondingly controlling the amount of current input (from a variable current source 355) into the sustaining amplifier 305A, 305C and LC resonator 320A, 320C. The amplitude controller 330 will thereby maintain the level of current within the region illustrated as region 411, with the resulting signal having comparatively less harmonic content, such that any variation in current produces considerably less variation in resonant frequency, compared with frequency variations created by current fluctuations at higher current levels. The amplitude controller 330 thereby reduces the sensitivity of the reference signal generator 100, 200, 300, 400, 500, 600 to fluctuations in bias voltages, power supply and other voltages, for example, and operates to maintain the resonant frequency (f$_0$) substantially stable despite such variations. The amplitude controller 330 provides an additional benefit as well, namely, reducing power consumption by maintaining a comparatively lower current through the sustaining amplifier 305A, 305C and LC resonator 320A, 320C. As discussed below, the common mode controller 325 also controls the current through the sustaining amplifier 305A, 305C and LC resonator 320A, 320C.

Referring again to FIGS. 5 and 6, the amplitude controller 330 and common mode controller 325 provide two independent controls, with separate feedback circuits (or feedback loops) from the differential nodes "A" and "B" of the resonator 320, which serve in conjunction with the control voltage generator 340 to maintain the resonant frequency f$_0$ substantially constant despite variations in temperature, bias voltage, power supply voltage, and other circuit parameters which may vary over time, such as changes in transistor threshold voltages (or, correspondingly, gate-to-source voltages) which may occur with aging, such as due to oxide tunneling and/or a hot carrier effects.

Exemplary amplitude controllers 330 are illustrated in FIG. 5 as amplitude controller 330A and in FIG. 6 as amplitude controller 330B. While illustrated as coupled to the power supply voltage rail V$_{DD}$ in FIG. 5, the amplitude controller 330A may instead be coupled to ground, as illustrated in FIG. 6 for amplitude controller 330B, essentially switching locations in the circuit with the common mode controller 325. As discussed below with respect to FIG. 34, a power rail having a voltage lower than V$_{DD}$ may also be utilized. In addition, those of skill in the art will recognize that additional circuit configurations may be utilized to implement the amplitude controller 330, in addition to the illustrated amplitude controllers 330A, 330B, and all such variations are considered equivalent and within the scope of the present invention.

Figure 11:
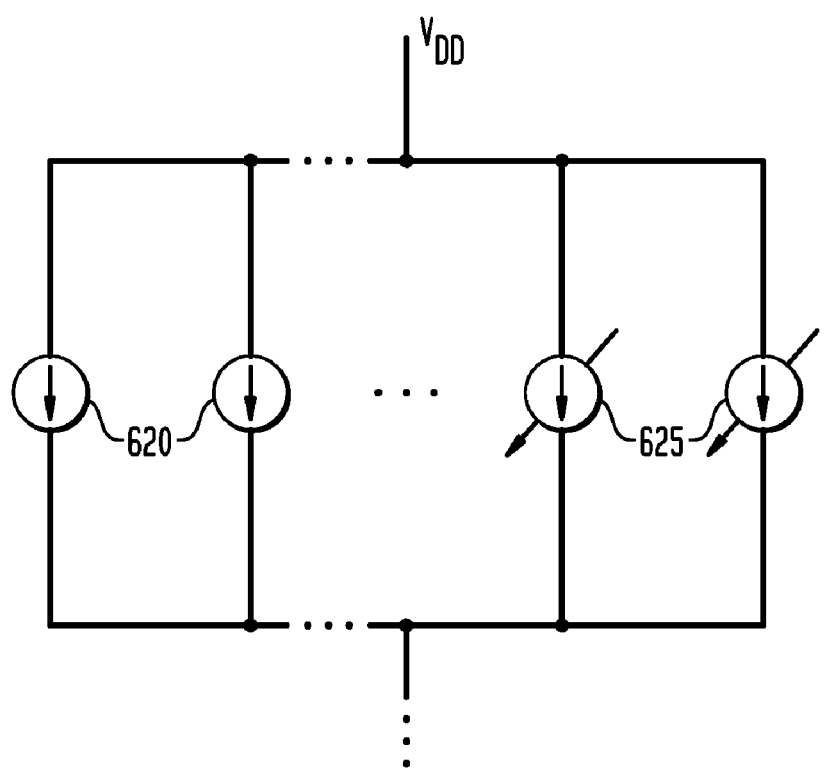
FIG. 11 is a circuit diagram illustrating exemplary fixed and variable current source embodiments in accordance with the teachings of the present invention.
Figure 33:
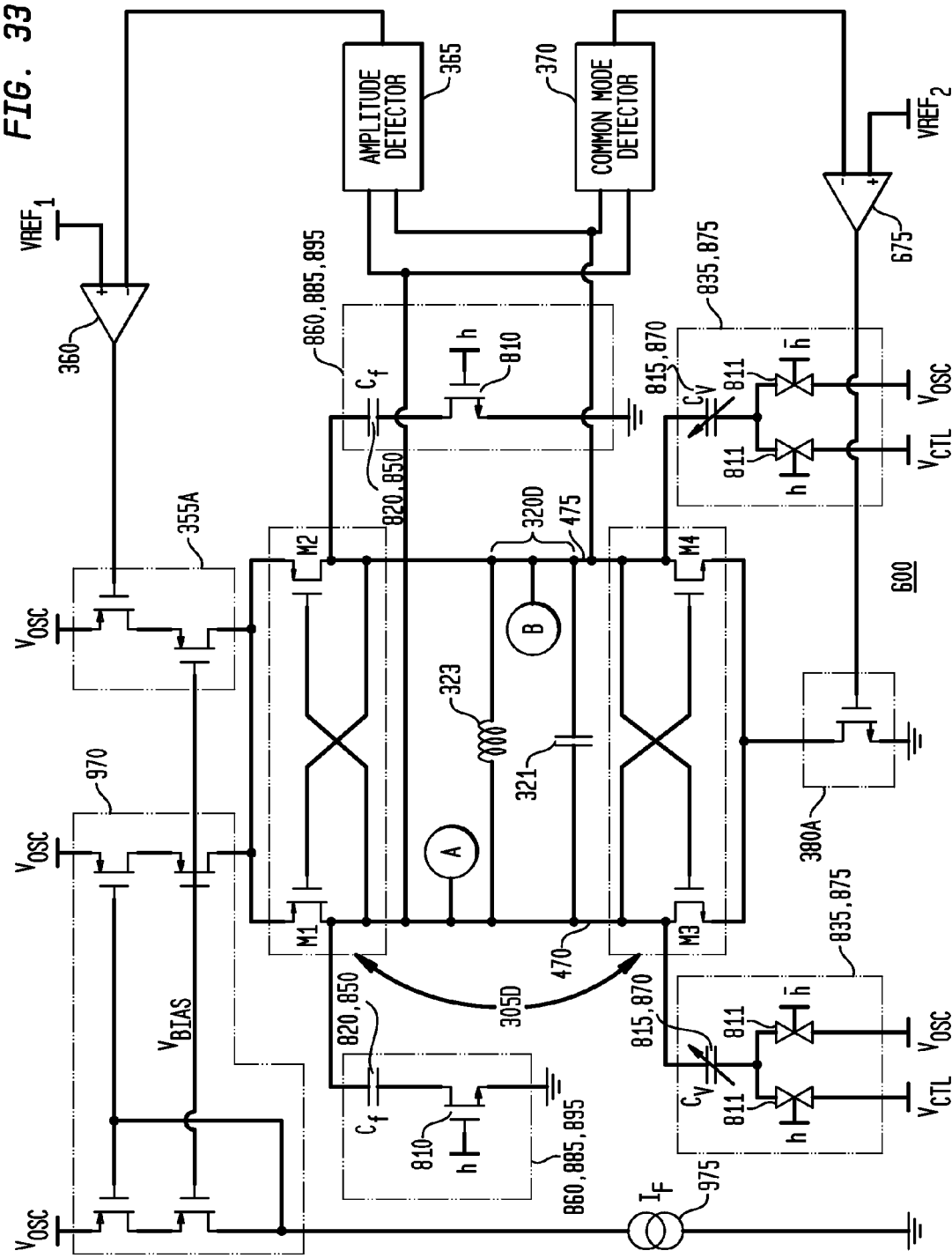
FIG. 33 is a circuit and block diagram illustrating an exemplary fifth apparatus embodiment in accordance with the teachings of the present invention.
Figure 34:
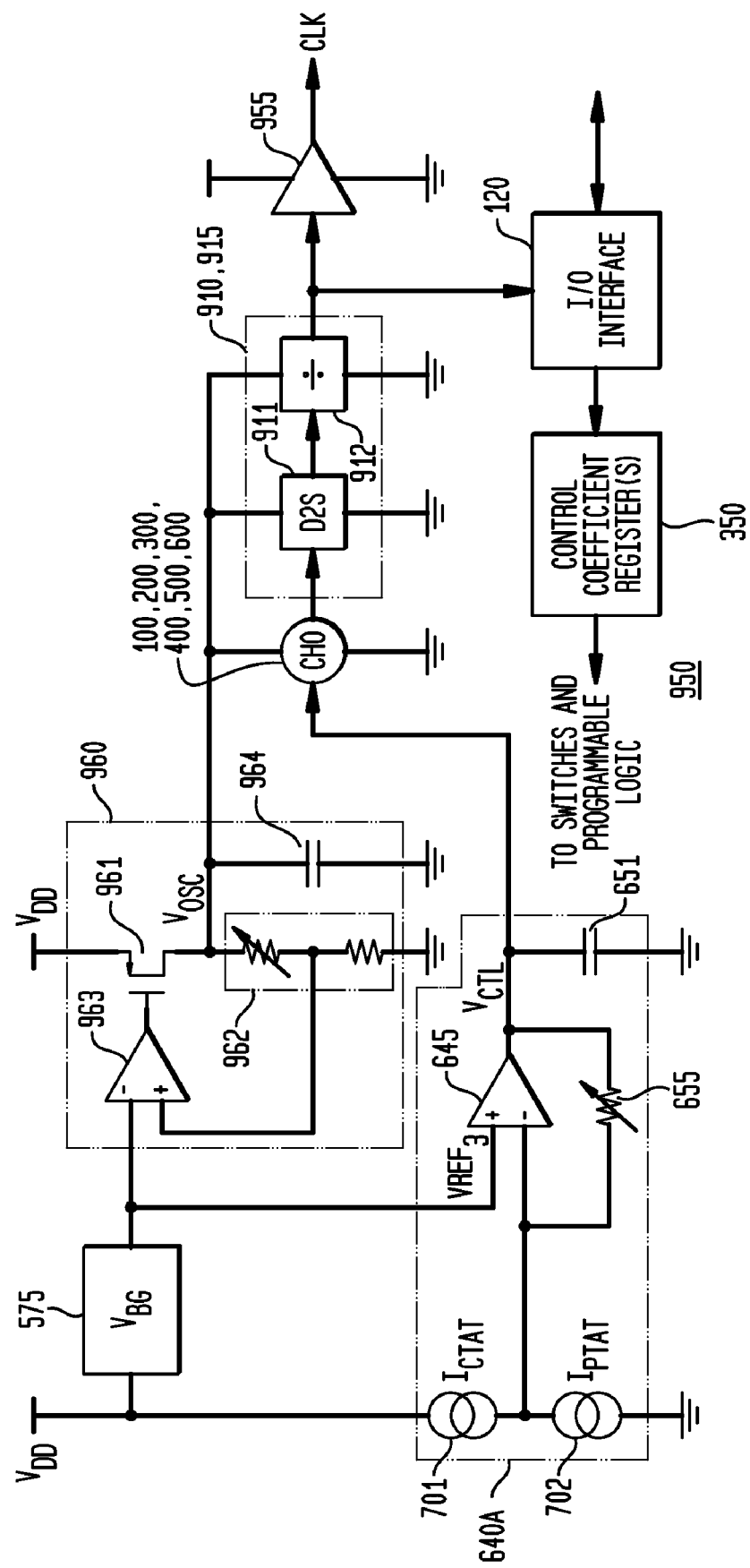
FIG. 34 a block diagram illustrating an exemplary third system embodiment in accordance with the teachings of the present invention.

Amplitude controller 330A comprises an amplitude detector (or sensor) 365 and an operational amplifier 360, and may also include a variable current source 355 (which may be implemented as one or more transistors, such as in a cascode configuration or a current mirror configuration, for example, as illustrated in FIG. 33). Amplitude controller 330B comprises an amplitude detector (or sensor) 365 and a comparator 361, and may also include a variable current source 355 (also which may be implemented as one or more transistors, such as in a cascode configuration or a current mirror configuration). (A plurality of such cascode and current mirror configurations are illustrated and discussed in the related applications, and such current sources also may be otherwise implemented as known or becomes known in the electronic arts). In addition to a variable current, the current input into the sustaining amplifier 305A, 305C and LC resonator 320A, 320C may also include a fixed current (from a fixed current source, as illustrated in FIG. 11, and not separately illustrated in FIGS. 5 and 6), such that a first portion of the current input into the sustaining amplifier 305A, 305C and LC resonator 320A, 320C is fixed, while a second portion of the current is variable and controlled by the amplitude detector 365 and operational amplifier 360 (or comparator 361).

The amplitude detector 365 is adapted to determine the magnitude of the peak amplitude of the resonant frequency signal across differential nodes "A" and "B". There are innumerable ways to implement such an amplitude detector 365, and an exemplary amplitude detector circuit 565 is discussed below with reference to FIG. 8. The magnitude of the peak amplitude of the resonant frequency signal may be determined during any one or more half-cycles of the oscillation, as the signals appearing on differential nodes "A" and "B" are 180 degrees out of phase with each other. The magnitude of the peak amplitude is then effectively compared by the operational amplifier 360 or comparator 361 with the first reference voltage (VREF$_1$) provided by reference voltage generator 345, and as a result of the comparison, a corresponding control signal is provided to the variable current source 355.

More specifically, referring to FIG. 5, a first reference voltage (VREF$_1$) corresponding to a selected or desired magnitude of the peak amplitude has been predetermined, such as through a previously performed calibration or a design process. The operational amplifier 360 will provide a corresponding control signal to the variable current source 355, to increase or decrease the current input into the sustaining amplifier 305A, 305C and LC resonator 320A, 320C, to effectively force the magnitude of the peak amplitude (as a corresponding voltage level determined by the amplitude detector 365) to substantially equal the first reference voltage (VREF$_1$) level. Once the magnitude of the peak amplitude is substantially equal to the first reference voltage (VREF$_1$) level, the corresponding control signal from the operational amplifier 360 to the variable current source 355 will tend to maintain that corresponding current level being input into the sustaining amplifier 305A, 305C and LC resonator 320A, 320C, with adjustments as may be needed based on the feedback provided through the amplitude detector 365.

Also more specifically, referring to FIG. 6, comparator 361 will compare the magnitude of the peak amplitude (as a corresponding voltage level determined by the amplitude detector 365 to a predetermined first reference voltage ($VREF_1$) corresponding to a selected or desired magnitude of the peak amplitude. As a result of the comparison, the comparator 361 will provide a corresponding control signal to the variable current source 355, to increase or decrease the current input into the sustaining amplifier 305A, 305C and LC resonator 320A, 320C, also effectively forcing the magnitude of the peak amplitude (as a corresponding voltage level determined by the amplitude detector 365) to substantially equal the first reference voltage ($VREF_1$) level. Once the magnitude of the peak amplitude is substantially equal to the first reference voltage ($VREF_1$) level, the corresponding control signal from the comparator 361 to the variable current source 355 will tend to maintain that corresponding current level being input into the sustaining amplifier 305A, 305C and LC resonator 320A, 320C, with adjustments as may be needed based on the feedback provided through the amplitude detector 365.

As a consequence, through this first feedback circuit (or first feedback loop), the magnitude of the peak amplitude of the resonant frequency signal across nodes "A" and "B" is maintained substantially constant at a predetermined level corresponding to the predetermined, first reference voltage ($VREF_1$) level. (Such a correspondence may be substantially equal to the first reference voltage ($VREF_1$) level or substantially equal to a scaled version of the first reference voltage ($VREF_1$) level, e.g., based upon how the corresponding voltage level at differential nodes "A" or "B" may be determined by the amplitude detector 365). As indicated above, the resulting current regulation maintains the resonant frequency $f_0$ substantially constant over variations in bias voltages, power supply voltages, etc.

At a high level, the common mode controller 325 operates similarly to the amplitude controller 330, but serves to maintain substantially constant a common mode voltage across differential nodes "A" and "B", rather than a magnitude of a peak amplitude. Exemplary common mode controllers 325 are illustrated in FIG. 5 as common mode controller 325A and in FIG. 6 as common mode controller 325B. While illustrated as coupled to the ground rail in FIG. 5, the common mode controller 325A may instead be coupled to the power supply voltage rail $V_{DD}$, as illustrated in FIG. 6 for common mode controller 325B, essentially switching locations in the circuit with the amplitude controller 330. As mentioned above and as discussed below with respect to FIG. 34, a power rail having a voltage lower than $V_{DD}$ may also be utilized. In addition, those of skill in the art will recognize that additional circuit configurations may be utilized to implement the common mode controller 325, in addition to the illustrated common mode controllers 325A and 325B, and all such variations are considered equivalent and within the scope of the present invention.

The common mode controller 325 is utilized to maintain substantially constant the common mode voltage level of the resonant frequency signal across differential nodes "A" and "B", i.e., the DC level of the oscillation (the DC level about which the resonant frequency signal oscillates). Without such control from the common mode controller 325, the common mode voltage level at differential nodes "A" and "B" would tend to change over time, due to aging-related changes in transistor threshold voltages and gate-to-source voltages, such as due to oxide tunneling and hot carrier effects, for example. In turn, that potential change in common mode voltage level could have an additional effect, namely, changing the voltage level across the variable reactances (capacitances), such as variable capacitance 322, which is determined by the voltage levels at nodes "A", "B" and corresponding control voltages provided to the variable reactances (capacitances). In that event, the effective reactance across the resonator 320 would also change, resulting in a corresponding and undesirable change in resonant frequency. Accordingly, the common mode controller 325 maintains this common mode voltage level substantially constant, thereby operating to maintain the resonant frequency ($f_0$) substantially stable despite such parameter variations which may occur due to temperature fluctuations, aging, voltage variations, and fabrication process variations.

Common mode controller 325A comprises a common mode detector (or sensor) 370 and an operational amplifier 375, and may also include a variable current source 380 (which may be implemented as one or more transistors, such as in a current mirror configuration, for example). Common mode controller 325B comprises a common mode detector (or sensor) 370 and a comparator 376, and may also include a variable current source 380 (which may be implemented as one or more transistors, such as in a current mirror configuration, for example). In addition to a variable current, the current input into the sustaining amplifier 305A, 305C and LC resonator 320A, 320C may also include a fixed current (from a fixed current source, as illustrated in FIG. 11 and not separately illustrated in FIGS. 5 and 6), such that a first portion of the current input into the sustaining amplifier 305A, 305C and LC resonator 320A, 320C is fixed, while a second portion of the current is variable and controlled by the common mode detector 370 and operational amplifier 375.

The common mode detector 370 is adapted to determine the common mode voltage level of the resonant frequency signal across differential nodes "A" and "B". There are innumerable ways to implement such a common mode detector 370, and an exemplary common mode detector circuit 670 is discussed below with reference to FIG. 10. The common mode voltage level of the resonant frequency signal may be determined during any one or more cycles of the oscillation, providing the DC level of the oscillation. The common mode voltage level is then effectively compared by the operational amplifier 375 or comparator 376 with a second reference voltage ($VREF_2$) provided by reference voltage generator 345, and as a result of the comparison, a corresponding control signal is provided to the variable current source 380.

More specifically, referring to FIG. 5, a second reference voltage ($VREF_2$) corresponding to a selected or desired common mode voltage level has been predetermined, such as through a previously performed calibration or a design process, typically a predetermined level above ground to avoid distortion. The operational amplifier 375 will provide a corresponding control signal to the variable current source 380, to increase or decrease the current input into the sustaining amplifier 305A, 305C and LC resonator 320A, 320C, to effectively force the common mode voltage level (as a corresponding voltage level determined by the common mode detector 370) to substantially equal the second reference voltage ($VREF_2$) level. Once the common mode voltage level is substantially equal to the second reference voltage ($VREF_2$) level, the corresponding control signal from the operational amplifier 375 to the variable current source 380 will tend to maintain that corresponding current level being input into the sustaining amplifier 305A, 305C and LC resonator 320A, 320C, with adjustments as may be needed based on the feedback provided through the common mode detector 370.

Also more specifically, referring to FIG. 6, comparator 376 will compare the common mode voltage level (as a corresponding voltage level determined by the common mode detector 370) with a predetermined, second reference voltage (VREF$_2$) corresponding to a selected or desired common mode voltage level, also typically a predetermined level above ground to avoid distortion. As a result of the comparison, the comparator 376 will provide a corresponding control signal to the variable current source 380, to increase or decrease the current input into the sustaining amplifier 305A, 305C and LC resonator 320A, 320C, also effectively forcing the common mode voltage level (as a corresponding voltage level determined by the common mode detector 370) to substantially equal the second reference voltage (VREF$_2$) level. Once the common mode voltage level is substantially equal to the second reference voltage (VREF$_2$) level, the corresponding control signal from the comparator 376 to the variable current source 380 will tend to maintain that corresponding current level being input into the sustaining amplifier 305A, 305C and LC resonator 320A, 320C, with adjustments as may be needed based on the feedback provided through the common mode detector 370.

As a consequence, through this second feedback circuit (or second feedback loop), the common mode voltage level of the resonant frequency signal across nodes "A" and "B" is maintained substantially constant at a predetermined level corresponding to the predetermined, second reference voltage (VREF$_2$) level. (Such a correspondence also may be substantially equal to the second reference voltage (VREF$_2$) level or substantially equal to a scaled version of the second reference voltage (VREF$_2$) level, e.g., based upon how the corresponding common mode voltage level at differential nodes "A" or "B" may be determined by the common mode detector 370). As indicated above, the resulting substantially stable common mode voltage level maintains the resonant frequency f$_0$ substantially constant over parameter variations such as temperature fluctuations, aging, voltage variations, and fabrication process variations, etc.

As a result of these two feedback mechanisms, the resonant frequency f$_0$ of the resonator 320 of the reference signal generator 100, 200, 300, 400, 500, 600 is maintained substantially constant over parameter variations, such as variations in bias voltage or power supply voltage, temperature fluctuations, aging, and fabrication process variations. In order to provide convergence of these two feedback circuits (and avoid the feedback from the two loops potentially working against each other), the two feedback loops are designed to operate at different speeds in accordance with the exemplary embodiments of the invention. More specifically, the common mode controller 325 is adapted to operate comparatively faster than the amplitude controller 330, converging comparatively quickly to the predetermined or selected common mode voltage level of the oscillation (typically predetermined and provided as VREF$_2$). The amplitude controller 330, which is adapted to operate comparatively slower than the common mode controller 325, then more slowly converges the magnitude of the oscillation amplitude to the predetermined or selected magnitude (the amplitude magnitude above and below the common mode voltage level) (typically predetermined and provided as VREF$_1$). Typically for reference signal generator 400, the operational amplifier 375 is designed to have a comparatively low gain, and therefore a higher bandwidth and faster operation, compared to operational amplifier 360. Additional gain (for the variable current source 380) may then be provided by transistor sizing of corresponding current mirrors, as known in the art, for example.

The circuit structures illustrated in FIGS. 5 and 6 have an additional benefit, namely, providing less sensitivity to the power and ground rails. More particularly, with the variable current sources 355, 380 respectively coupled to the power and ground rails, respectively, or vice-versa, the resonant frequency signal has a voltage level fluctuating a predetermined distance (magnitude) from both the power and ground rails, providing greater immunity to various types of noise and other distortions.

Figure 8:
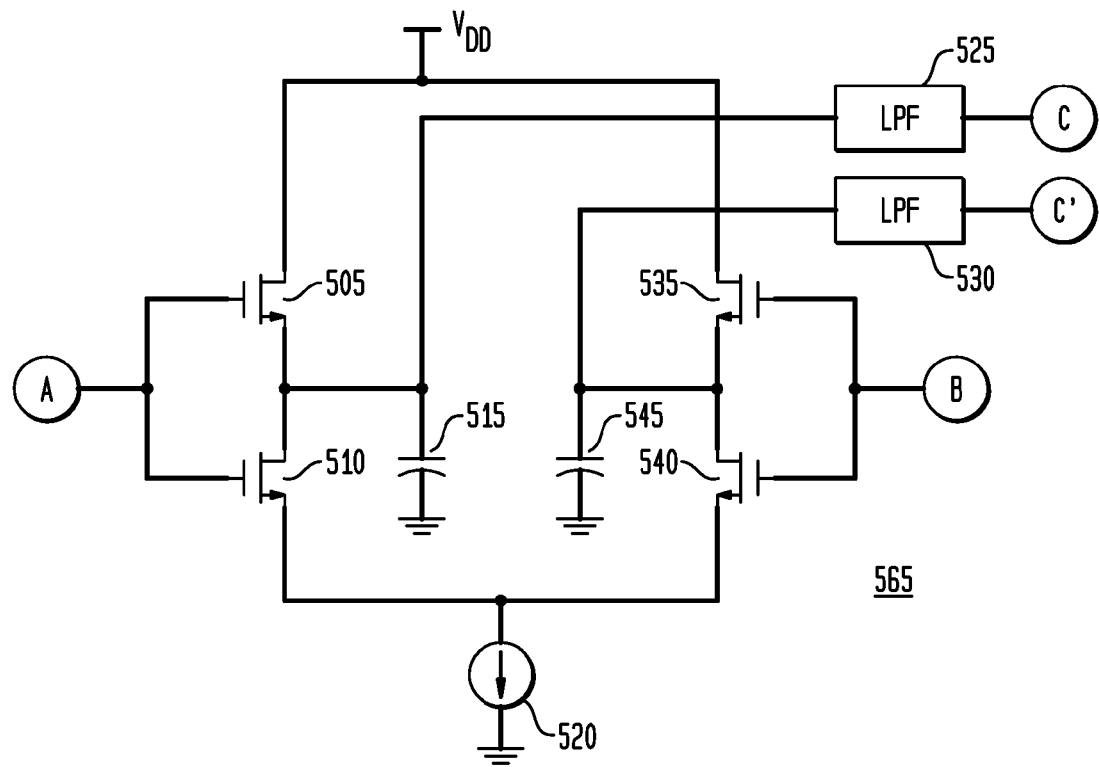
FIG. 8 is a circuit diagram illustrating an exemplary amplitude detector embodiment in accordance with the teachings of the present invention.

FIG. 8 is a circuit diagram illustrating an exemplary amplitude detector 565 embodiment in accordance with the teachings of the present invention. As mentioned above, an amplitude detector 365 may be implemented in innumerable ways; accordingly, the illustrated amplitude detector 565 is merely exemplary, and should not be regarded as limiting the scope of the invention. As illustrated in FIG. 8, the amplitude detector 565 is symmetrical for coupling to and providing substantially equal loading of the differential nodes "A" and "B". The output from the amplitude detector 565 may be from either node "C" or node "C'" (C prime), and coupled to the inverting node of operational amplifier 360 or one of the two inputs of comparator 361, as illustrated in FIGS. 5 and 6. Not separately illustrated, in the event an output will be utilized from both nodes "C" and "C'", a differential to single-ended (D2S) converter may be utilized to then provide a single output. During operation, when its voltage level is comparatively high (e.g., having a large amplitude during a first, positive portion of the oscillation), the resonant frequency signal on differential node "A" will turn on transistor 505 (depending on its gate-to-source voltage, with its source voltage determined by the capacitor 515) and provide a current path to charge capacitor 515, and will also turn on transistor 510, providing a second current path through current source 520. When its voltage level is comparatively lower (e.g., having a small amplitude during a first, positive portion of the oscillation), and depending upon the voltage of the capacitor 515, the resonant frequency signal on differential node "A" may not have sufficient voltage to turn on transistor 505 (also depending on its gate-to-source voltage, with its source voltage determined by the capacitor 515), but may be sufficient to turn on transistor 510 and provide a discharge path for capacitor 515, also with current source 520 tending to pull the source of transistor 510 toward ground. When its voltage level is even lower (e.g., during a second, negative portion of the oscillation, depending on the common mode voltage level of the oscillation), the resonant frequency signal on differential node "A" may not have sufficient voltage to turn on transistor 505 or transistor 510, isolating the capacitor 515 and allowing the capacitor 515 to hold its charge.

Similarly during operation, when its voltage level is comparatively high (e.g., having a large amplitude), the resonant frequency signal on differential node "B" will turn on transistor 535 (depending on its gate-to-source voltage, with its source voltage determined by the capacitor 545) and provide a current path to charge capacitor 545, and will also turn on transistor 540, providing a second current path through current source 520. When its voltage level is comparatively lower (e.g., having a small amplitude), and depending upon the voltage of the capacitor 545, the resonant frequency signal on differential node "B" may not have sufficient voltage to turn on transistor 535 (also depending on its gate-to-source voltage, with its source voltage determined by the capacitor 545), but may be sufficient to turn on transistor 540 and provide a discharge path for capacitor 545, also with current source 520 tending to pull the source of transistor 540 toward ground. When its voltage level is even lower (e.g., during a second, negative portion of the oscillation), depending on the common mode voltage level of the oscillation), the resonant frequency signal on differential node "B" also may not have sufficient voltage to turn on transistor 535 or transistor 540, isolating the capacitor 545 and allowing the capacitor 545 to hold its charge.

Following start up, as the voltage on the capacitor 515, 545 will not yet have charged to its steady-state level, such that the voltage provided on nodes C or C' (C-prime) will be lower than a predetermined level (in comparison to VREF1), and the operational amplifier or comparator 361 will provide a corresponding signal to variable current source 355 to increase the current to the sustaining amplifier 305A, 305C and LC resonator 320A, 320C, which will serve to increase the magnitude of the amplitude of the oscillation. Over a plurality of cycles following start up, and subject to leakage currents and other sources of voltage dissipation, as the amplitude of the resonant frequency signal increases toward its predetermined magnitude, the capacitor 515, 545 will charge to a corresponding voltage level (i.e., charge through transistor 505, 535 more than it discharges through transistor 510, 540), converging to this voltage level at steady-state, as determined by its capacitance and by the relative on-times and sizes of transistors 505, 510 or 535, 540. The corresponding voltage level of the capacitor 515, 545 then provides a relative or indirect measure of the magnitude of the amplitude (i.e., a larger amplitude provides a longer on time of both of the transistors 505, 510 or 535, 540 and increases the voltage on capacitor 515, 545), and is correlated with the desired or predetermined peak magnitude of the amplitude of the resonant frequency signal. The desired or predetermined corresponding voltage level of the capacitor 515, 545 should be designed to be substantially equal (or scaled) to the first reference voltage (VREF$_1$) level, and predetermined to provide the desired magnitude of the amplitude of the resonant frequency signal. Any ripple in the voltage level of the capacitor 515, 545 may be filtered by a corresponding low pass filter 525, 530, with the resulting voltage level (representing the magnitude of the amplitude of the resonant frequency signal) provided to the inverting node of operational amplifier 360 or one of the inputs of comparator 361, for use in providing the amplitude control discussed above.

Figure 9:
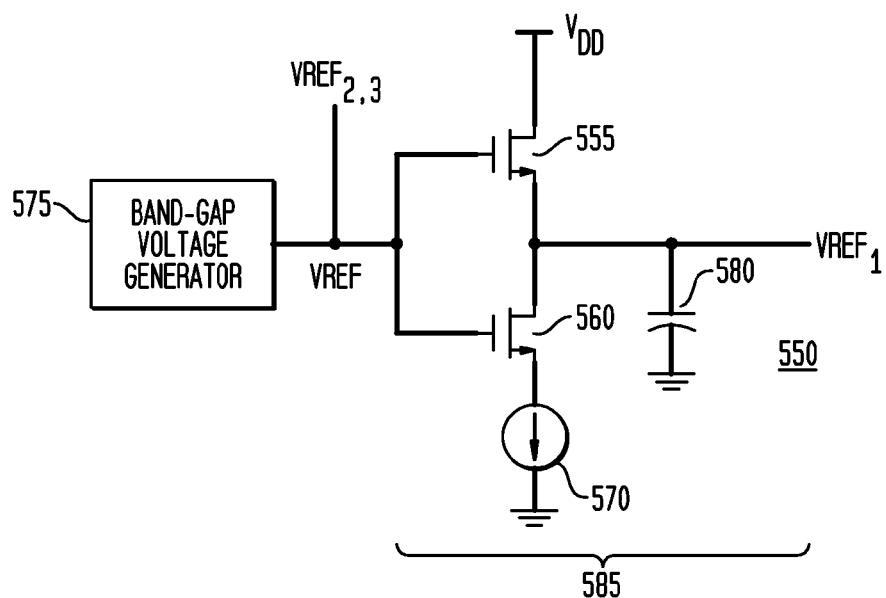
FIG. 9 is a circuit diagram illustrating an exemplary reference voltage generator and conditioning circuit embodiment in accordance with the teachings of the present invention.

FIG. 9 is a circuit diagram illustrating an exemplary reference voltage generator 550 and reference voltage conditioning circuit 585 embodiment in accordance with the teachings of the present invention. Depending upon the circuit structure of the amplitude controller 330, common mode controller 325, and control voltage generator 340, a reference voltage (provided by a voltage source such as a band-gap voltage generator 575) should be "conditioned" by a reference voltage conditioning circuit (such as exemplary reference voltage conditioning circuit 585), to provide consistency in the voltage levels used for comparisons, substantially eliminating differences which might otherwise arise due to changing parameters from fabrication process variations, temperature, aging, etc. For example, the exemplary reference voltage conditioning circuit 585 may be utilized to accommodate changes in transistor threshold voltages and gate-to-source voltages which may occur over time, due to temperature variations, as well as fabrication process variations, as mentioned above. Therefore, to provide a first reference voltage (VREF$_1$) level for use by the amplitude detector 565, a similar circuit structure (one-half of the symmetric amplitude detector 565, comprising transistors 555, 560, capacitor 580 and current source 570) is combined with the band-gap voltage generator 575. The reference voltage (VREF) provided by the band-gap voltage generator 575 is then modified using the same circuit configuration of the amplitude detector 565, providing a resulting first reference voltage (VREF$_1$) level that has the same or similar variation over time or fabrication process as amplitude detector 565, and thereby continues to provide an accurate correspondence to the voltage level provided by the amplitude detector 565.

Depending upon the circuit structure of the amplitude controller 330, common mode controller 325, and control voltage generator 340, a reference voltage (provided by a voltage source such as a band-gap voltage generator 575) may each be separately "conditioned" by a corresponding reference voltage conditioning circuit, i.e., reference voltage conditioning circuits which each correspond to a respective circuit implementation of the amplitude controller 330, common mode controller 325, and control voltage generator 340. For example, an exemplary common mode detector 670 illustrated below utilizes a passive circuit structure and is not subject to changes in transistor threshold voltages and gate-to-source voltages and, accordingly, the second reference voltage (VREF$_2$) level utilized for comparison in an exemplary embodiment does not need to be conditioned to track such changes. In addition, and not separately illustrated, any of the various reference voltage levels may be further level-shifted or divided, such as through suitable voltage dividers, to provide any selected or predetermined voltage level, as known or may become known in the electronic arts. Depending upon the implementation of the control voltage generator 340, the third reference voltage (VREF$_3$) level utilized may or may not be conditioned by a corresponding conditioning circuit.

Figure 10:
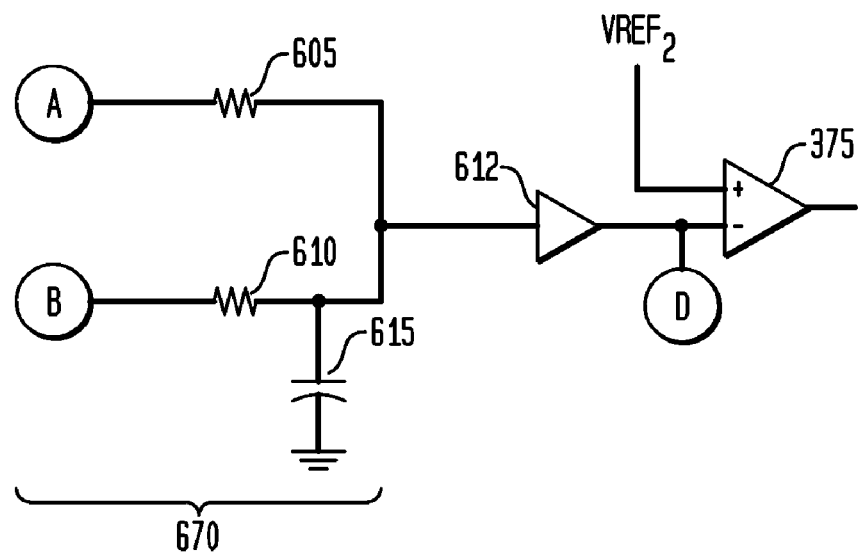
FIG. 10 is a circuit diagram illustrating an exemplary common mode detector embodiment in accordance with the teachings of the present invention.

FIG. 10 is a circuit diagram illustrating an exemplary common mode detector 670 embodiment in accordance with the teachings of the present invention. As mentioned above, a common mode detector 370 may be implemented in innumerable ways; accordingly, the illustrated common mode detector 670 is merely exemplary, and should not be regarded as limiting the scope of the invention. As illustrated in FIG. 10, the common mode detector 670 essentially functions as a low pass filter and is symmetrical for coupling to and providing substantially equal loading of the differential nodes "A" and "B". The output from the common mode detector 670 is at node "D" and is coupled to the inverting node of operational amplifier 375 or to one of the inputs of comparator 376, as illustrated in FIGS. 5 and 6. An optional buffer 612 may also be utilized to provide the output at node "D", as illustrated. The resistors 605, 610 of the common mode detector 670 are sized to have a comparatively large resistance, e.g., 20 k Ohms, to decrease or minimize loading on the LC-tank 320, and a capacitor 615 has a comparatively small capacitance to provide low pass filtering. During operation, the resonant frequency signal on differential node "A" will provide a voltage across resistor 605 and charge capacitor 615, and the resonant frequency signal on differential node "B" will provide a voltage across resistor 610 and also charge capacitor 615. With the rejection of high frequency components provided by the filter capacitor 615, the signals on each differential nodes "A" and "B" combine or are summed, providing a DC voltage level at node "D" corresponding to the common mode voltage level. The resulting voltage level (representing the common mode voltage level of the resonant frequency signal) is provided to the inverting node of operational amplifier 375 or to one of the inputs of comparator 376, for use in providing the common mode voltage level control discussed above. Also as mentioned above, for this type of implementation, the second reference voltage (VREF$_2$) level is not conditioned in exemplary embodiments.

Figure 22:
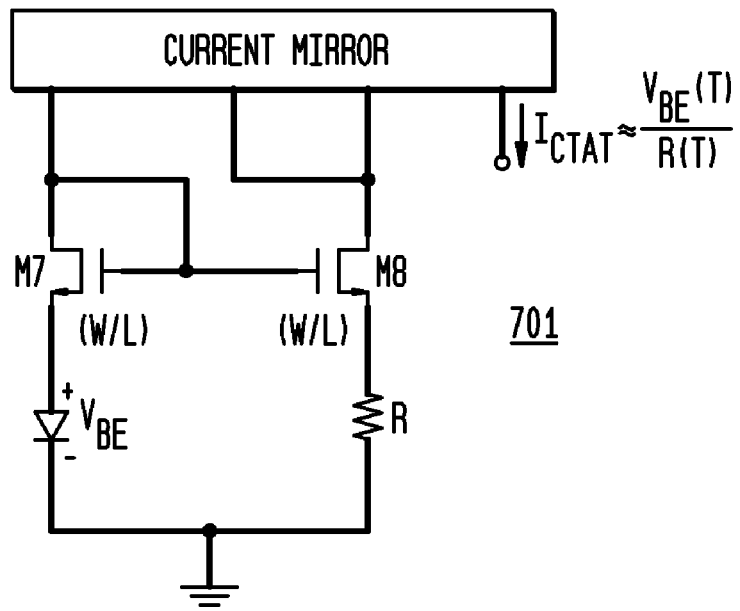
FIG. 22 is a circuit diagram illustrating an exemplary temperature-responsive CTAT current generator in accordance with the teachings of the present invention.
Figure 23:
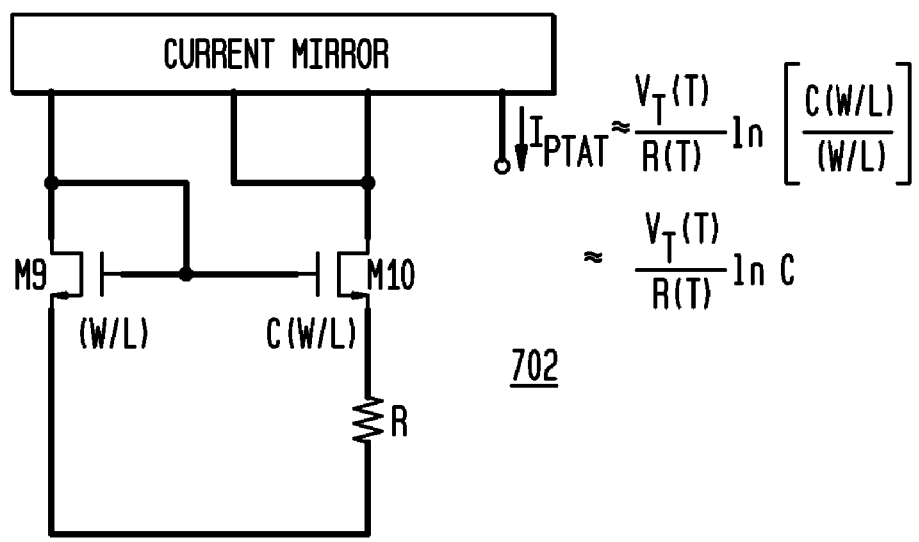
FIG. 23 is a circuit diagram illustrating an exemplary temperature-responsive PTAT current generator in accordance with the teachings of the present invention.
Figure 24:
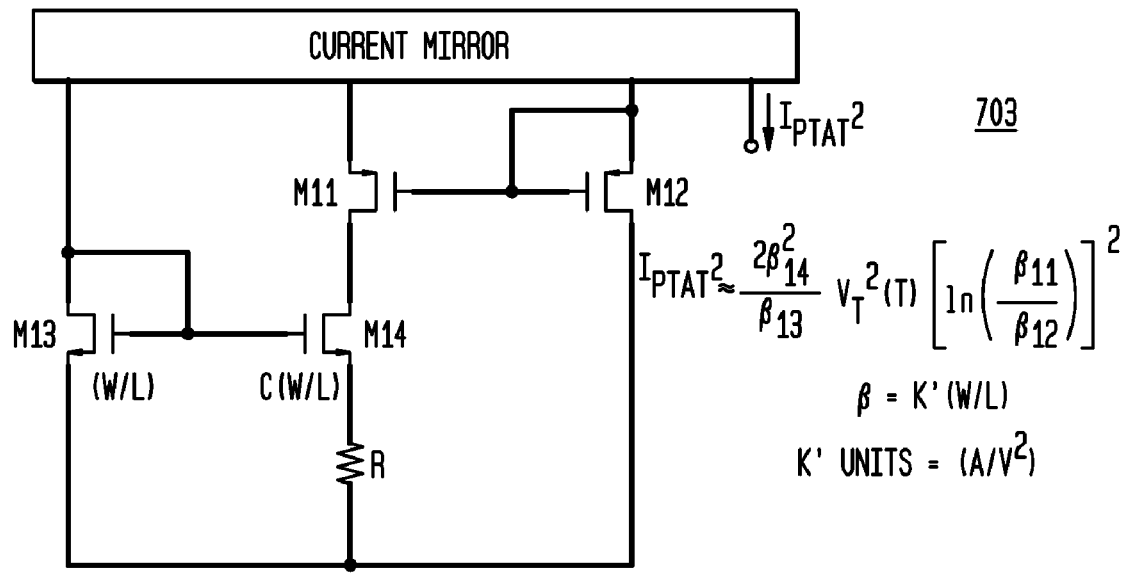
FIG. 24 is a circuit diagram illustrating an exemplary temperature-responsive $PTAT^2$ current generator in accordance with the teachings of the present invention.
Figure 25:
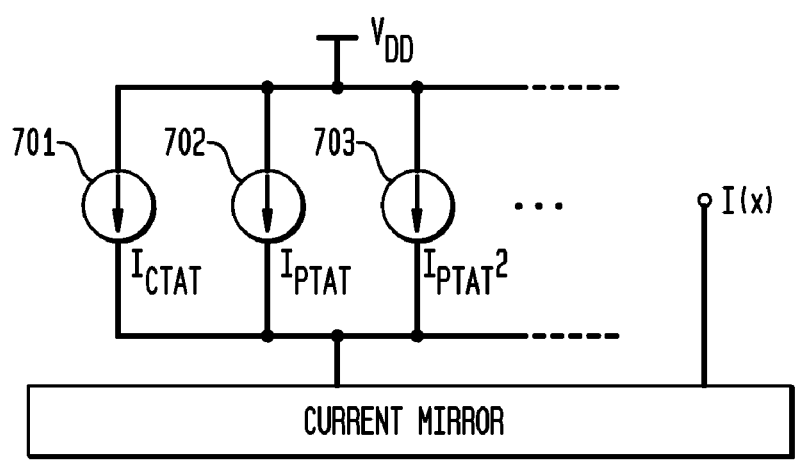
FIG. 25 is a circuit diagram illustrating an exemplary selectable and scalable temperature-responsive current generator, with selected CTAT, PTAT, and PTAT configurations, in accordance with the teachings of the present invention.

FIG. 11 is a circuit diagram illustrating exemplary fixed and variable current source embodiments in accordance with the teachings of the present invention. As mentioned above, the current sources 355 and 380 may be comprised of a combination of one or more fixed current sources 620 and variable current sources 625, to provide both the desired level of current into and the desired control of the current into the sustaining amplifier 305A, 305C and LC resonator 320A, 320C. In addition, the various current sources may be selected to provide comparatively stable current levels over temperature and other parameter variations, such as by utilizing topologies such as a CTAT (complementary to absolute temperature) current source 701, a PTAT (proportional to absolute temperature) current source 702, or a PTAT$^2$ proportional to absolute temperature squared) current source 703, as illustrated in FIGS. 22, 23 and 24, respectively, and combinations of CTAT, PTAT, and PTAT$^2$, as illustrated in FIG. 25. In each case, the resulting current injected into the sustaining amplifier 305A, 305C and LC resonator 320A, 320C may have a temperature dependence, such as increasing current (PTAT and PTAT$^2$) or decreasing current (CTAT) as a function of increasing temperature, as illustrated. One or more combinations of these temperature-responsive current generators may also be implemented, as illustrated in FIG. 25, such as CTAT in parallel with PTAT, for example, and also may be respectively scaled through appropriate transistor sizing of current mirrors, also for example. Such combinations may be selected such that the overall, combined current produced (I(x)) does not have a temperature dependence, with any selected current level then being substantially constant over temperature variations. This is particularly useful for providing fixed current sources 620, with any current variation provided through variable current sources controlled by the common mode controller 325 and the amplitude controller 330 using the two feedback mechanisms discussed above.

The selection of a particular temperature-responsive or temperature-dependent current generator is also a function of the fabrication process utilized; for example, CTAT may be utilized for a Taiwan Semiconductor (TSMC) fabrication process. More generally, as different fabricators utilize different materials, such as aluminum or copper, R$_L$ typically varies, resulting in different temperature coefficients which, in turn, change the temperature coefficient of the oscillator, thereby requiring differences in I(T) compensation. Correspondingly, different ratios of CTAT, PTAT, and PTAT$^2$ compensation may be required to provide an effectively flat frequency response as a function of temperature. For example, the bandgap voltage generator 575 may be configured to utilize different ratios of CTAT, PTAT, and PTAT$^2$ compensation to provide an effectively flat reference voltage as a function of temperature. Not separately illustrated, the various temperature-responsive current generators illustrated in FIG. 22-25 may include a start-up circuit. In addition, the transistors comprising the selected temperature-responsive current generator configuration may be biased differently, such as biased in strong inversion for CTAT (M7 and M8) and PTAT$^2$ (M13 and M14), and in subthreshold for PTAT (M9 and M10) and PTAT$^2$ (M11 and M12), for the exemplary topologies illustrated.

Figure 12:
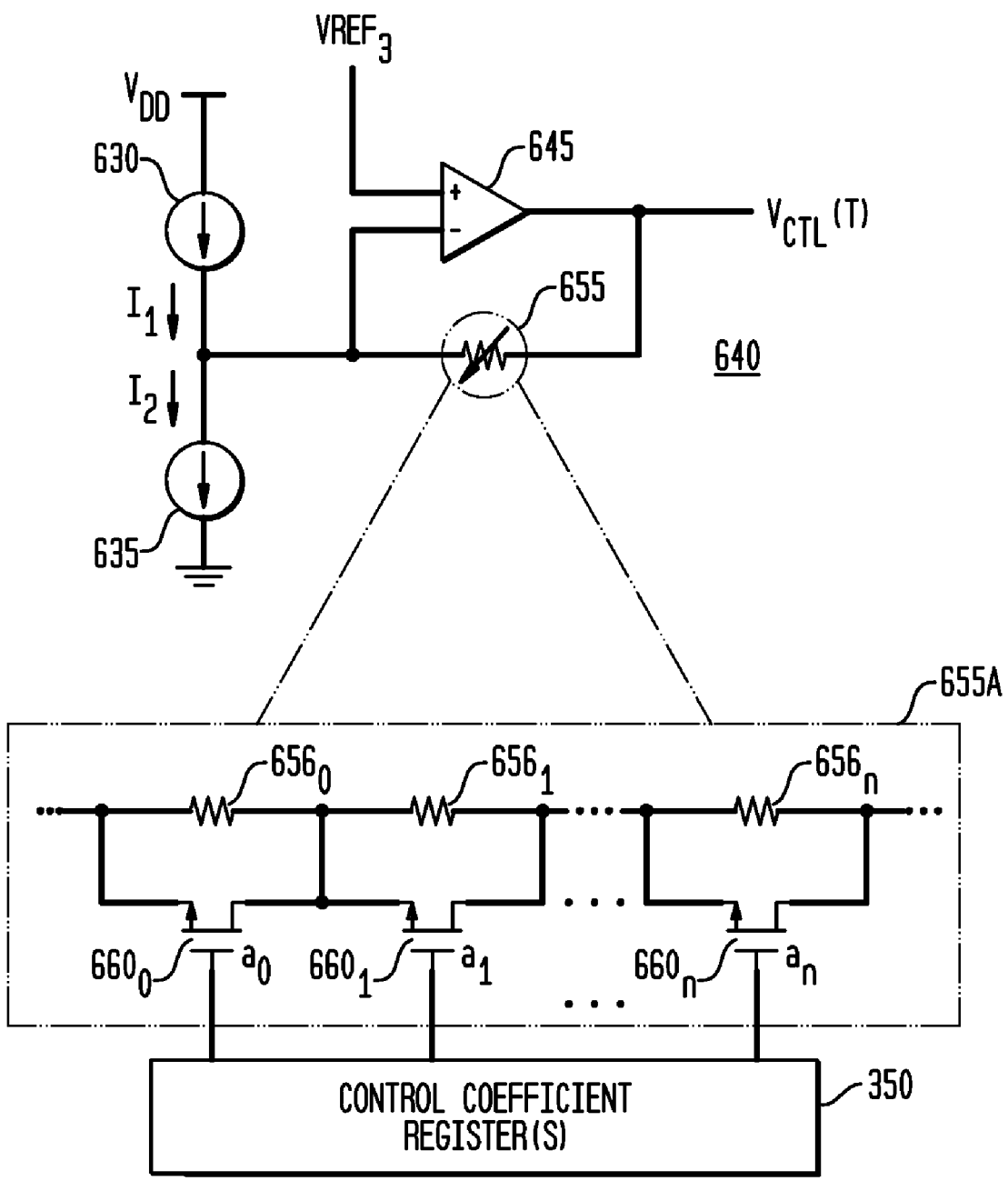
FIG. 12 is a circuit and block diagram illustrating an exemplary first control voltage generator embodiment and an exemplary first variable resistor embodiment in accordance with the teachings of the present invention.

FIG. 12 is a circuit and block diagram illustrating an exemplary first control voltage generator 640 embodiment in accordance with the teachings of the present invention. In the exemplary embodiments, the resulting control voltage provided exhibits a temperature-dependence, V$_{CTL}$(T), which may then be utilized to maintain the resonant frequency (f$_0$) substantially stable despite such temperature variations. For example, resulting changes in the control voltage V$_{CTL}$(T) have the further effect of modifying the effective capacitance presented to the LC-tank (resonator) 320 by the variable capacitances 322 or other variable reactances or impedances, thereby substantially "canceling" the temperature response of the LC-tank (resonator) 320 which would otherwise occur, and maintaining the resonant frequency (f$_0$) substantially constant. In exemplary embodiments of the control voltage generator 640, the first current source 630 and second current source 635 are typically selected to have opposing responses to temperature variation. For example, first current source 630 may be a CTAT current source 701, while second current source 635 may be a PTAT or PTAT$^2$ current source 702, 703. In addition, as indicated above, various combinations of CTAT, PTAT, and PTAT$^2$ current sources may be utilized to provide any desired temperature response.

A third reference voltage (VREF$_3$) level is provided to the non-inverting node of the operational amplifier 645, and may be a conditioned reference voltage, or may be provided directly by the band-gap voltage reference 575 with any desired voltage level shifting or scaling. The inverting node of the operational amplifier 645 is coupled to the first and second current sources 630, 635 and to a variable resistance 655. The variable resistance 655 may be configured in innumerable ways, with an exemplary first variable resistance 655A circuit configuration illustrated as comprising a bank of resistors 656$_0$, 656$_1$ through 656$_n$, which are switched in or out of the circuit (and thereby vary the overall resistance provided by variable resistor 655A) by corresponding transistors (660$_0$, 660$_1$ through 660$_n$) under the control of a plurality of control coefficients a$_0$, a$_1$, through a$_n$, which may be calibrated or otherwise predetermined in advance of system 150, 900, 950 operation, and stored in coefficient register(s) 350. The comparative resistances of resistors 656$_0$, 656$_1$ through 656$_n$ may be weighted in any of a plurality of ways, such as binary weighting or unit weighting. Other circuit configurations may also be utilized to provide a variable resistance 655, such as the "R2R" configuration illustrated in FIG. 20 and discussed below, and any and all such configurations are considered equivalent and within the scope of the invention.

In exemplary embodiments, to provide a consistent response over parameter variations, such as variations due to aging, temperature, and fabrication process, the resistors 656$_0$, 656$_1$ through 656$_n$ may all be implemented using the same type of resistor, such as diffusion resistors, or chemical vapor deposition resistors, or polysilicon resistors, for example. This concept of utilizing the same type of resistors may also be extended to other circuits within reference signal generator 100, 200, 300, 400, 500, 600, such as the common mode detector 670 and the various current sources (e.g., CTAT, PTAT, and PTAT$^2$), for example. In an exemplary embodiment, the same type of resistor has been utilized throughout the system 150, 900, 950. The resistors may be any type, such as diffusion resistors (p or n), polysilicon, metal resistors, salicide or unsalicide polysilicon resistors, or well resistors (p or n well), for example. In other embodiments, combinations of different types of resistors may also be utilized, with all such variations considered equivalent and within the scope of the invention.

Figure 13B:
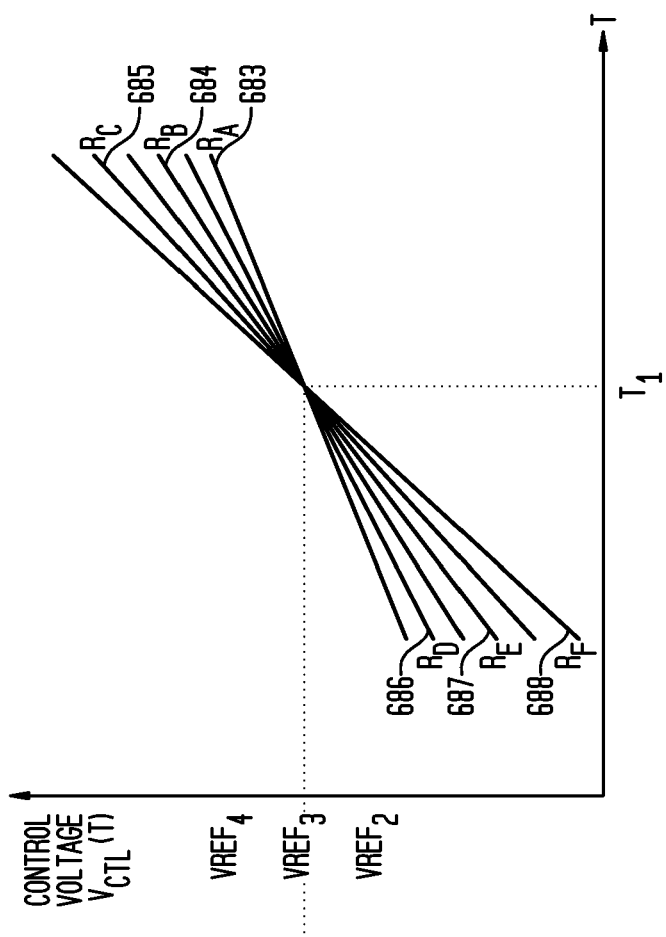
FIGS. 13A and 13B, are graphical diagrams illustrating control voltage as a function of temperature as utilized in accordance with the teachings of the present invention.
Figure 13A:
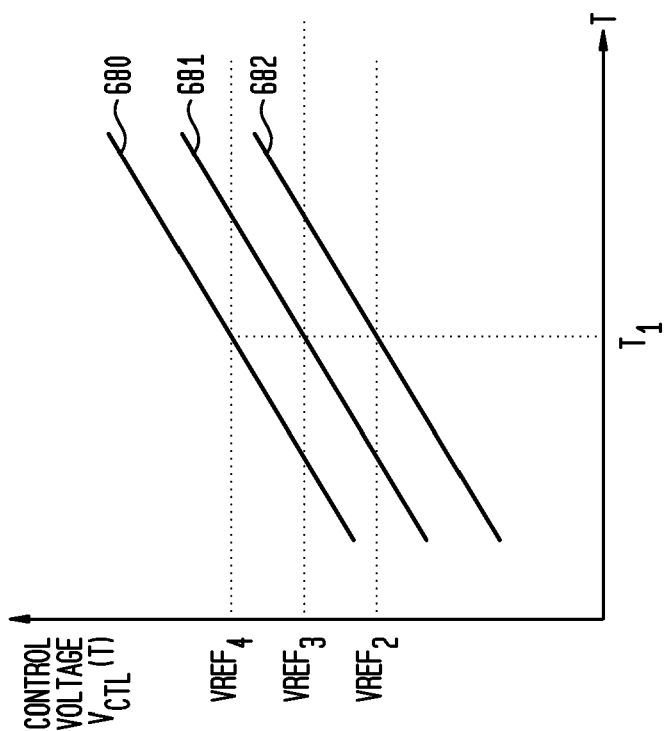

Appropriate selection of the first current source 630 (e.g., CTAT or selected combinations of CTAT, PTAT, and/or PTAT$^2$) and the second current source 635 (e.g., PTAT, PTAT$^2$, or selected combinations of CTAT, PTAT, and/or PTAT$^2$) can be utilized to provide a resulting control voltage which has a substantially linear response with temperature, and which does not vary substantially due to aging or fabrication process. FIGS. 13A and 13B, are graphical diagrams illustrating control voltage as a function of temperature as utilized in accordance with the teachings of the present invention. At a temperature (illustrated as $T_1$) where the first current $I_1$ (from first current source 630) is substantially equal to the second current $I_2$ (from the second current source 635), the resulting control voltage $V_{CTL}(T)$ linear response may be selected (lines 680, 681, or 682) by appropriate selection of a reference voltage (at the non-inverting input of operational amplifier 645), such as a fourth reference voltage ($VREF_4$) level, the third reference voltage ($VREF_3$) level, or the second reference voltage ($VREF_2$) level, as illustrated in FIG. 13A. In this case, using the third reference voltage ($VREF_3$), the resulting control voltage $V_{CTL}(T)$ is substantially equal to the third reference voltage ($VREF_3$) level at temperature $T_1$. The slope of such a substantially linear response (i.e., the rate of change of the control voltage with a change in temperature) is then adjustable by selection of a resistance value of the variable resistor 655, i.e., variable resistor 655 is utilized to adjust the gain, such that a change in the resistance value of resistor 655 modifies the slope of the control voltage response with temperature (lines 683, 684, 685, 686, 687, or 688, corresponding to resistance values $R_A$, $R_B$, $R_C$, $R_D$, $R_E$, and $R_F$), as illustrated in FIG. 13B. These selections of the third reference voltage ($VREF_3$) level and the resistance value of variable resistor 655 may be and typically are made during a calibration procedure.

The resulting control voltage $V_{CTL}(T)$ is then substantially equal to the third reference voltage ($VREF_3$) level plus or minus the voltage across the variable resistor 655. For example, when the first current source 630 is CTAT and the second current source 635 is PTAT, and when temperature increases, the first current $I_1$ decreases and the second current $I_2$ increases. As the operational amplifier 645 may source or sink current, the resulting control voltage will increase with the increase in temperature, by an amount substantially equal to the voltage generated across the resistance 655. A larger or smaller resistance value will then generate a larger or smaller voltage difference for the same difference in first and second currents (thereby changing the slope of the control voltage response with temperature). During calibration, appropriate coefficients may be selected such that the resulting control voltage $V_{CTL}(T)$, by controlling the effective reactance presented to the LC-tank (resonator) 320, may effectively cancel the temperature response of the LC-tank (resonator) 320 which would otherwise occur, resulting in maintaining the resonant frequency ($f_0$) substantially stable despite such temperature variations.

Figure 14:
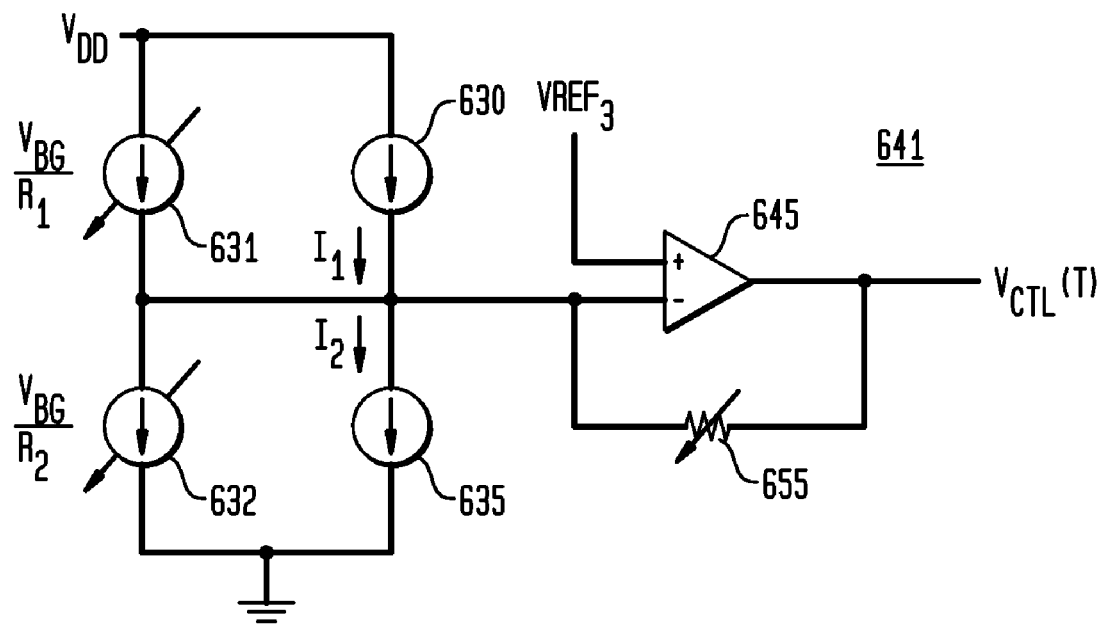
FIG. 14 is a circuit and block diagram illustrating an exemplary second control voltage generator embodiment in accordance with the teachings of the present invention.

FIG. 14 is a circuit and block diagram illustrating an exemplary second control voltage generator 641 embodiment in accordance with the teachings of the present invention. In the second control voltage generator 641, two variable current sources 631, 632 (illustrated as provided by a band-gap voltage divided by a corresponding resistance $R_1$ or $R_2$) are utilized to provide offset currents to adjust the DC value of the resulting control voltage $V_{CTL}(T)$, and otherwise functions as previously discussed for the first control voltage generator 640. The resulting control voltage $V_{CTL}(T)$ also is then substantially equal to the voltage of the non-inverting node of operational amplifier 645 (which is substantially equal to the third reference voltage ($VREF_3$) level) plus or minus the voltage across the variable resistor 655, which has the added contribution from the two variable current sources 631, 632. This second control voltage generator 641 embodiment is particularly useful when the various reference voltages having different voltage levels, such as $VREF_3$, may not be available, and only one reference voltage (e.g., directly from a band-gap voltage generator 575) is available. The various temperature dependencies of resistance $R_1$ and $R_2$ also may be utilized to offset any temperature dependence of variable resistance 655.

Figure 15:
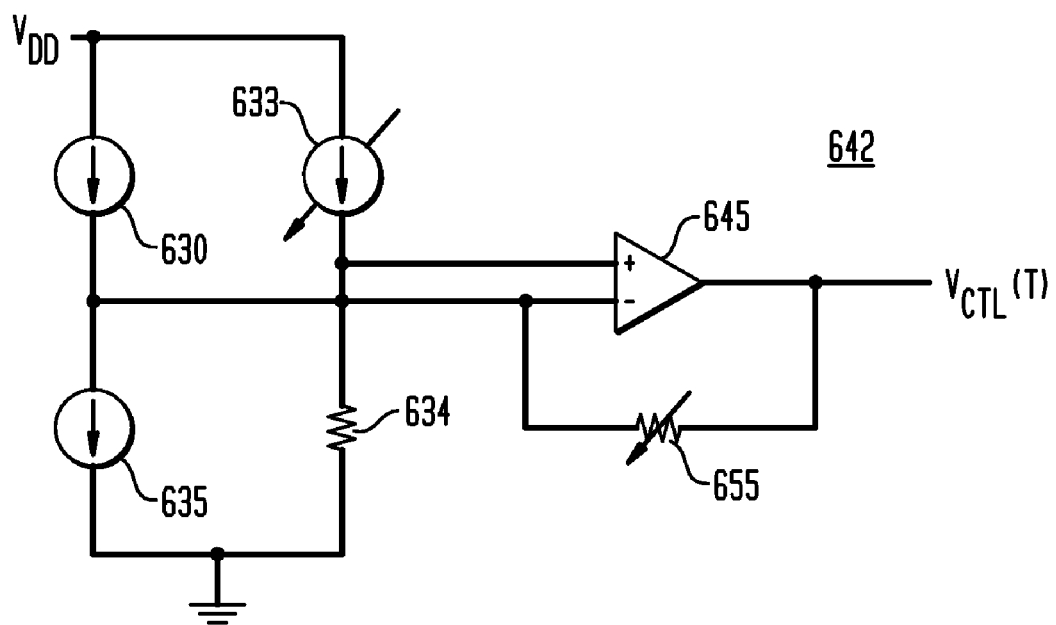
FIG. 15 is a circuit and block diagram illustrating an exemplary third control voltage generator embodiment in accordance with the teachings of the present invention.

FIG. 15 is a circuit and block diagram illustrating an exemplary third control voltage generator 642 embodiment in accordance with the teachings of the present invention. In the third control voltage generator 642, a variable current source 633 is digitally controlled, such as by using control coefficients, and is utilized to provide an adjustable reference voltage (across resistor 634) for input into operational amplifier 645, which correspondingly adjusts the DC level of the resulting control voltage $V_{CTL}(T)$, and otherwise functions as previously discussed for the first control voltage generator 640. The resulting control voltage $V_{CTL}(T)$ is then substantially equal to the voltage of the inverting node of operational amplifier 645 (which is substantially equal to the voltage level of the non-inverting node of operational amplifier 645) plus or minus the voltage across the variable resistor 655. The temperature dependency of resistor 634 also may be utilized to offset any temperature dependence of variable resistance 655.

Figure 16:
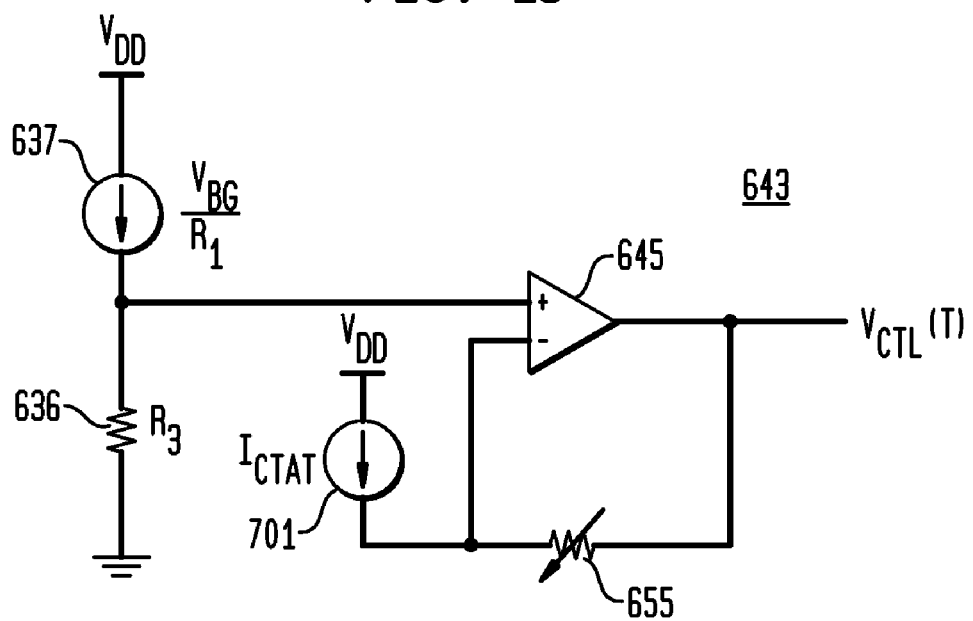
FIG. 16 is a circuit and block diagram illustrating an exemplary fourth control voltage generator embodiment in accordance with the teachings of the present invention.

FIG. 16 is a circuit and block diagram illustrating an exemplary fourth control voltage generator 643 embodiment in accordance with the teachings of the present invention. In the fourth control voltage generator 643, a fixed or variable current source 637 (illustrated as a provided by a band-gap voltage ($V_{BG}$) divided by a resistance $R_1$) through a resistance 636 ($R_3$) is utilized to provide a reference voltage input into the non-inverting node of operational amplifier 645. A CTAT current source 701 is utilized to provide the temperature dependence of the resulting control voltage $V_{CTL}(T)$. In comparison to the first control voltage generator 640 (when it is configured with the first current source 630 being a CTAT current source and the second current source 635 being a PTAT or $PTAT^2$ current source having an opposing temperature dependence), for a given resistance of variable resistor 655, the fourth control voltage generator 643 provides for a larger change in the resulting control voltage $V_{CTL}(T)$ for the same variation in temperature, and otherwise functions similarly to the first control voltage generator 640 as previously discussed. The resulting control voltage $V_{CTL}(T)$ is then substantially equal to the voltage of the inverting node of operational amplifier 645 (which is substantially equal to the voltage level of the non-inverting node of operational amplifier 645) minus the voltage across the variable resistor 655, and reaches a maximum when the CTAT current is zero.

Figure 17:
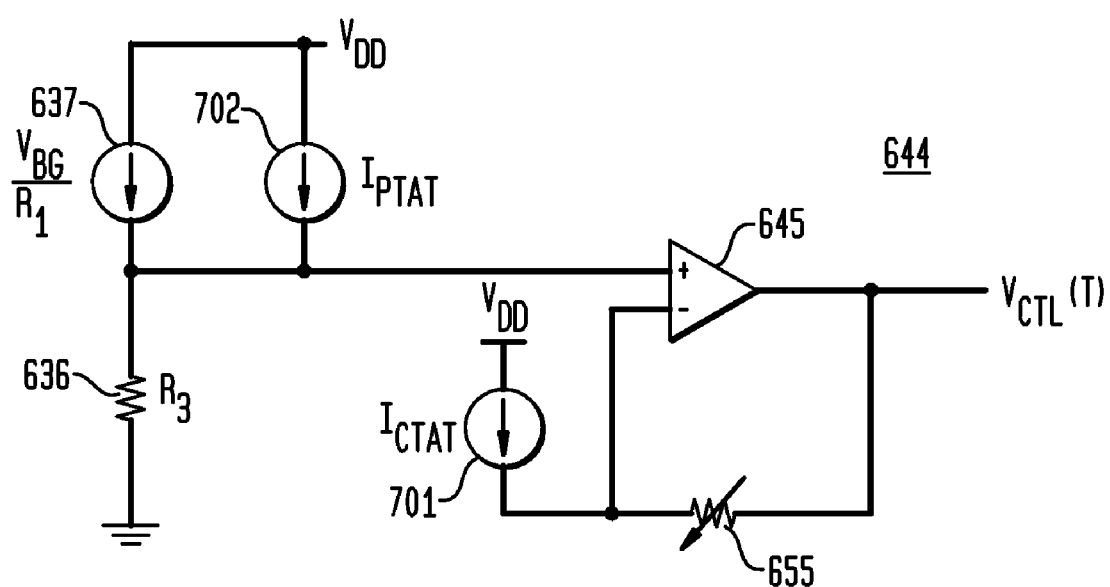
FIG. 17 is a circuit and block diagram illustrating an exemplary fifth control voltage generator embodiment in accordance with the teachings of the present invention.

FIG. 17 is a circuit and block diagram illustrating an exemplary fifth control voltage generator 644 embodiment in accordance with the teachings of the present invention. In the fifth control voltage generator 644, a fixed or variable current source 637 (also illustrated as a provided by a band-gap voltage ($V_{BG}$) divided by a resistance $R_1$) through a resistance 636 ($R_3$), and a PTAT current source 702 (which could also be a $PTAT^2$ current source), are utilized to provide a reference voltage input into the non-inverting node of operational amplifier 645. Both the PTAT current source 702 and a CTAT current source 701 are utilized to provide the temperature dependence of the resulting control voltage $V_{CTL}(T)$. In comparison to the first control voltage generator 640 (when it is configured with the first current source 630 being a CTAT current source and the second current source 635 being a PTAT or PTAT current source having an opposing temperature dependence), and in comparison to the fourth control voltage generator 643, for a given resistance of variable resistor 655, the fifth control voltage generator 644 provides for a larger change in the resulting control voltage $V_{CTL}(T)$ for the same variation in temperature, and otherwise functions similarly to the first control voltage generator 640 and fourth control voltage generator 643 as previously discussed. The resulting control voltage $V_{CTL}(T)$ also is then substantially equal to the voltage of the inverting node of operational amplifier 645 (which is substantially equal to the voltage level of the non-inverting node of operational amplifier 645) minus the voltage across the variable resistor 655.

Figure 18:
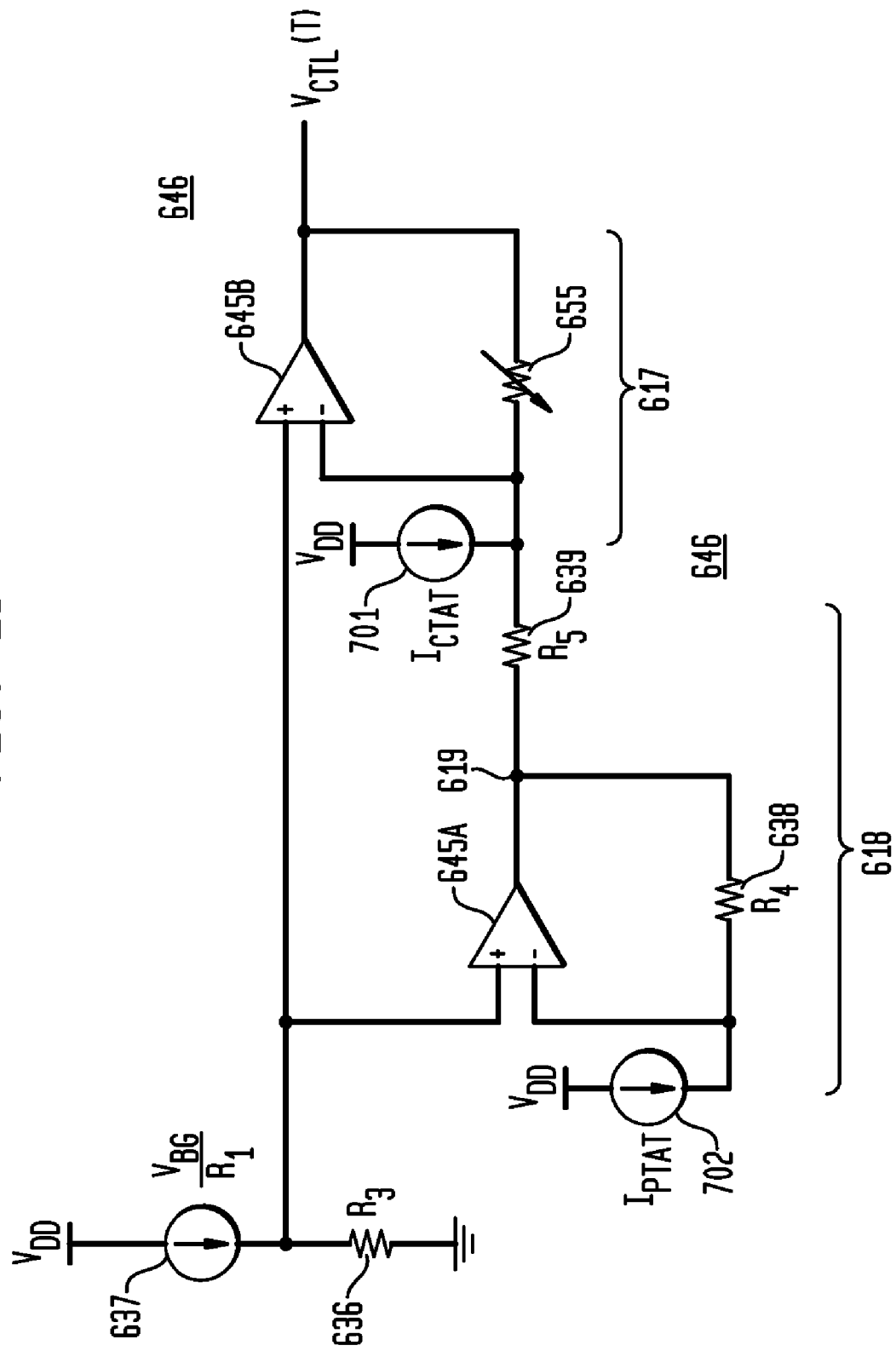
FIG. 18 is a circuit and block diagram illustrating an exemplary sixth control voltage generator embodiment in accordance with the teachings of the present invention.

FIG. 18 is a circuit and block diagram illustrating an exemplary sixth control voltage generator 646 embodiment in accordance with the teachings of the present invention. In this embodiment, the sixth control voltage generator 646 utilizes two stages 618 and 617, with two operational amplifiers, 645A and 645B. In the sixth control voltage generator 646, a fixed or variable current source 637 (illustrated as a provided by a band-gap voltage ($V_{BG}$) divided by a resistance $R_1$) through a resistance 636 ($R_3$) is utilized to provide a reference voltage input into the respective non-inverting nodes of operational amplifiers 645A and 645B. Second stage 617 operates similarly to the fourth control voltage generator 643 as previously discussed. With regard to the first stage 618, as temperature increases, the current provided by the PTAT current source 702 (which could also be a PTAT current source) also increases, resulting in a voltage at node 619 substantially equal to the voltage of the inverting node of operational amplifier 645A (which is substantially equal to the voltage level of the non-inverting node of operational amplifier 645A) minus the voltage across the resistor 638 ($R_4$). Due to the voltage at the inverting node of operational amplifier 645B also be greater than the voltage at node 619, there is a net current into the output of operational amplifier 645A, which acts as a current sink, helping to eliminate the use of NMOS current sinks and reduce flicker noise. The resulting control voltage $V_{CTL}(T)$ also is then substantially equal to the voltage of the inverting node of operational amplifier 645B (which is substantially equal to the voltage level of the non-inverting node of operational amplifier 645B) minus the voltage across the variable resistor 655.

Figure 19:
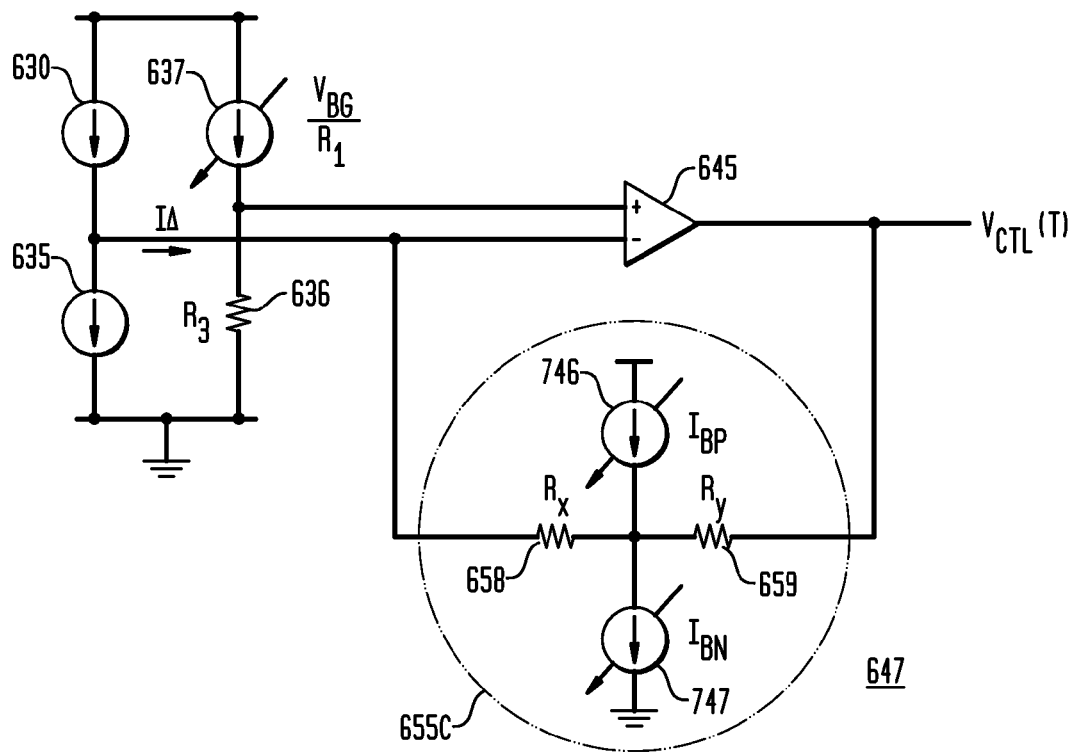
FIG. 19 is a circuit and block diagram illustrating an exemplary seventh control voltage generator embodiment in accordance with the teachings of the present invention.

FIG. 19 is a circuit and block diagram illustrating an exemplary seventh control voltage generator 647 embodiment in accordance with the teachings of the present invention. The seventh control voltage generator 647 functions similarly to the third control voltage generator 642 discussed above, but with an equivalent variable resistance 655C provided using two variable current sources 746 ($I_{BP}$) and 747 ($I_{BN}$) and two (fixed) resistors 658 and 659. The variable current sources 746 ($I_{BP}$) and 747 ($I_{BN}$) may each be comprised of one or more current unit cells 750, discussed below with reference to FIG. 21, with the amount of current provided being digitally controlled through the various control coefficients. The resistors 658 and 659 may be utilized to effectively cancel the temperature dependence (or temperature coefficient) of resistor 636 (utilized in generating the reference voltage input into the non-inverting node of operational amplifier 645). In addition, the variable resistance 655C (comprising two variable current sources 746 ($I_{BP}$) and 747 ($I_{BN}$) and two (fixed) resistors 658 and 659) also can be utilized to provide a constant offset from the voltage at the inverting node of operational amplifier 645 (which substantially equals the voltage at the non-inverting node of operational amplifier 645). When the first and second current sources 630, 635 provide temperature-dependent currents, e.g., when the first current source 630 is CTAT and the second current source 635 is PTAT, the resulting control voltage also is temperature-dependent. The resulting control voltage $V_{CTL}(T)$ is then substantially equal to the voltage of the inverting node of operational amplifier 645 (which is substantially equal to the voltage level of the non-inverting node of operational amplifier 645) plus or minus the voltage across resistors 658 ($R_X$) and 659 ($R_Y$).

Figure 20:
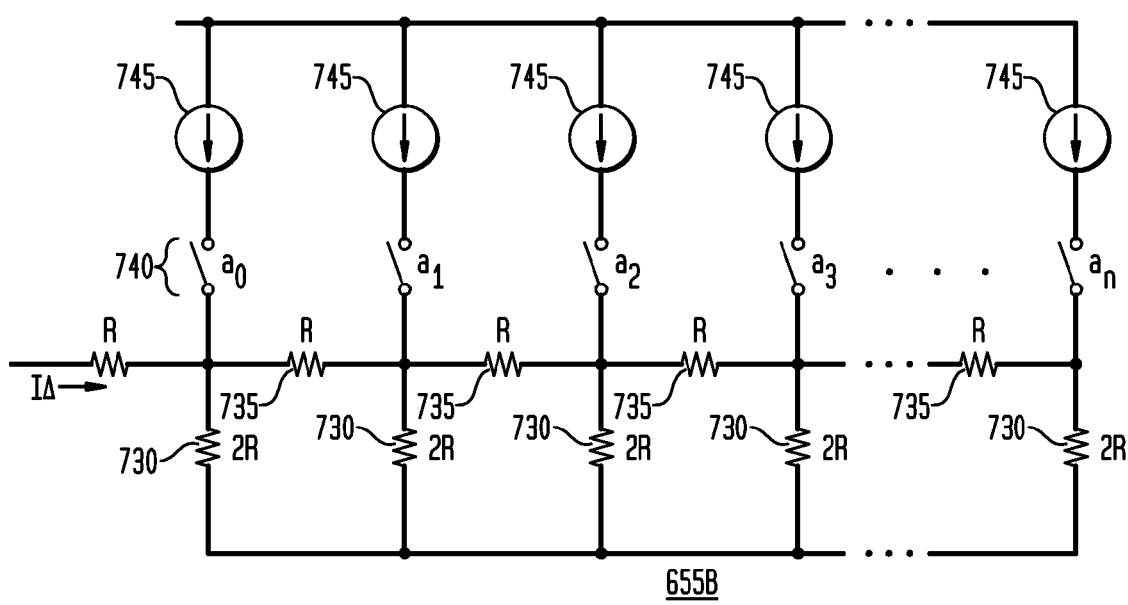
FIG. 20 is a circuit diagram illustrating an exemplary second variable resistor embodiment in accordance with the teachings of the present invention.

FIG. 20 is a circuit diagram illustrating an exemplary second variable resistor 655B embodiment in accordance with the teachings of the present invention. The second variable resistor 655B is implemented utilizing a "R-2R DAC" circuit configuration. Switches 740 are utilized to control the overall resistance value provided by second variable resistor 655B by switching in or out the various resistor modules under the control of control coefficients ($a_0$, $a_1$, through $a_n$), such as using a "temperature" coding of the control coefficients, providing corresponding unit increments of resistance. Resistors 730 generally have twice the resistance value (2R) of resistors 735 (R). In addition, in an exemplary embodiment, current sources 745 are provided by current mirrors, and provide a current of four-times the illustrated $I\Delta$ current. For example, the $I\Delta$ current is typically the difference between the currents provided by first and second current sources 630, 635, such as when the first current source 630 is CTAT and the second current source 635 is PTAT.

Figure 21:
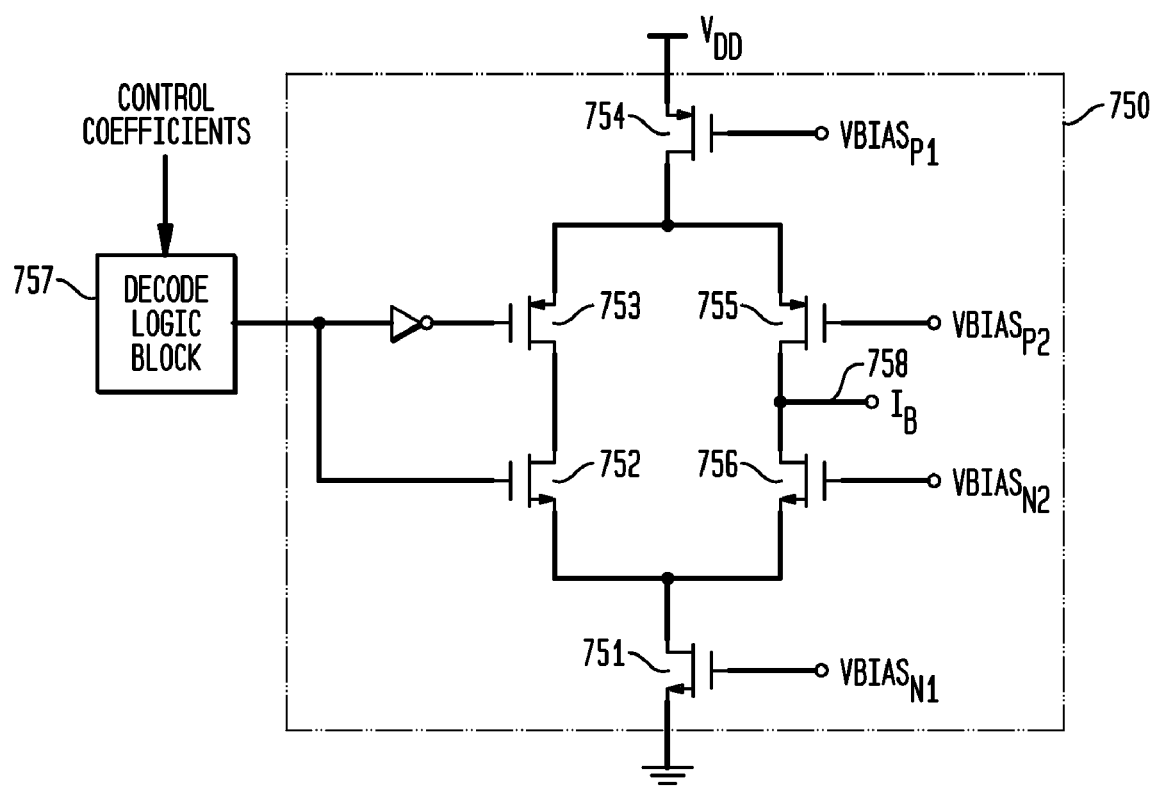
FIG. 21 is a circuit and block diagram illustrating an exemplary current source unit cell embodiment in accordance with the teachings of the present invention.

FIG. 21 is a circuit and block diagram illustrating an exemplary current source unit cell 750 embodiment in accordance with the teachings of the present invention. As mentioned above, an array (not separately illustrated) formed by coupling together the outputs 758 of a plurality of such current source unit cells 750 may be utilized to form a variable current source, with the number of such cells 750 selected using control coefficients (via decoding logic (block 747) and transistors 752, 753), and with transistors 752, 753 switched on or off to control whether current is being provided to the output 758. Each such current source unit cell 750 provides an incremental current of $I_B$, with the resulting overall current provided being a multiple, $nI_B$, where n is the number of such current source unit cell 750 which are selected by the control coefficients to be providing an output current. As illustrated, the current source unit cell 750 is comprised of a plurality of PMOS transistors 753, 754, 755 in a cascode configuration and a plurality of NMOS transistors 751, 752, 756. When transistors 752, 753 are on and conducting, current from the transistors 751, 754 is diverted away from the output 758, and when off and not conducting, current $I_B$ is provided at the output 758, as the difference between the current sourced by the PMOS transistors 754, 755 and the current sunk by the NMOS transistors 751, 756. In other embodiments, such current source unit cell 750 may be implemented to be comprised of just one type of PMOS or NMOS transistors, rather than both. In an exemplary embodiment, 9 control coefficients are utilized with 512 current source unit cells 750, providing 512 current increments for a variable current source, such as variable current sources 746 ($I_{BP}$) and 747 ($I_{BN}$) and the other variable current sources previously discussed.

Figure 26:
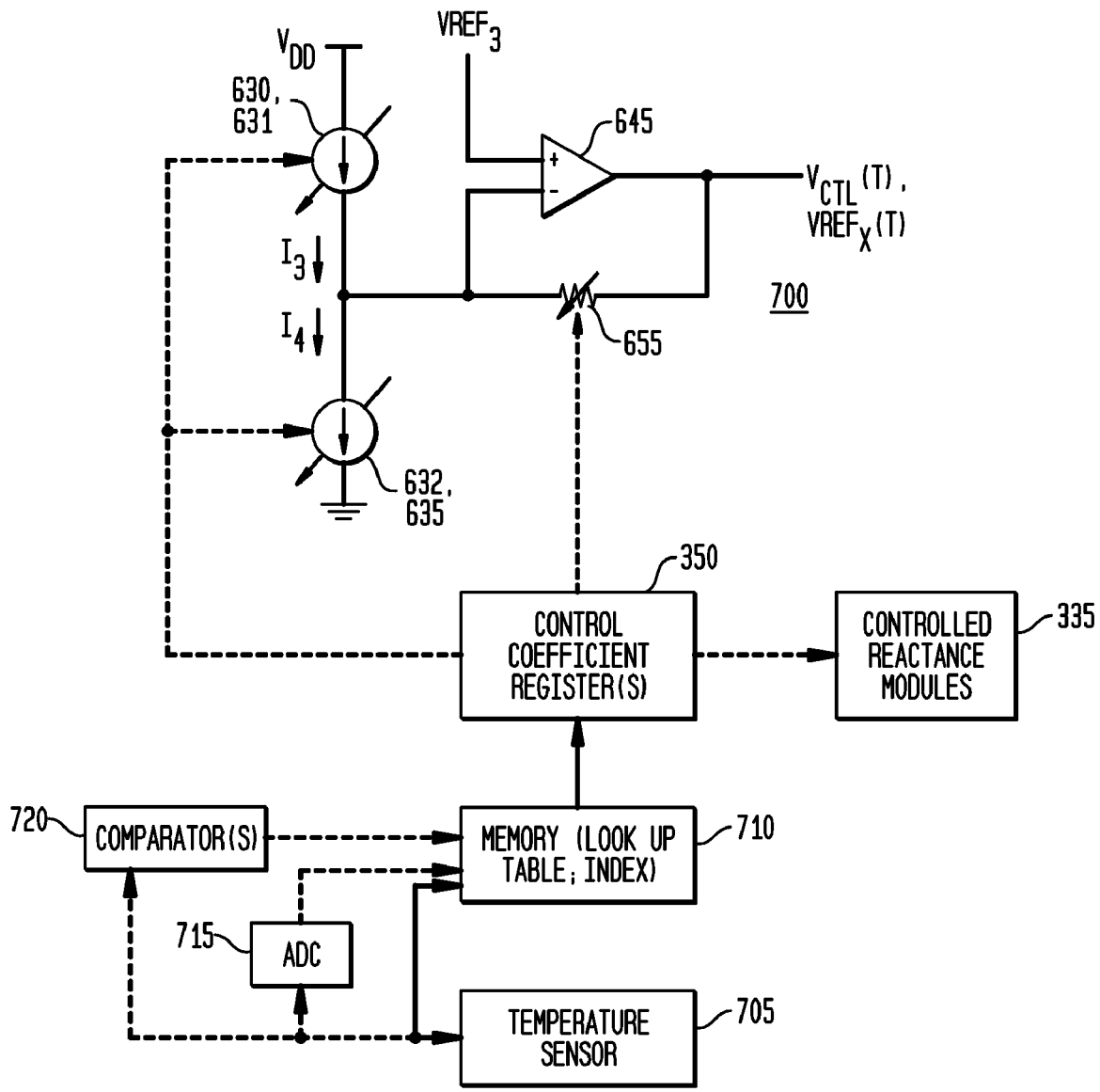
FIG. 26 is a circuit and block diagram illustrating an exemplary eighth control voltage generator embodiment in accordance with the teachings of the present invention.

FIG. 26 is a circuit and block diagram illustrating an exemplary eighth control voltage generator 700 embodiment in accordance with the teachings of the present invention. In this second embodiment, a temperature sensor 705 is utilized, and the first current source (630 or 631) and the second current source (635 or 632) may be either fixed or variable. In a first method of operating the eighth control voltage generator 700, temperature sensor 705 is utilized to determine the actual operating temperature of the reference signal generator 100, 200, 300, 400, 500, 600. Based on the sensed temperature, a memory 710 (as a look up table) is used to select corresponding control coefficients, which then select the amount of resistance of the variable resistance 655, as discussed above. In various embodiments, the sensed temperature may be used to access the memory 710 directly. In other embodiments, the sensed temperature may be converted from an analog to digital value (analog-to-digital converter 715), or may be compared to a plurality of reference levels (in comparator(s) 720), to then provide an output which may access the memory 710 to obtain the corresponding coefficients. The output control voltage is then the third reference voltage (VREF$_3$) level plus or minus the voltage across the variable resistance 655, depending upon the levels of the first and second currents. As the amount of resistance and voltage across the variable resistance 655 are now temperature-dependent, the control voltage is also temperature-dependent, V$_{CTL}$(T). This method may also be utilized to provide additional reference voltages, or to adjust reference voltages with temperature (VREF$_X$(T)).

In a second method of operating the eighth control voltage generator 700, in which the first current source 631 and the second current source 632 are variable, the sensed temperature is also utilized to provide a plurality of control coefficients. In this case, the plurality of control coefficients are utilized to control and vary the first and second currents, to provide a corresponding voltage across the resistance 655 (which may be fixed or variable). The output control voltage is then the third reference voltage (VREF$_3$) level plus or minus the voltage across the resistance 655, depending upon the levels of the first and second currents. As the voltage across the resistance 655 is now temperature-dependent, the control voltage is also temperature-dependent, V$_{CTL}$(T). This second method may also be utilized to provide additional reference voltages, or to adjust reference voltages with temperature (VREF$_X$(T)).

While not a particular method of operating the eighth control voltage generator 700, the sensed temperature may also be utilized to provide a plurality of control coefficients for other purposes. In this case, the plurality of control coefficients are utilized to control and switch the plurality of controlled reactance modules 335, such as to switch fixed capacitances to or from the resonator 320. As a result, the reactance coupled to the LC-tank (320A, 320B, 320C) is varied directly, with resulting affect on the resonant frequency (f$_0$), and may be utilized to maintain the resonant frequency (f$_0$) substantially stable over such temperature variations.

One of the control voltage generators 340, 640, 641, 642, 643, 644, 646, 647, 700 is thereby used to provide open loop, calibrated control of the frequency response of the reference signal generator 100, 200, 300, 400, 500, 600 with respect to a parameter such as temperature. In addition, this control methodology may also be expanded to provide such control with respect to other parameters, as may be necessary or desirable.

FIGS. 27-31 are circuit diagrams illustrating exemplary first, second, third, fourth and fifth types of controlled reactance modules 335 which may be utilized in accordance with the teachings of the present invention. Such controlled reactance modules are described in detail in the related applications.

Figure 27:
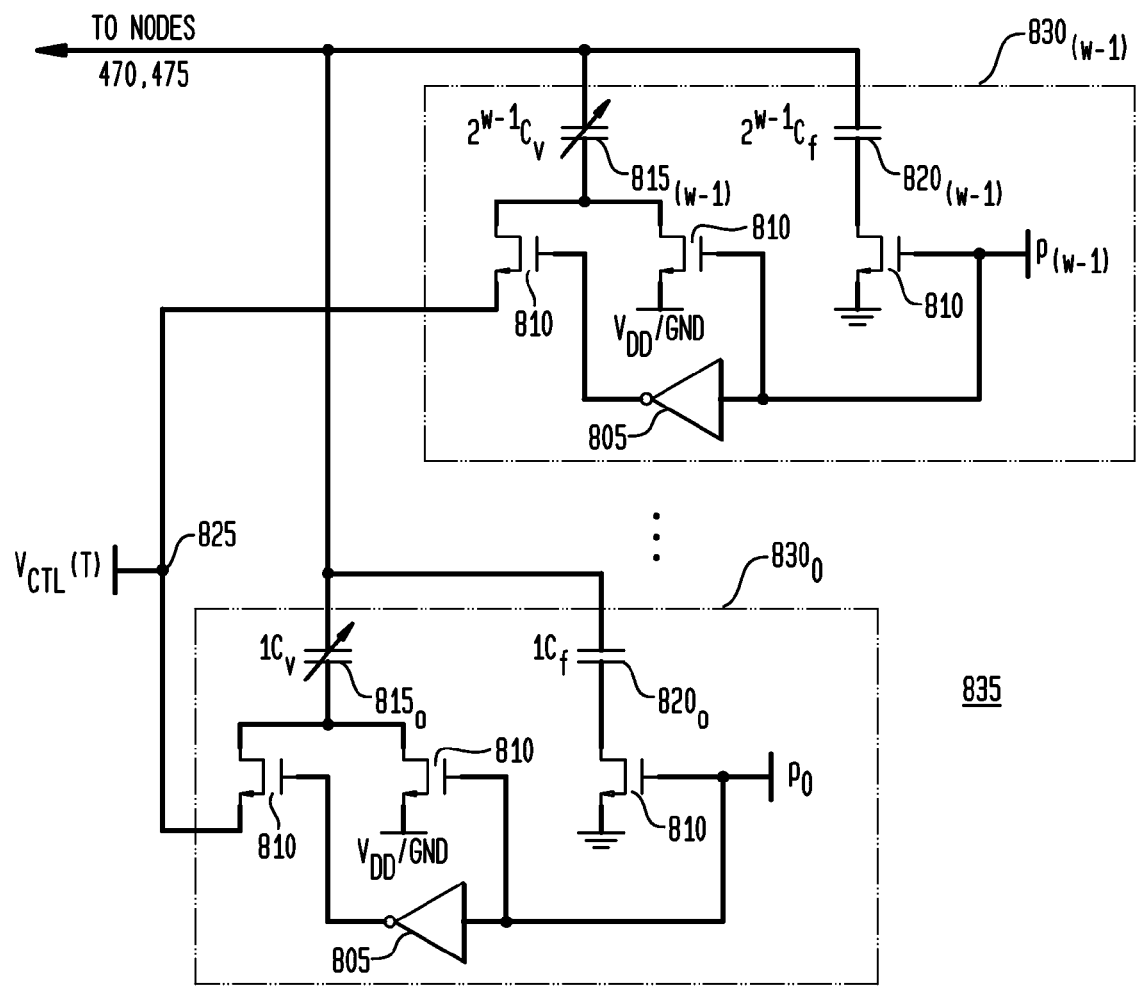
FIG. 27 is a circuit diagram illustrating an exemplary first controlled reactance module utilized in accordance with the teachings of the present invention.

FIG. 27 is a circuit diagram illustrating an exemplary first controlled reactance module 835 in accordance with the teachings of the present invention, with a separate first controlled reactance module 835 coupled to each side of the resonant LC tank 320 (e.g., nodes "A" and "B" or lines 470 and 475) for a balanced configuration. As illustrated, the first controlled reactance module 835 is comprised of a bank or array of a plurality (w) of switchable capacitive modules 830 of binary-weighted fixed capacitors (C$_f$) 820 and binary- or other differentially-weighted variable capacitors (varactors) (C$_v$) 815. Any type of fixed capacitors 820 and variable capacitors (varactors) 815 may be utilized; in selected embodiments, the varactors 815 are AMOS (accumulation-mode MOSFET), IMOS (inversion-mode MOSFET), and/or junction/diode varactors. The fixed capacitors (C$_f$) 820 also may be implemented as varactors coupled to a selected voltage. Each switchable capacitive module 830 has an identical circuit layout, and each differs by a binary weighted capacitance, with switchable capacitive module 830$_0$ having a capacitance of one unit, switchable capacitive module 830$_1$ having a capacitance of two units, and so on, with switchable capacitive module 830$_{(w-1)}$ having a capacitance of $2^{(w-1)}$ units, with each unit representing a particular capacitance magnitude or value (typically in femtofarads (fF) or picofarads (pF)). Binary weighting may be accomplished using capacitors 815, 820 having different capacitances or by having a plurality of unit weighted capacitors, 815, 820, as discussed below. Any differential weighting scheme may be utilized, including linear, binary, or unit cells (discussed below), and may also consist of providing such differential weighting by switching the reactance to a selected control voltage, thereby increasing or decreasing its effective reactance.

Within each switchable module 830, each fixed and variable capacitance is initially equal, with the variable capacitance allowed to vary in response to the control voltage provided at node 825. This control voltage, in turn, varies with temperature or another selected variable parameter, resulting in an overall or total capacitance provided by the controlled capacitance module 835 also varying as a function of temperature (or other parameter) and which, in turn, is utilized to vary the resonant frequency f$_0$. In other selected embodiments, any of a plurality of control voltages may be utilized, including static control voltages, to provide for other types of compensation. Also within each switchable capacitive module 830, either the fixed capacitance C$_f$ or the variable capacitance C$_v$ is switched into the circuit, not both, using switching coefficients p$_0$ though p$_{(w-1)}$. For example, in the selected embodiment, for a given or selected module 830, when its corresponding "p" coefficient is a logic high (or high voltage), the corresponding fixed capacitance C$_f$ is switched into the circuit and the corresponding variable capacitance C$_v$ is switched out of the circuit (and coupled to a power rail voltage V$_{DD}$ or ground (GND), depending whether the device is AMOS or IMOS, respectively, to avoid a floating node and to minimize the capacitance presented to the tank), and when its corresponding "p" coefficient is a logic low (or low voltage), the corresponding fixed capacitance C$_f$ is switched out of the circuit and the corresponding variable capacitance CV is switched into the circuit and coupled to the control voltage provided on node 825.

In an exemplary embodiment, a total of eight switchable capacitive modules 830 (and corresponding first plurality of eight switching coefficients p$_0$ though p$_7$ have been implemented to provide 256 combinations of fixed and variable capacitances. As a result, significant control over oscillation frequency as a function of temperature variations is provided.

It should be noted, in this exemplary embodiment, by switching in or out the fixed capacitance C$_f$ or the variable capacitance C$_v$, the overall amount of capacitance remains comparatively stable, while the ratio of fixed to variable changes and, correspondingly, the amount or degree of temperature-responsiveness of the controllable capacitance module 835. For example, with increasing amounts of variable capacitance C$_v$, the controllable capacitance module 835 provides greater variability of capacitance in response to temperature (or other parameter), thereby adjusting the frequency response of the tank or other oscillator.

Figure 28:
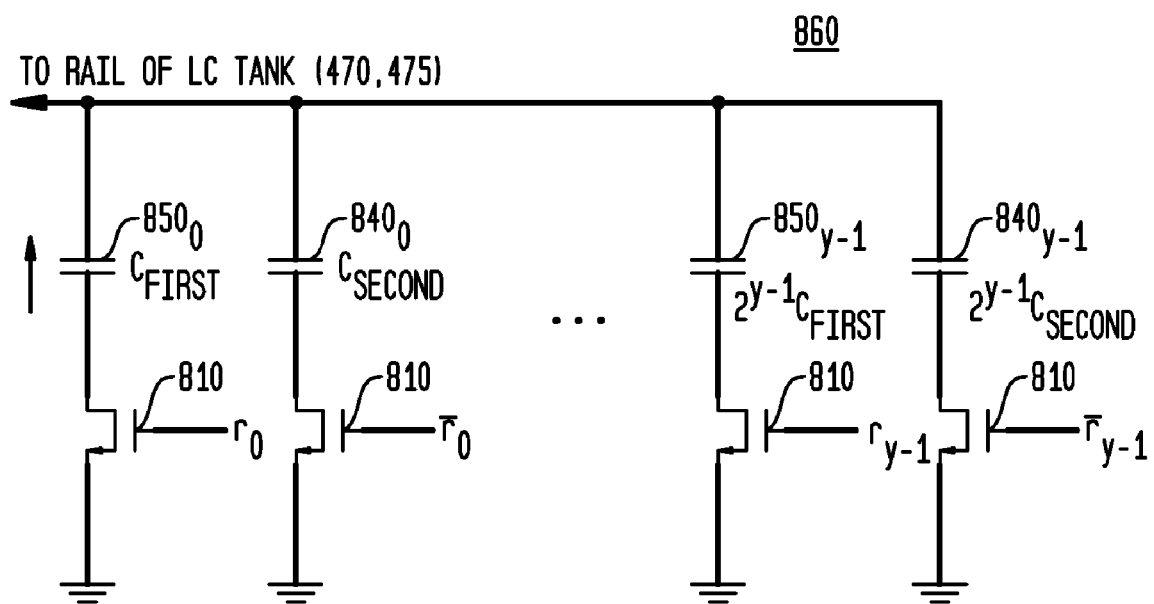
FIG. 28 is a circuit diagram illustrating an exemplary second controlled reactance module utilized in accordance with the teachings of the present invention.

FIG. 28 is a circuit diagram illustrating an exemplary second controlled reactance module 860 in accordance with the teachings of the present invention. The second controlled reactance module 860 may be utilized in resonant frequency ($f_O$) selection, for example, with each module attached to a rail or side of the resonant LC tank 320 (e.g., nodes "A" and "B" or lines 470 and 475) for a balanced configuration. In addition, each second controlled reactance module 860 is controlled by a corresponding plurality ("y") of switching coefficients $r_0$ though $r_{(y-1)}$ stored in coefficient register(s) 350. The second controlled reactance module 860 provides an array of switchable capacitive modules having differentially-weighted (e.g., binary-weighted, or a plurality of unit-weighted capacitors, etc.), first fixed capacitances 850, for adjustment and selection of the resonant frequency $f_O$, by switching in or out a plurality of fixed capacitances 850, through a corresponding plurality of switching transistors 810 (controlled by a corresponding "r" coefficient). Again, as each capacitance branch is switched in or out of the array or circuit 860, the corresponding first fixed capacitance is added or subtracted from the total capacitance available for oscillation in the resonant LC tank, thereby changing the effective reactance and modulating the resonant frequency. The plurality of switching coefficients $r_0$ though $r_{(y-1)}$ is also determined post-fabrication using test ICs, generally as an iterative process. The determined "r" coefficients are then stored in the corresponding coefficient register(s) 350 of the ICs of that production or process batch. Alternatively, each IC may be calibrated separately, for example. In addition to calibration techniques, other methods of determining the plurality of switching coefficients $r_0$ though $r_{(y-1)}$ are discussed in the related applications. Any differential weighting scheme may be utilized, including linear, binary, or unit cells (discussed below).

To avoid additional frequency distortions, several additional features may be implemented with this second controlled reactance module 860. First, to avoid additional frequency distortion, the on resistance of the MOS transistors 810 should be small, and therefore the transistors' width/length ratio is large. Second, large capacitances may be split into two branches, with two corresponding transistors 810 controlled by the same "r" coefficient. Third, to provide for the resonant LC tank to have a similar load under all conditions, when a first fixed capacitance 850 is switched in or out of the circuit 860, a corresponding second fixed capacitance 840, as a "dummy" capacitor (having a significantly smaller capacitance or the smallest size allowed by the design rules for the fabrication process), is correspondingly switched out of or into the circuit, based on the inverse of the corresponding "r" coefficient. As a consequence, approximately or substantially the same on resistance of the transistors 810 is always present, with only the amount of capacitance varied. Other techniques are also disclosed in the related and additional applications.

Figure 29:
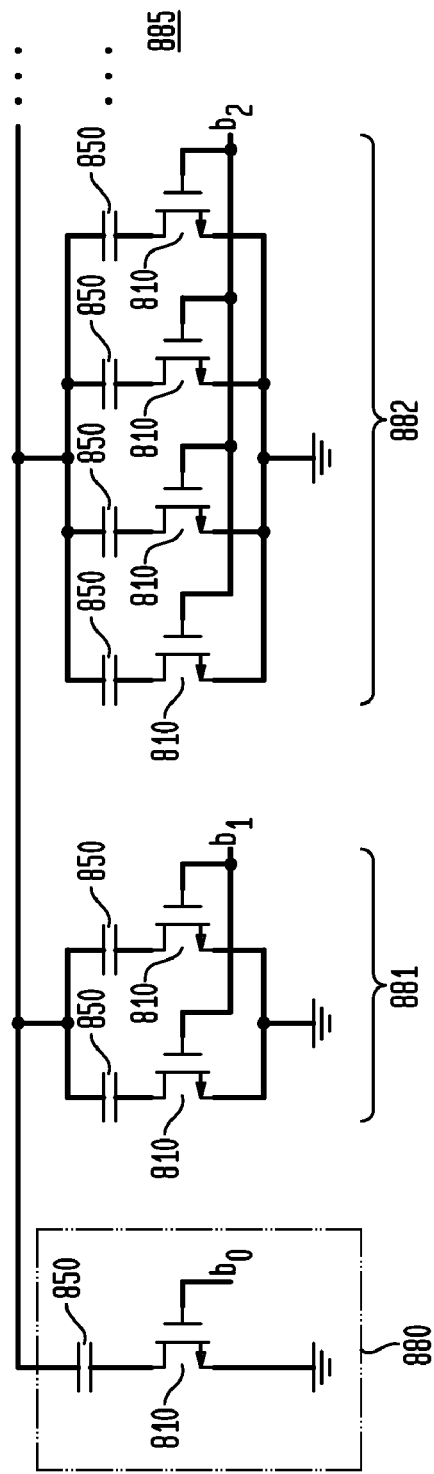
FIG. 29 is a circuit diagram illustrating an exemplary third controlled reactance module utilized in accordance with the teachings of the present invention.

FIG. 29 is a circuit diagram illustrating an exemplary third controlled reactance module 885 utilized in accordance with the teachings of the present invention. The third controlled reactance module 885 is comprised of a plurality of reactance unit cells 880, having a (fixed) capacitor 850 sized to have a single "unit" capacitance (e.g., 15 femtofarads, 1 picofarad) and a transistor 810, functioning to switch the capacitor 850 to or from the resonant LC tank, as previously discussed. The third controlled reactance module 885 may be utilized in resonant frequency ($f_O$) selection, for example, with each module attached to a rail or side of the resonant LC tank 320 (e.g., nodes "A" and "B" or lines 470 and 475) for a balanced configuration. In addition, each third controlled reactance module 885 is controlled by a corresponding plurality of control (switching) coefficients $b_0$, $b_1$, $b_2$, etc., stored in coefficient register(s) 350. Rather than providing binary weighting of the capacitance values of each capacitor 850, binary weighting is providing by switching in additional units of capacitance, under the control of control coefficients $b_0$, $b_1$, $b_2$, and so on, for adjustment and selection of the resonant frequency $f_O$, by switching in or out a plurality of fixed capacitances 850, through a corresponding plurality of switching transistors 810 (controlled by a corresponding "b" coefficient). More specifically, to provide binary weighting, 2 unit cells (881) are switched, or 4 unit cells (882) are switched, etc. Again, as each capacitance branch is switched in or out of the array or circuit 885, the corresponding fixed capacitance is added or subtracted from the total capacitance available for oscillation in the resonant LC tank, thereby changing the effective reactance and modulating the resonant frequency. The plurality of switching coefficients $b_0$, $b_1$, $b_2$, etc. is also determined post-fabrication using test ICs, generally as an iterative process.

Figure 30:
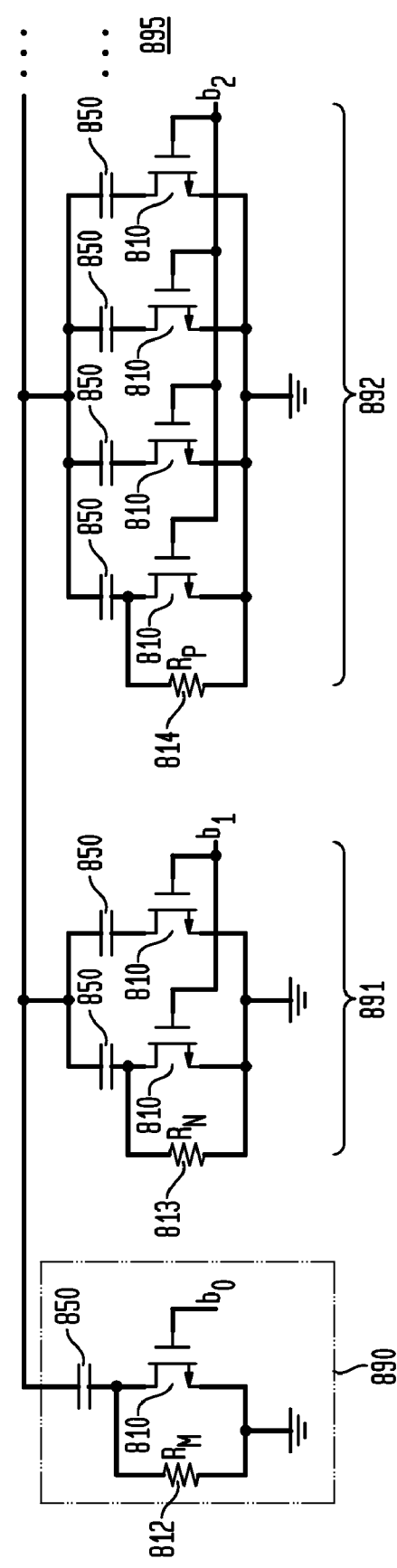
FIG. 30 is a circuit diagram illustrating an exemplary fourth controlled reactance module utilized in accordance with the teachings of the present invention.

FIG. 30 is a circuit diagram illustrating an exemplary fourth controlled reactance module 895 utilized in accordance with the teachings of the present invention. The fourth controlled reactance module 895 differs from the third controlled reactance module 885, insofar as the reactance unit cell 890 also includes a unit resistance provided by resistor 812 ($R_M$) in parallel with the transistor 810, in addition to a unit capacitance. The fourth controlled reactance module 895 also functions substantially similarly to the third controlled reactance module 885, with binary weighting also provided by switching in additional units of capacitance, under the control of control coefficients $b_0$, $b_1$, $b_2$, and so on, for adjustment and selection of the resonant frequency $f_O$, by switching in or out a plurality of fixed capacitances 850, through a corresponding plurality of switching transistors 810 (controlled by a corresponding "b" coefficient), as discussed above. More specifically, to provide binary weighting, 2 unit cells (891) are switched having a single binary weighted resistance 813 (RN having a resistance of $2R_M$) in parallel with the transistor 810, or 4 unit cells (892) are switched (also having a single binary weighted resistance 814 ($R_P$ having a resistance of $4R_M$) in parallel with the transistor 810), etc.

The third controlled reactance module 885 and fourth controlled reactance module 895 may be utilized without the provision of "dummy" capacitances of the second controlled reactance module 860. In alternative embodiments not separately illustrated, the unit cells 880, 890 may also be utilized in conjunction with corresponding "dummy" capacitances within arrays 885, 895. In exemplary embodiments of the third controlled reactance module 885 and fourth controlled reactance module 895, the various transistors 810 and capacitors 850 may be sized to provide a continuous or monotonic "Q" of the resonant LC tank or a substantially constant "Q" of the resonant LC tank, regardless of the number of unit cells 880, 890 which are switched on or off, thereby switching capacitors 850 to or from the LC tank 320. In both the third controlled reactance module 885 and the fourth controlled reactance module 895, the use of unit cell increments in added or subtracted capacitance serves to help provide a continuous or monotonically changing "Q" of the resonant LC tank 320. With regard to the fourth controlled reactance module 895, the use of the various weighted resistances 812, 813, 814, etc. serves to help equalize the "Q" of the LC tank 320, stabilizing the "Q" regardless of whether a transistors 810 are in an off state or an on state.

Figure 31:
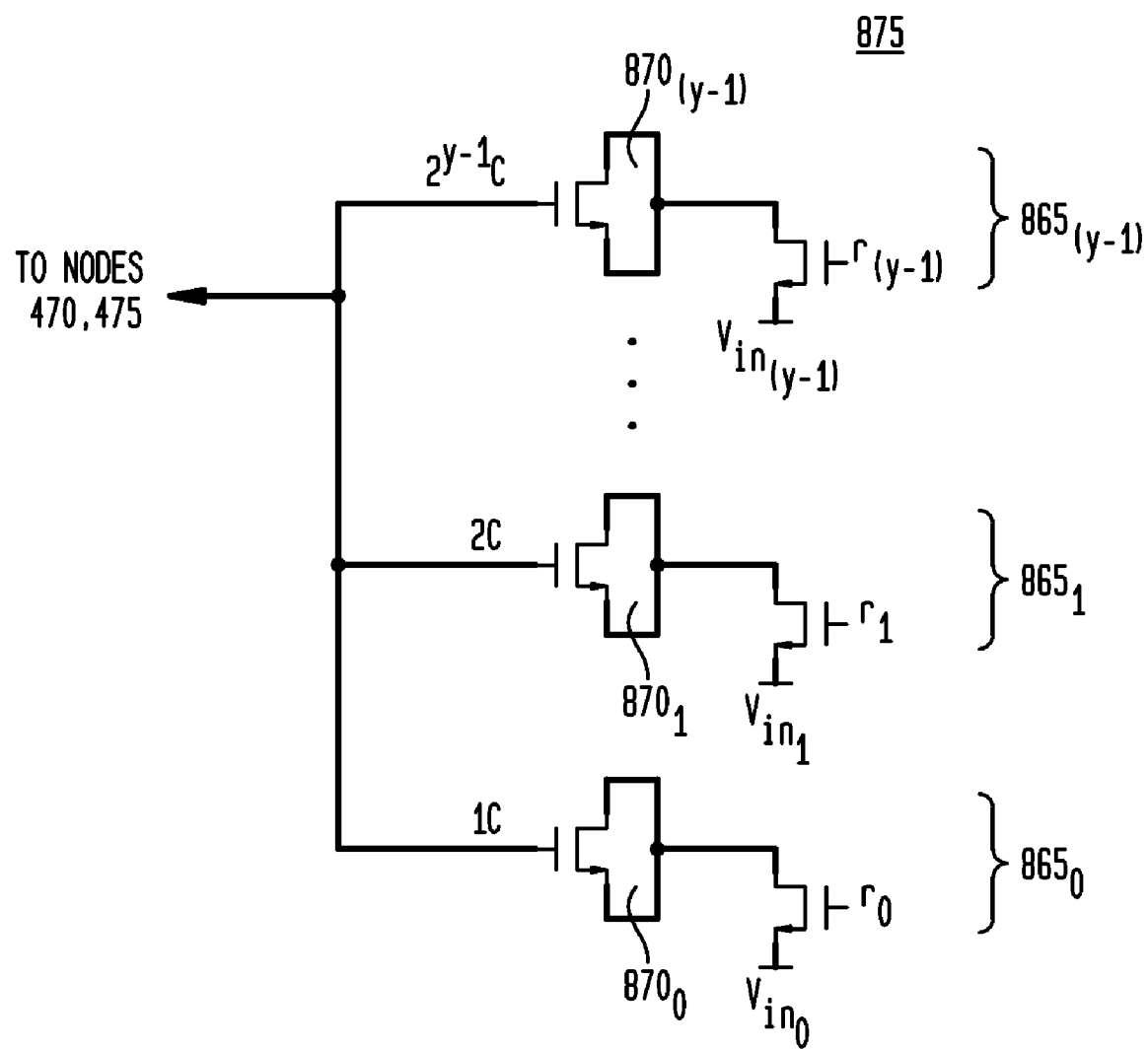
FIG. 31 is a circuit diagram illustrating an exemplary fifth controlled reactance module utilized in accordance with the teachings of the present invention.

FIG. 31 is a circuit diagram illustrating an exemplary fifth controlled reactance module 875 in accordance with the teachings of the present invention. The fifth controlled reactance module 875 may be utilized in resonant frequency ($f_O$)

selection, for example, with each module attached to a rail or side of the resonant LC tank 320 (e.g., nodes "A" and "B" or lines 470 and 475) for a balanced configuration, instead of modules 860. In addition, each fifth controlled reactance module 875 would also be controlled by a plurality of switching coefficients $r_0$ though $r_{(y-1)}$ stored in coefficient register(s) 350. (Because of the different circuitry employed in each exemplary controlled reactance module, however, the corresponding pluralities of switching coefficients $r_0$ though $r_{(y-1)}$ generally would, of course, be different from each other.) In addition, such switching may be controlled through use of any control signals or control coefficients, discussed above. Depending on the voltage the varactors 870 may be coupled to via the illustrated switches (transistors), such as a variable control voltage or a fixed voltage (as Vin) the fifth controlled reactance module 875 may be utilized to provide either a variable or fixed capacitance.

The varactors 870 may be comprised of AMOS or IMOS transistors, or more generally MOS transistors, and configured by shorting the transistor's source and drain. In addition, the varactors 870 may also be binary-weighted with respect to each other, or may use another differential weighting scheme, including the unit scheme discussed above. The fifth controlled reactance module 875 provides an array or bank of a plurality of switchable variable capacitive modules 865, without MOS switches/transistors, and hence the losses or loading through the MOS transistors are eliminated. Instead, the load appears as a low loss capacitance; such low loss also implies that the oscillator start-up power is less. In the fifth controlled reactance module 875, a MOS varactor 870 is switched either to Vin, which may be any of the various pluralities of control voltages discussed above, to provide a corresponding capacitance level to the resonant LC tank 320, or may be switched to ground or the power rail (voltage $V_{DD}$), thereby providing either the minimum capacitance or the maximum capacitance to the resonant LC tank 320 based upon the varactor 870 geometry and type. For AMOS, switched to voltage $V_{DD}$ would provide minimum capacitance and switched to ground would provide maximum capacitance, while the opposite is the case for IMOS. Again, the fifth controlled reactance module 875 is comprised of an array of variable capacitances, as varactors 870, for adjustment and selection of the resonant frequency $f_0$, by coupling or switching a selected varactor 870 to any of a plurality of control voltages (Vin), or to ground or $V_{DD}$, such as switching between a first voltage and a second voltage, through a corresponding "r" coefficient or through application of a corresponding control signal. In another alternative, instead of a plurality or an array, one varactor 870 may be utilized, with its effective reactance provided to the tank controlled by a selected control voltage.

As each capacitance branch is switched to a corresponding control voltage, ground or $V_{DD}$, the corresponding variable capacitance is added to or not included in the total capacitance available for oscillation in the resonant LC tank 320, thereby changing its effective reactance and modulating the resonant frequency. More particularly, for an AMOS implementation, coupling to $V_{DD}$ (as $V_{in}$) provides lesser capacitance and coupling to ground ($V_{in}=0$) provides greater capacitance, with the opposite holding for an IMOS implementation, in which coupling to $V_{DD}$ (as $V_{in}$) provides greater capacitance and coupling to ground ($V_{in}=0$) provides lesser capacitance, where it is assumed that the voltage on the rails of the resonant LC tank 320 (nodes or lines 470 and 475 of FIG. 4) is between zero V and voltage $V_{DD}$, and significantly or substantially far from either voltage level. Coupling to voltages between $V_{DD}$ and ground, such as many of the various control voltages, as Vin, will provide a corresponding, intermediate level of capacitance to the resonant LC tank 320. The plurality of switching coefficients $r_0$ though $r_{(y-1)}$ may also be determined post-fabrication during a calibration process and stored in the corresponding coefficient register(s) 350. In addition, any selected number of modules 865 may be controlled dynamically, to provide continuous frequency control during oscillator operation.

As indicated above, depending upon the type (AMOS or IMOS) of varactor, switching any of the variable capacitive modules 865 to $V_{DD}$ or ground, as first and second voltage levels, results in the corresponding maximum capacitance or no (negligible) capacitance being included as effective capacitance for the resonator (LC tank). As mentioned above, however, other capacitance levels intermediate between such maxima and minima may also be generated, by switching the variable capacitive modules 865 to a corresponding control voltage. For example, using a control voltage having a magnitude which may change in response to temperature results in a corresponding capacitance of the variable capacitive modules 865 being added to (or subtracted from) the resonant LC tank 320, thus changing its effective reactance and modulating the resonant frequency.

FIG. 32 is a block diagram illustrating an exemplary frequency (and mode) selector 205A embodiment and an exemplary second system 900 embodiment in accordance with the teachings of the present invention. As illustrated in a first reference signal having a first frequency ($f_0$) is provided either directly to on line 930 to additional second circuitry 925 (such as a processor, an input/output interface 120, switching or routing circuitry, or any other type of circuit) or to other second circuitry illustrated as inverter 905, square-wave generator 910, dividers 915, locking circuits 920 (e.g., PLLS, DLLS), and combinations or permutations of such dividers, locking circuits, etc. This additional second circuitry is adapted to receive the first reference signal having a first frequency ($f_0$) and to provide one or more corresponding second reference signals at selected frequencies, illustrated as frequencies $f_1$, $f_2$, through $f_N$ and having any selected phase relationship (e.g., inverted, 90 degrees, quadrature, etc.). The system 900 may be combined with additional circuitry, e.g., as part of a larger IC, or may be provided as a single or discrete IC.

The exemplary frequency (and mode) selector 205A provides for generating a plurality of reference signals, whether sinusoidal or square-wave, such as for use as one or more clock signals or frequency references. The oscillator or reference generator (210, 310, 320, 300, 400, 500, 600) provides a first reference signal (having a first frequency ($f_0$), and is coupled to one or more locking circuits 920 (such as phase-locked loops, delay-locked loops, injection locking circuits), to provide a corresponding plurality of output signals at selected frequencies, illustrated as frequencies $f_{K+1}$, $f_{K+2}$, through $f_N$. Each such locking circuit 920 of the plurality of locking circuits has a corresponding divide ratio of a plurality of different divide ratios. In operation, each locking circuit 920 is adapted to phase, delay or otherwise lock to the first reference signal provided by the oscillator or reference generator (210, 310, 320, 300, 400, 500, 600), and to provide an output, second reference signal having an output frequency determined from the first frequency and the corresponding divide ratio. Each locking circuit 920, such as a PLL or DLL, may be implemented as known or becomes known in the electronic arts, as discussed in the related applications.

In an exemplary embodiment, the frequencies of the second reference signals may be fixed, such as fixed at fabrication through wired or configured dividers or divide ratios, or variable, such as selected or programmed post-fabrication through control circuitry (or logic) or stored coefficients (block 935, which may be a register storing coefficients or other circuitry providing control signals), such as to adjust the divide ratios of the locking circuits 920 for corresponding frequency selection, for example. Any stored coefficients (935) may also be part of the various frequency calibration and frequency control coefficients stored in coefficient register(s) 350, as discussed above. As an option, a user input, such as for frequency selection, also may be provided through a user interface (not separately illustrated).

Additional applications and embodiments are discussed in detail in the related applications. The reference signal generator 100, 200, 300, 400, 500, 600 of the present invention may be utilized in any and all of those applications and embodiments of the related applications, including without limitation, discrete IC embodiments, integrated embodiments, embodiments utilizing different LC circuit configurations as mentioned above, and for generation of any type of reference signal, also as discussed above.

FIG. 33 is a circuit and block diagram illustrating a fifth exemplary apparatus 600 embodiment in accordance with the teachings of the present invention, and illustrates some additional features. The reference signal generator 600 includes a non-variable or fixed current source ($I_F$) 975, which is provided to the resonator 320D and sustaining amplifier 305D through a current mirror 970 having a cascode configuration (PMOS tail current source). The current of the fixed current source ($I_F$) 975 is also provided to the variable current source 355A (also a PMOS tail current source), providing a variable current under the control of the amplitude controller (comprising the current source 355A, operational amplifier 360, and amplitude detector 365). Reactance modules are also illustrated: modules 860 provide switchable fixed capacitances, and modules 835, 875 provide switchable variable capacitances, under the control of corresponding pluralities of control coefficients "h" and their inverted form, inverted control coefficients "h-bar". In FIG. 33, for ease of illustration, the illustrated modules 860 and 835, 875 should be understood to each represent an array (i.e., a plurality) of binary-weighted modules, as discussed above. Switches 810 are implemented as ring transistors; switches 811 are implemented as pass or transmission gates. The reference signal generator 600 is operable using a power supply rail at a voltage "$V_{OSC}$" (e.g., 2.5 V) which is lower than a typical power supply voltage $V_{DD}$ (e.g., 3.3 V). The illustrated modules 835, 875 providing switchable variable capacitances may be switched to a control voltage ($V_{CTL}$) to provide variable capacitance in response to temperature, or to the lower supply voltage $V_{OSC}$, to effectively minimize their capacitance and be voltage insensitive.

FIG. 34 a block diagram illustrating an exemplary third system 950 embodiment in accordance with the teachings of the present invention. In addition to the features previously discussed, FIG. 34 also illustrates the operating voltage generating circuit 960, which provides the reduced operating voltage, via band-gap voltage generator 575, operational amplifier 963, capacitor 964, and a programmable/configurable voltage divider 962. A control voltage generator 640A is also illustrated, with an additional capacitor 651, providing a temperature-dependent control voltage. A reference signal generator 100, 200, 300, 400, 500, 600 (as a "CMOS harmonic oscillator" or "CHO") is also coupled to square wave generator and/or divider circuit 910, 915, which generate a single-ended reference signal from a differential signal (D2S block 911) and generate a second reference signal having a frequency which is a rational fraction of the (resonant) frequency of the first reference signal from the reference signal generator 100, 200, 300, 400, 500, 600. The single-ended, lower frequency reference signal is provided to a buffer/driver circuit 955, for output as a reference signal.

Integrated circuits embodying the reference signal generator 600 and system 950 have been empirically tested, with very impressive and favorable results, illustrated in Table I, operating at 24 MHz.

TABLE I

| | Reference Signal Generator 600; System 950 | Crystal Oscillator (XO) | Crystal Oscillator coupled to 1x PLL |
|---|---|---|---|
| Phase Noise, 1 kHz to 1 MHz | −65 dB to −140 dB | −80 dB to −140 dB | −80 dB to −125 dB |
| Rise/Fall times | 1.49 ns | 3.03 ns | 1.36 ns |
| Period Jitter | 6.6 ps | 8.81 ps | 9.92 ps |
| Normalized Frequency Inaccuracy over Temperature | Sufficient for error within 100 ppm | Sufficient for error within 100 ppm | Sufficient for error within 100 ppm |

The reference signal generator 600 and system 950 had phase noise which closely tracked the phase noise of the crystal oscillator and, at high frequencies, had the same phase noise as the crystal oscillator. The reference signal generator 600 and system 950 also provided significantly better performance than the Crystal Oscillator coupled to 1×PLL, which showed significant phase noise above 20-30 kHz. The reference signal generator 600 and system 950 also provided the best period jitter, measured as the standard deviation over 20,020 periods. In addition, over a significant temperature range, the reference signal generator 600 and system 950 provided a frequency accuracy sufficient for error within 100 ppm.

Figure 35:
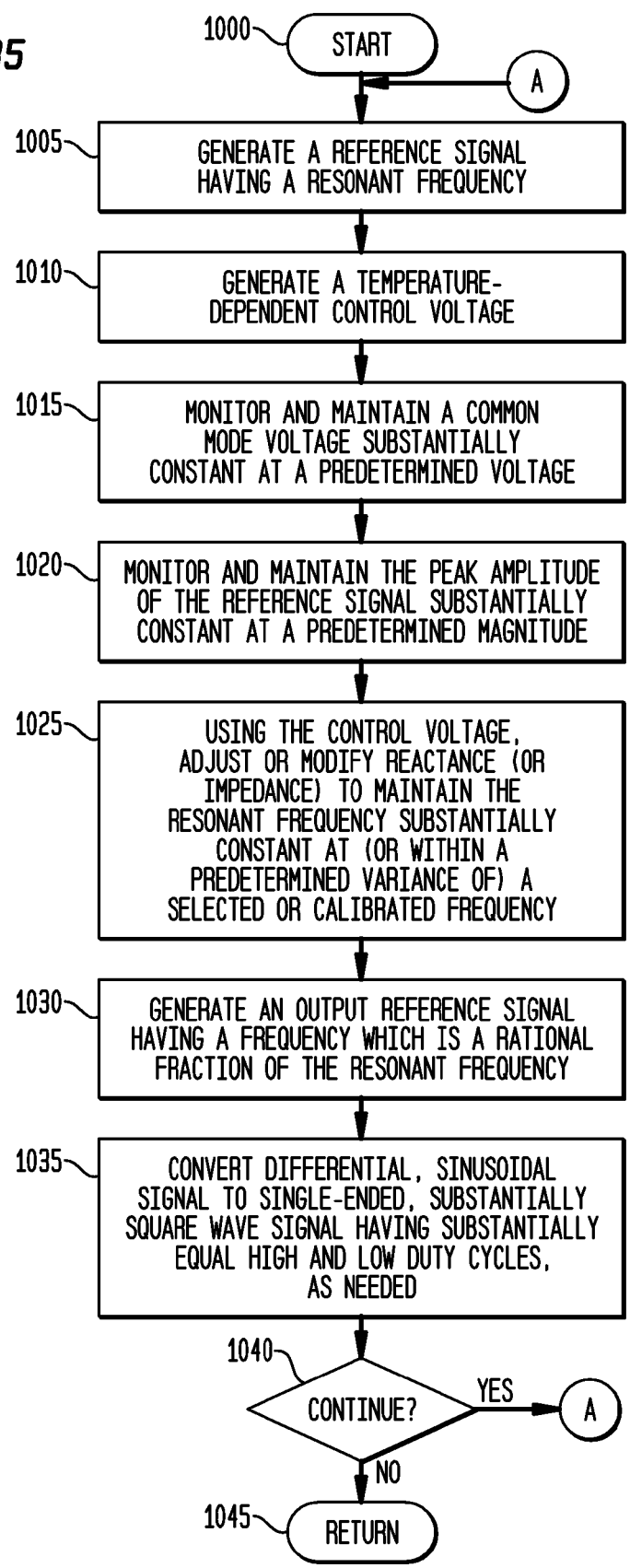
FIG. 35 is a flow diagram illustrating an exemplary method embodiment in accordance with the teachings of the present invention.

FIG. 35 is a flow diagram illustrating an exemplary method embodiment in accordance with the teachings of the present invention, and provides a useful summary. While illustrated in FIG. 35 as successive steps, those of skill in the art will recognize that many of the steps may and most likely will occur concurrently, particularly at steady-state. The method begins, start step 1000, with generating a first reference signal having a resonant frequency, step 1005. A temperature-dependent control voltage is generated, step 1010. A common mode voltage is monitored and maintained substantially constant at (or within a first predetermined variance of) a predetermined voltage, step 1015. A peak amplitude of the first reference signal is monitored, and its magnitude is maintained substantially constant at (or within a second predetermined variance of) a predetermined magnitude, step 1020. Using the temperature-dependent control voltage, selected reactances (or impedances) are adjusted or modified to maintain the resonant frequency substantially constant at (or within a third predetermined variance of) a calibrated, selected, or otherwise predetermined frequency, step 1025. An output (or second) reference signal is generated, having a frequency which is a rational fraction of the resonant frequency, step 1030. As may be necessary or desirable, a differential, sinusoidal signal may be converted to a single-ended, substantially square wave signal having substantially equal high and low duty cycles, step 1035. When the method is to continue, step 1040, the method returns to step 1005, and otherwise the method may end, return step 1045.

Figure 36:
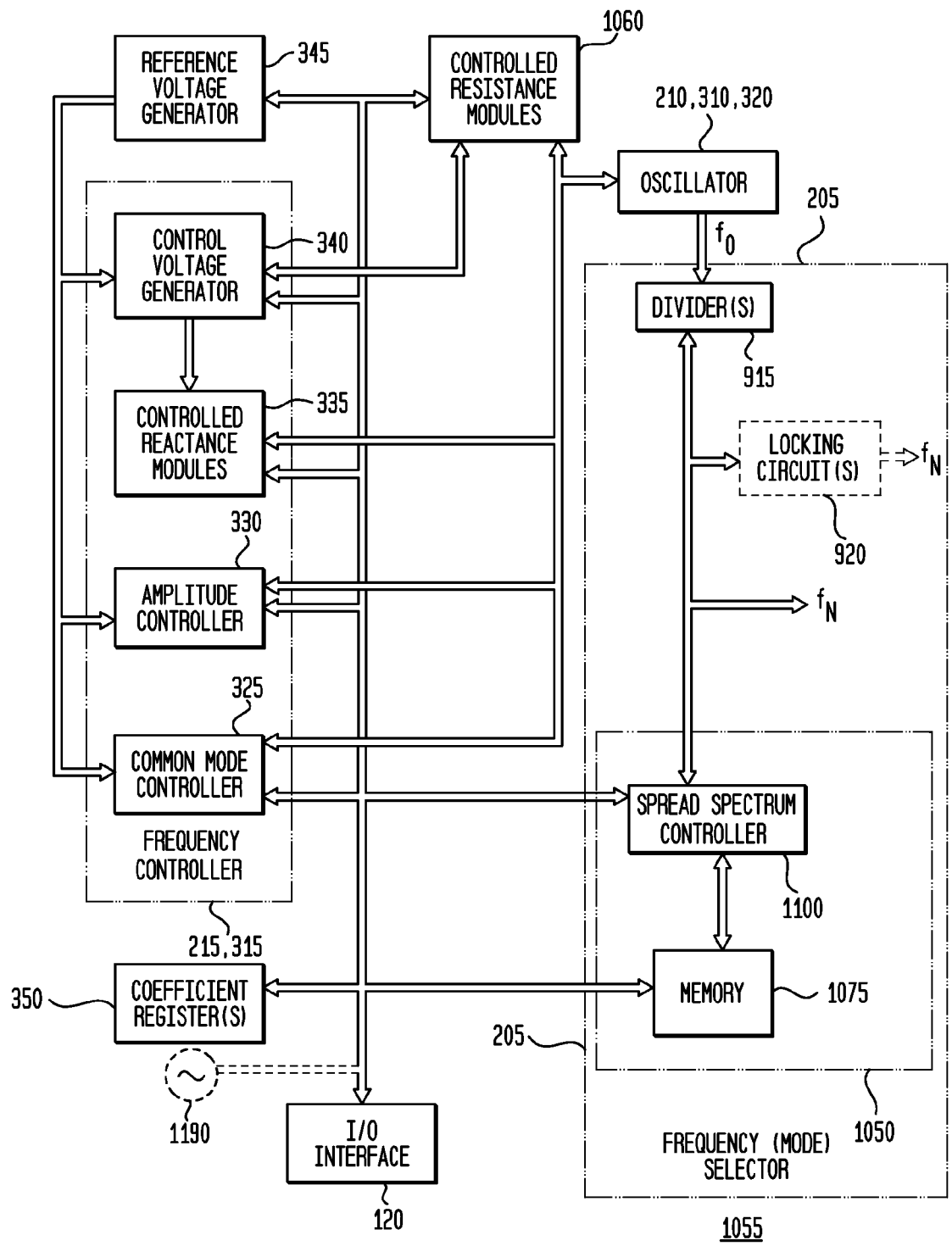
FIG. 36 is a block diagram illustrating an exemplary first spread spectrum clock generator (or timing/frequency reference) system embodiment, exemplary first spread spectrum apparatus embodiment, and a first spread spectrum controller embodiment in accordance with the teachings of the present invention.
Figure 37:
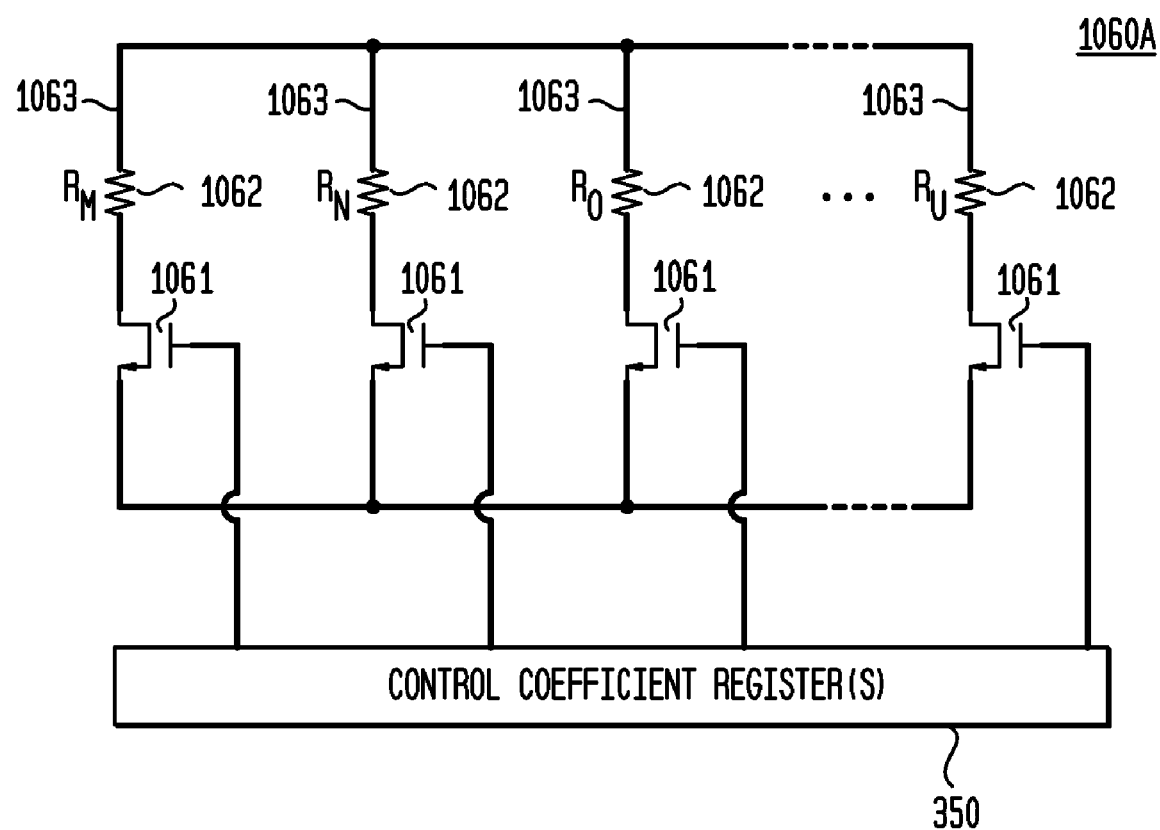
FIG. 37 is a circuit diagram illustrating an exemplary controlled resistance module embodiment in accordance with the teachings of the present invention.

FIG. 36 is a block diagram illustrating an exemplary spread spectrum clock generation system 1055 embodiment, exemplary spread spectrum apparatus 1050 embodiment, and a first spread spectrum controller 1100 embodiment in accordance with the teachings of the present invention. As illustrated, the exemplary spread spectrum clock generation system 1055 comprises a spread spectrum apparatus 1050 and a reference signal generator discussed above, such as reference signal generators 100, 200, 300, 400, 500, 600 (equivalently referred to as clock generators or timing/frequency references), illustrated in FIG. 36 as comprising one or more of a frequency controller 215, 315 (having a common mode controller 325, an amplitude controller 330, controlled reactance modules 335, and control voltage generator 340), an oscillator 210, 310, 320, a reference voltage generator 345, one or more coefficient registers 350, and I/O interface 120. The reference signal generators 100, 200, 300, 400, 500, 600 and/or system 1055 may also include controlled resistance modules 1060, and a second oscillator 1190. An exemplary controlled resistance module 1060 is illustrated in FIG. 37. The spread spectrum apparatus 1050 is illustrated as part of a frequency (mode) selector 205, but also may be equivalently separate and apart from the frequency (mode) selector 205. In addition, the frequency (mode) selector 205 of the system 1055 may also comprise one or more dividers 915 and other circuitry previously discussed, such as locking circuitry 920, switching circuitry (not separately illustrated), etc., for any discrete, integrated, or other embodiment, also as previously discussed. While referred to as a spread spectrum clock generation system 1055, it should be understood that the system 1055 may be utilized for other applications in addition to clocking signal generation, such as other types of timing or frequency reference applications, and may also be considered to be a timing/frequency reference system, equivalently.

As indicated above, while the oscillator 210, 310, 320 is primarily illustrated as an LC resonator, the oscillator 210, 310, 320 includes any type of oscillator or resonator, and all such embodiments are within the scope of the invention.

In exemplary embodiments, the I/O interface 120 provides several functions, in addition to those previously discussed, such as selection of (enable or disable) spread spectrum functionality, selection of the direction(s) of spreading (e.g., center spreading, down spreading, up spreading etc.), selection of the degree, depth or amount of spreading (e.g., center spreading ±1.0%, down spreading −2%, up spreading +1.5%, etc.), selection of the type of spread spectrum profile or pattern (e.g., triangular, sinusoidal, exponential, dual inflection), selection of the spreading (modulation) rate or period (e.g., a spreading rate of 30 kHz, 35 kHz), and so on. To avoid confusion, the spreading (modulation) rate or period refers to the rate of change of the center or main frequency; for example, a 10 MHz center frequency may be spread to provide a corresponding range of frequencies of 9.9 to 10.1 MHz, which are then repeated during every modulation or spreading period (with further examples provided below). Exemplary spread spectrum profiles or patterns (and the spreading periods "τ") illustrated and discussed below with reference to FIGS. 39-42.

The various other components of the spread spectrum clock generation system 1055, such as the common mode controller 325, amplitude controller 330, controlled reactance modules 335, control voltage generator 340, reference voltage generator 345, coefficient registers 350, and oscillator 210, 310, 320 function as previously discussed. For example, the oscillator 210, 310, 320 may be any type of oscillator or resonator, having any configuration (e.g., differential LC oscillator configuration, double-balanced, single-ended, Colpitts, Hartley, Pierce, etc., also as discussed above). Also as discussed above, the control coefficients stored in coefficient registers 350 are utilized, among other things, to calibrate and select the reference frequency ($f_O$) of the oscillator 210, 310, 320, by controlling the reactance or impedance effectively coupled to the oscillator/resonator, such as by switching one or more of the controlled reactance modules 335 to the oscillator 210, 310, 320, or by switching or modifying a control voltage of a controlled reactance module 335.

FIG. 37 is a circuit diagram illustrating an exemplary controlled resistance module 1060A embodiment in accordance with the teachings of the present invention. As indicated above, the resonant frequency of the LC-tank may also be modified by varying the resistance to the tank, in addition to the intrinsic or parasitic resistances $R_L$ 445 and $R_C$ 450 of FIG. 4. The exemplary controlled resistance module 1060A may be utilized as or as part of any of the various frequency control modules and the various frequency controllers in accordance with the teachings of the present invention. Such a controlled resistance module 1060A may be inserted oscillator 320B of FIG. 4, for example, in series with inductor 435 and $R_L$ 445, or in series with capacitor 440 and $R_C$ 450, or both. Those of skill in the art will recognize similar configurations for the other illustrated oscillators. Each switchable resistive module 1063 has a differently weighted (such as a binary-weighted) resistor 1062, and is switchable in or out of the array or module 1060A through corresponding transistors or switches 1061, under the control of control signals and/or control coefficients in control coefficient register 350. As indicated above, such switching also provides another mechanism to control or modulate the resonant frequency of the oscillator, and may be a function of any selected parameter, or may be parameter independent, such as for resonant frequency selection. Those of skill in the art will also recognize that such resistances may be combined with the various reactance modules, to create, more generally, a controlled impedance module, such as illustrated in FIG. 30.

Referring again to FIG. 36, the spread spectrum apparatus 1050 comprises a spread spectrum controller 1100 and a memory 1075. The spread spectrum apparatus 1050 may be utilized with any of the reference signal generators 100, 200, 300, 400, 500, 600 described above or any of the clock generators (timing/frequency references) described in any of the related applications, which are incorporated by reference herein in their entirety. The memory 1075 may also be considered to be part of the control coefficient register(s) 350, or vice-versa.

Depending upon the selected type of oscillator 210, 310, 320, a reference frequency $f_O$ may also be the resonant frequency of the oscillator or resonator. In accordance with exemplary embodiments of the invention, all that is required is that the reference frequency be a function of the amount of reactance or impedance effectively coupled to the oscillator/resonator or otherwise be capable of being varied by controlling the amount of reactance or impedance coupled to the oscillator/resonator, such as by switching a reactance or impedance or by modifying a control voltage.

The spread spectrum controller 1100 of the exemplary embodiments of the present invention may provide spread spectrum functionality in a wide variety of ways, all of which are within the scope of the present invention. In a first method, the spread spectrum controller 1100 modulates or varies the amount of reactance or impedance effectively coupled to the oscillator 210, 310, 320 by switching one or more controlled reactance modules 335 (or controlled resistance (impedance) modules 1060) to or from the oscillator 210, 310, 320. This first method may be performed in the exemplary embodiments in a plurality of ways, such as by the spread spectrum controller 1100 modifying the control coefficients provided to the controlled reactance modules 335 (or controlled resistance (impedance) modules 1060). This embodiment of the first method has been implemented in the system 950 discussed above. Also for example, when a plurality of sets of control coefficients have been predetermined and stored in the memory 1075 or coefficient register 350, this first method may be performed by the spread spectrum controller 1100 selecting new sets of control coefficients from the memory 1075 or coefficient register 350 and then providing the coefficients to the controlled reactance modules 335 (or controlled resistance (impedance) modules 1060).

In a second method, the spread spectrum controller 1100 modulates or varies the amount of reactance or impedance effectively coupled to the oscillator 210, 310, 320 by modulating or otherwise varying a control voltage supplied to one or more controlled reactance modules 335. For the second method, the control voltage may be varied through the control voltage generator 340, or by providing a changing control voltage to the controlled reactance modules 335 directly from a second oscillator 1190 (oscillating at the selected or desired spread spectrum modulation rate). For example, selected controlled reactance modules 335 (which may be separately switched to or from the LC-tank when spread spectrum functionality is enabled) may be coupled to receive a control voltage which is a time-varying output signal from the second oscillator 1190, such as a 30 kHz sinusoidal output having a predetermined or selected amplitude to provide the desired varactor voltage changes. The control voltage generator 340 may also be configured to provide a time-varying control voltage, through, for example, varying the control coefficients utilized to select the resistance value of the variable resistance 655, or by varying the current provided through the various current sources (e.g., 630, 631, 632, 635), such as for control voltage generator 640 illustrated in FIG. 12 or the other control voltage generators illustrated in FIGS. 14-19.

In a third method, the spread spectrum controller 1100 modulates or varies the frequency of oscillation by modulating or varying the amplitude of the oscillation of the oscillator 210, 310, 320, such as by modulating or varying the current provided to the oscillator 210, 310, 320 by variable current source 355 of the amplitude controller 330. As illustrated in FIG. 7, changing the current into the LC-tank has corresponding effects on the resonant frequency of oscillation, with an increase in current generating a decrease in resonant frequency.

In a fourth method, the spread spectrum controller 1100 modulates or varies the amount of reactance or impedance effectively coupled to the oscillator 210, 310, 320 by modulating or otherwise varying the common mode voltage of the oscillator 210, 310, 320. By varying the common mode voltage, with a fixed or varying control voltage, the overall voltage across one or more controlled reactance modules 335 correspondingly varies, resulting in changing the amount of reactance or impedance effectively coupled to the oscillator 210, 310, 320.

For the third and fourth methods, the amplitude controller 330 and/or the common mode controller 325 may be implemented to be configurable, such as through corresponding control coefficients (which also may be varied or predetermined and stored in memory 1075 or coefficient register 350). For the illustrated embodiments, for example, spread spectrum functionality may be implemented by varying the reference voltages provided to the amplitude controller 330 or the common mode controller 325, by varying the current provided by current sources 355, 380, and so on.

In a fifth method, the spread spectrum controller 1100 modulates or varies the output frequency ($f_N$) by modulating or varying the divide ratios of the dividers 915 or locking circuits 920. As illustrated in FIG. 32, the various divide ratios are also configurable using the control coefficients (illustrated in a register 935, to distinguish them from the control coefficients which select or modify the resonant frequency). For this embodiment, the spread spectrum controller 1100 may also modify coefficients or select new sets of coefficients to provide frequency spreading, as discussed above for the first and second methods.

In a sixth method, the spread spectrum controller 1100 modulates a transconductance of the sustaining amplifier 305 by, for example, varying the current through the transistors M1, M2, M3 and M4. For example, referring to FIG. 33, the current may be varied through current source 975, when configured to be a variable current source, and may also be controlled via the spread spectrum controller 1100. As illustrated in FIG. 7, changing the current into the LC-tank has corresponding effects on the resonant frequency of oscillation, with an increase in current generating a decrease in resonant frequency. Other forms of transconductance and current modulation are disclosed in the ninth related application.

These various oscillator (210, 310, 320) circuit parameters described above, which may be varied or modulated to produce a spread spectrum from a center or starting frequency, are referred to herein as "spread spectrum circuit parameters" and include, without limitation, the parameters of reactance, control voltage, oscillation amplitude, common mode voltage, and transconductance (of the sustaining amplifier 305). These spread spectrum circuit parameters are in addition to and included within the other types of spread spectrum parameters described above, such as the spreading direction (e.g., up, down, center), the degree or amount of spreading, the type (or profile) of spreading (e.g., triangular, exponential), and the spreading (modulation) rate or period. The spread spectrum parameters may also include other parameters, such as divide ratios. These parameters may be programmable, configurable or calibrated, through the I/O interface 120, or may be predetermined as part of IC design, and the resulting or selected parameters stored in memory 1075 or coefficient register 350. All of these spread spectrum circuit parameters may be controlled through control coefficients of the present invention; for example, the spread spectrum controller 1100 may be responsive to a predetermined bit in memory 1075 or coefficient register 350 to switch a second oscillator 1190 to controlled reactance modules 335 to alter the corresponding control voltages, or to switch or modulated various reference voltage supplied to the amplitude controller 330 and/or the common mode controller 325 to alter the input current into the oscillator 210, 310, 320. Accordingly, those of skill in the art will recognize that the exemplary methodology of the invention described in detail below, which modifies the control coefficients utilized to switch the controlled reactance modules 335 or to modify the control voltages of the controlled reactance modules 335, may be extended to any of these other enumerated methods of and parameters for providing spread spectrum functionality, and in addition, that any of the various methods may also be combined with each other, with all such variations considered equivalent and within the scope of the present invention. The discussion provided below should be considered, therefore, to be applicable to all such alternative embodiments.

Referring to these various methods, in a first embodiment, the spread spectrum controller, illustrated as first spread spectrum controller 1100, is adapted to select or modify the control coefficients to provide the spread spectrum functionality of the system 1055. By changing the control coefficients during a spreading (modulation) time period, the spread spectrum controller 1100 modifies the amount of reactance or impedance coupled to the oscillator/resonator (such as by switching a reactance or modifying a control voltage as discussed above) or provides the other variations described above (e.g., changing currents, changing divide ratios), and thereby modifies the reference frequency (or resonant frequency) $f_O$ of the oscillator/resonator, resulting in a range (or plurality) of different reference frequencies occurring or being provided at the spreading modulation rate, such as the range of frequencies about or within $f_C \pm x$ (for center spreading), $f_C-x$ (for downspreading), or $f_C+x$ (for upspreading), where $f_C$ is a selected center or starting frequency and x is a spreading factor, such as 1%, 2%, etc. In turn, corresponding output frequencies (such as generated by one or more dividers 915 are also spread by a corresponding factor, e.g., $f_N \pm y$ or $f_N-y$, where $f_N$ is a divided/multiplied frequency and y is a spreading factor corresponding, for example, to a selected divide/multiply ratio and to the original degree of spreading of the reference frequency.

For this embodiment, the spreading is not achieved by using a fixed reference frequency (such as provided by a quartz or ring oscillator) and varying the divide ratio or varying a control voltage provided to a locked VCO of a locking circuit 920, or varying a control voltage provided to controlled reactance modules 335 (e.g., second method described above) using a second oscillator 1190. Rather, in accordance with a first embodiment of the present invention, the reference frequency is itself varied to provide the resulting spread spectrum and range of the output frequencies. While divide ratios or control voltages may also be varied, such as for output frequency selection or for additional spreading, they are not required to be varied, as is the case with prior art systems.

For example, we may assume that the oscillator/resonator has been calibrated to a center reference frequency $f_O$ of 50 MHz, and is to be down spread by 2% at a modulation (spreading) rate of 30 kHz, resulting in a range of reference frequencies between 49 MHz and 50 MHz being generated every 33.3 microseconds (30 kHz spreading rate). We may further suppose a divide ratio of 5, resulting in a range of output frequencies $f_N$ of 9.8 MHz to 10 MHz, also at the modulation rate of 30 kHz. Accordingly, the spread spectrum controller 1100 changes the control coefficients, which thereby changes the amount of reactance or impedance coupled to the oscillator/resonator (through either switching or changing a control voltage), to provide the selected spreading percentage from the selected center reference frequency at the selected spreading (modulation) rate, which in this example is a center reference frequency of 50 MHz down spread by 2% at a spreading (modulation) rate of 30 kHz. In addition, as discussed in greater detail below, different spreading profiles may also be implemented.

Also, because the control coefficients are necessarily changed in discrete increments, rather than a potentially more continuous variation available through changing a control voltage to a VCO for example, the resulting changes in the reference frequency also occur in discrete increments. The number of calibration bits available and corresponding sizes of the various reactances then provide a corresponding resolution for the resulting changes in frequency. For example, in a first embodiment, a change in a set of control coefficients from 01001000 to 01000111 will reduce the amount of reactance coupled to the oscillator by one corresponding increment (e.g., a unit capacitance 880 or unit impedance 890, etc.), with a resulting eventual increase in the reference frequency by a corresponding discrete increment. Also for example, in a second embodiment, a change in a set of control coefficients from 01001000 to 01000111 will change a control voltage which in turn reduces the amount of reactance coupled to the oscillator by a corresponding increment (e.g., through a controlled reactance module 835, 875), also with a resulting eventual increase in the reference frequency by a corresponding discrete increment. Step sizes for changing the coefficients, however, may also occur in larger increments. Also for example, a change in a set of control coefficients from 01001010 to 01000110 will reduce the amount of reactance coupled to the oscillator by four corresponding increments, e.g., by switching $2^2 C_{FIRST}$ 850 or $2^2 C$ 870, or by selecting a different control voltage, with a resulting eventual increase in the reference frequency by the larger corresponding discrete increment. Those of skill in the art will recognize that the resulting change in frequency is not immediate and discontinuous, however, due to at least some degree of settling time of the oscillator/resonator with the change in amount of coupled reactance. The available variations in the step sizes for incrementing and decrementing the control coefficients are utilized advantageously herein to provide the various spreading profiles or patterns for a given time step or time increment, as described in greater detail below. Other embodiments discussed above (e.g., a control voltage provided by second oscillator 1190) will typically provide a continuous frequency spreading, rather than in discrete increments.

The spread spectrum controller 1100 may provide these types of spreading functionality through any of various embodiments. Depending upon the amount of anticipated variance in the reactance amounts due to fabrication variations, for example, various sets of control coefficients may be calibrated (as part of the calibration process discussed above) and stored in memory 1075 or coefficient register 350, such as in the form of a look-up table ("LUT"), with a first plurality or set of control coefficients to provide a selected center reference frequency and additional pluralities or sets of control coefficients to provide the selected amount, type and pattern of spreading. Using a plurality of sets of calibration coefficients stored in memory 1075 or coefficient register 350, the spread spectrum controller 1100 may then provide a first set of control coefficients, followed by providing a second set of control coefficients, a third set of control coefficients, through a $n^{th}$ set of control coefficients, followed by repetitively providing the first through $n^{th}$ sets of control coefficients during each selected spreading modulation period, to achieve the desired spread spectrum of the reference frequency.

In another exemplary embodiment, the controlled reactance modules 335 (or controlled resistance (impedance) modules 1060) are implemented to provide a linear variance or change in frequency with a linear variance or change in control coefficients, such as the modules having a unit reactance or unit capacitance (modules 885, 895). Accordingly, once calibrated to a selected reference frequency, the selected frequency spreading may be provided in any selected pattern through a corresponding change in the control coefficients at the selected spreading modulation rate, such as by incrementing or decrementing the control coefficients by a predetermined amount. In various exemplary embodiments, the resulting control coefficients may be stored in memory 1075 or coefficient register 350 (e.g., as a LUT), or may be calculated or otherwise determined in real-time or near real-time (as described below for a exemplary embodiment of a spread spectrum controller 1100A). For these embodiments, the spread spectrum controller 1100 may then provide a first set of control coefficients, calculated or stored in the memory 1075 or coefficient register 350, followed by providing a second set of control coefficients, a third set of control coefficients, through a $n^{th}$ set of control coefficients, followed by repetitively providing the first through n$^{th}$ sets of control coefficients at the selected spreading modulation rate, also to achieve the desired spread spectrum of the reference frequency.

There are innumerable ways to implement the spread spectrum controller 1100. For example, the spread spectrum controller 1100 may be implemented as a programmable or configurable processor, as a programmable or configurable controller, as a fixed or configurable finite state machine, or as any other type of logic circuitry, any and all of which are within the scope of the present invention. In an exemplary embodiment illustrated as spread spectrum controller 1100A in FIG. 38, the spread spectrum controller 1100 is implemented as a finite state machine 1110, in conjunction with other state and/or logic circuitry such as an adder 1115 and a counter 1105, all utilized in conjunction with the memory 1075A. The complexity of any such spread spectrum controller 1100 will vary with the range of applications and available reference frequencies. For example, when a singular center output frequency, spreading modulation rate and spreading modulation type are specified in advance, e.g., to be 10 MHz ±2% with a triangular spreading pattern, the spread spectrum controller 1100 may be less complex compared to one designed to accommodate a wide range of selectable center output frequencies, selectable spreading patterns and rates of spreading (modulation), e.g., 10-50 MHz with a plurality of spreading modulation rates and spreading modulation profiles (or patterns).

For example, for a triangular spreading profile for a known center frequency and at a known spreading modulation rate, the spread spectrum controller 1100 may be implemented as an up and down counter that always increments and decrements by the same amount. While being limited as far as flexibility to implement different profiles and center frequencies, such an embodiment is highly efficient.

Another significant feature of the present invention, for selected embodiments, is that the spread spectrum reference frequency also can be utilized to provide the clocking signal for all of the circuitry of the system 1055. For this embodiment, because the reference frequency is itself varying and not fixed when frequency spreading is implemented or selected, all of the other circuitry will thereby having a time-varying clock frequency at the selected spreading modulation rate. Accordingly, additional complexities may be introduced into the design or implementation of the spread spectrum controller 1100, depending upon the selected spread spectrum profiles, as the same number of clock cycles may correspond to different increments of time, because of the time-varying clock/reference frequency. In other exemplary embodiments, however, a second clock or reference frequency generator 1190 may be utilized to provide a substantially or reasonably constant clocking frequency (time-invariant input clock/timing) signal to the spread spectrum controller 1100, such as by using a dedicated ring oscillator, for example.

As mentioned above, in an exemplary embodiment of a spread spectrum controller 1100A, the control coefficients are determined in real-time to provide a selected type, profile and amount of frequency spreading from a selected center (or starting) reference frequency. At selected time intervals (which may vary from one to the next due to the changes in the clocking (reference) frequency as described above), the control coefficients will be incremented or decremented by a selected amount, to provide the resulting change in frequency. In other embodiments, such as when clocked by a second oscillator 1190 (providing a substantially constant clock frequency to the spread spectrum controller 1100), depending upon the spreading profile being implemented, the increment or decrement may be a fixed amount (e.g., for the triangular spreading profile of FIG. 39).

Figure 38:
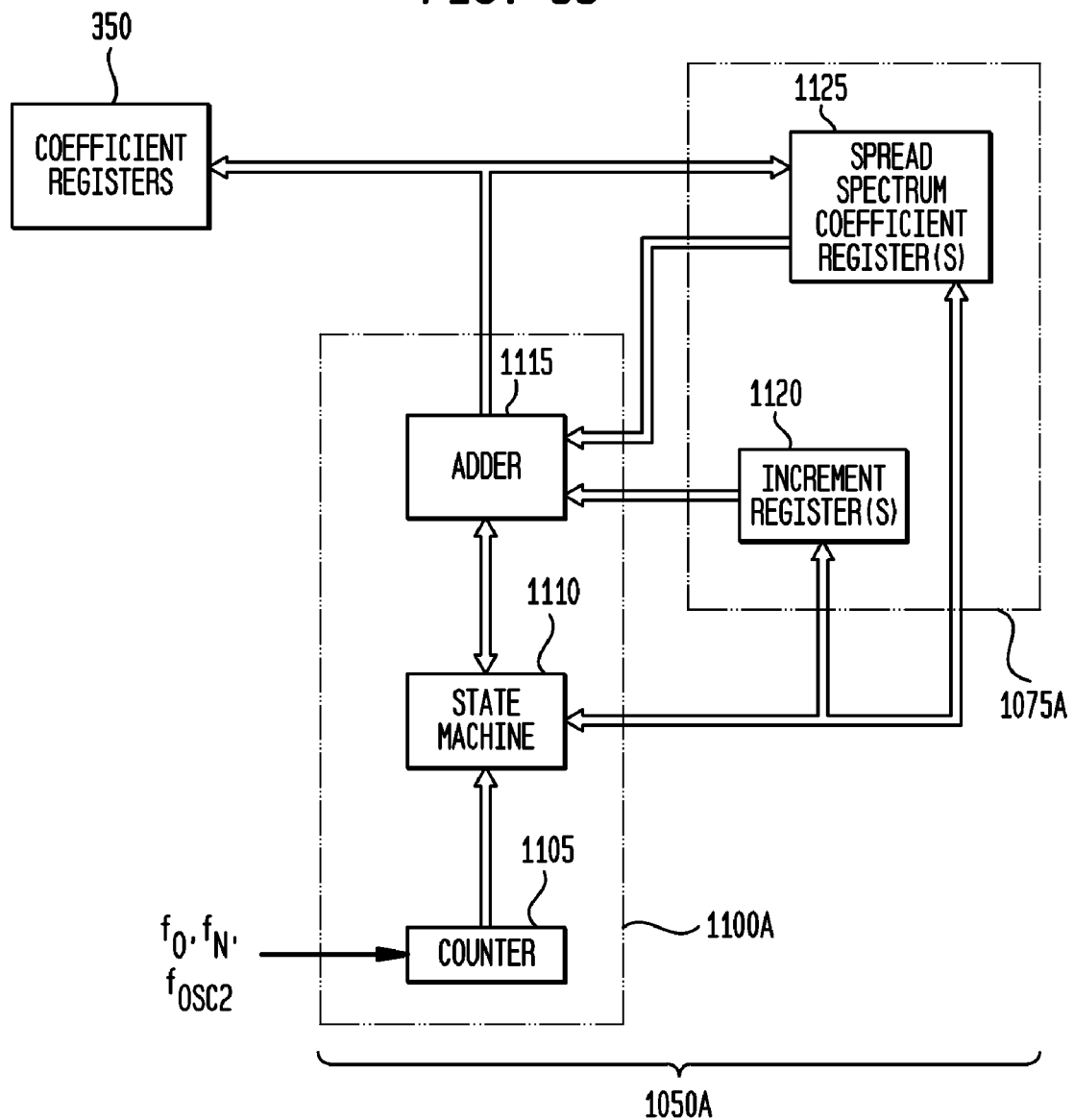
FIG. 38 is a block diagram illustrating an exemplary second spread spectrum apparatus embodiment and an exemplary second spread spectrum controller embodiment in accordance with the teachings of the present invention.

FIG. 38 is a block diagram illustrating an exemplary second spread spectrum controller 1100A embodiment in accordance with the teachings of the present invention. As illustrated, the second spread spectrum controller 1100A comprises a state machine 1110, a counter 1105, and an adder 1115. As indicated above and as illustrated, these components may be clocked using the reference frequency $f_0$, using a divided version $f_N$ of the reference frequency, or using a second oscillator 1190 ($f_{OSC2}$). The memory 1075 is implemented as memory 1075A, having one or more second (spread spectrum) coefficient register(s) 1125, and one or more increment registers 1120. The memory 1075A, with its coefficient registers 1125 and increment registers 1120, may be implemented in a distributed manner, as a plurality of separate memory circuits, and also may also be implemented collectively and may further include coefficient registers 350, e.g., as part of a larger memory circuit, and all such variations are included within the scope of the invention.

As indicated above, the spreading (modulation) period ("τ") may be divided into a plurality of time intervals. At selected intervals, the control coefficients may be modified, either by selecting a new set of control coefficients, or by incrementing or decrementing the current set of control coefficients. The change in control coefficients then provides the corresponding change in frequency of the oscillator (210, 310, 320), through any of the methods discussed above (switching a reactance to or from the LC-tank, modifying a control voltage, modifying the amplitude of the signal of the LC-tank, modifying the common mode voltage of the LC-tank, or changing the divide ratios used in the frequency (mode) selector 205). In accordance with an exemplary embodiment, the time intervals are measured or determined indirectly, by counting a number of clock cycles, either from the reference signal $f_N$ (having a frequency which is a rational multiple/fraction of the resonant frequency $f_0$) from the oscillator (210, 310, 320), or from a reference signal provided by a second oscillator 1190. In the latter case, subject to the accuracy of the second oscillator 1190, a given cycle count will generally correspond to substantially the same amount of time. In the former case, because the frequency of the reference signal $f_N$ is being spread (and is time varying), a given cycle count will correspond to different amounts of time (i.e., a given time interval may have different cycle counts, depending on whether the frequency of the reference signal $f_N$ is higher or lower in the given time interval). Accordingly, to produce a selected spreading pattern while simultaneously accommodating the changing frequency of the reference signal $f_N$ during the modulation period: (1) selected time intervals may have different cycle counts (e.g., a first time interval has a cycle count of 996, a second time interval has a cycle count of 998, a third time interval has a cycle count of 1000, etc.); (2) coefficient increments or decrements vary according to the selected time interval; (3) a fixed cycle count is used to create approximately or roughly equal time increments, and coefficient increments or decrements vary according to the selected time interval; or (4) any other combination of cycle counts or coefficient increment/decrement values may be implemented.

Figure 39:
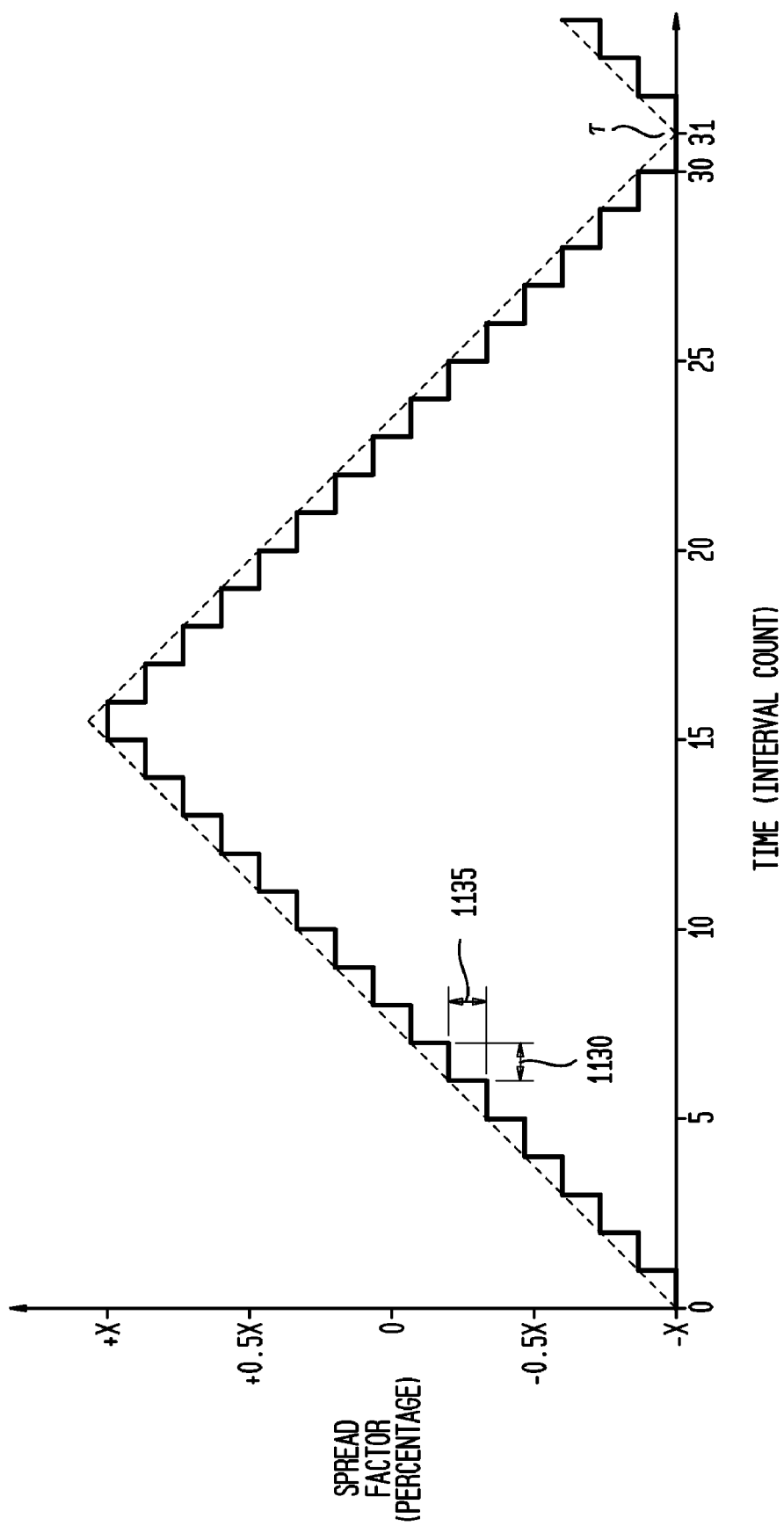
FIG. 39 is a graphical diagram illustrating a triangular spreading profile in accordance with the teachings of the present invention.
Figure 40:
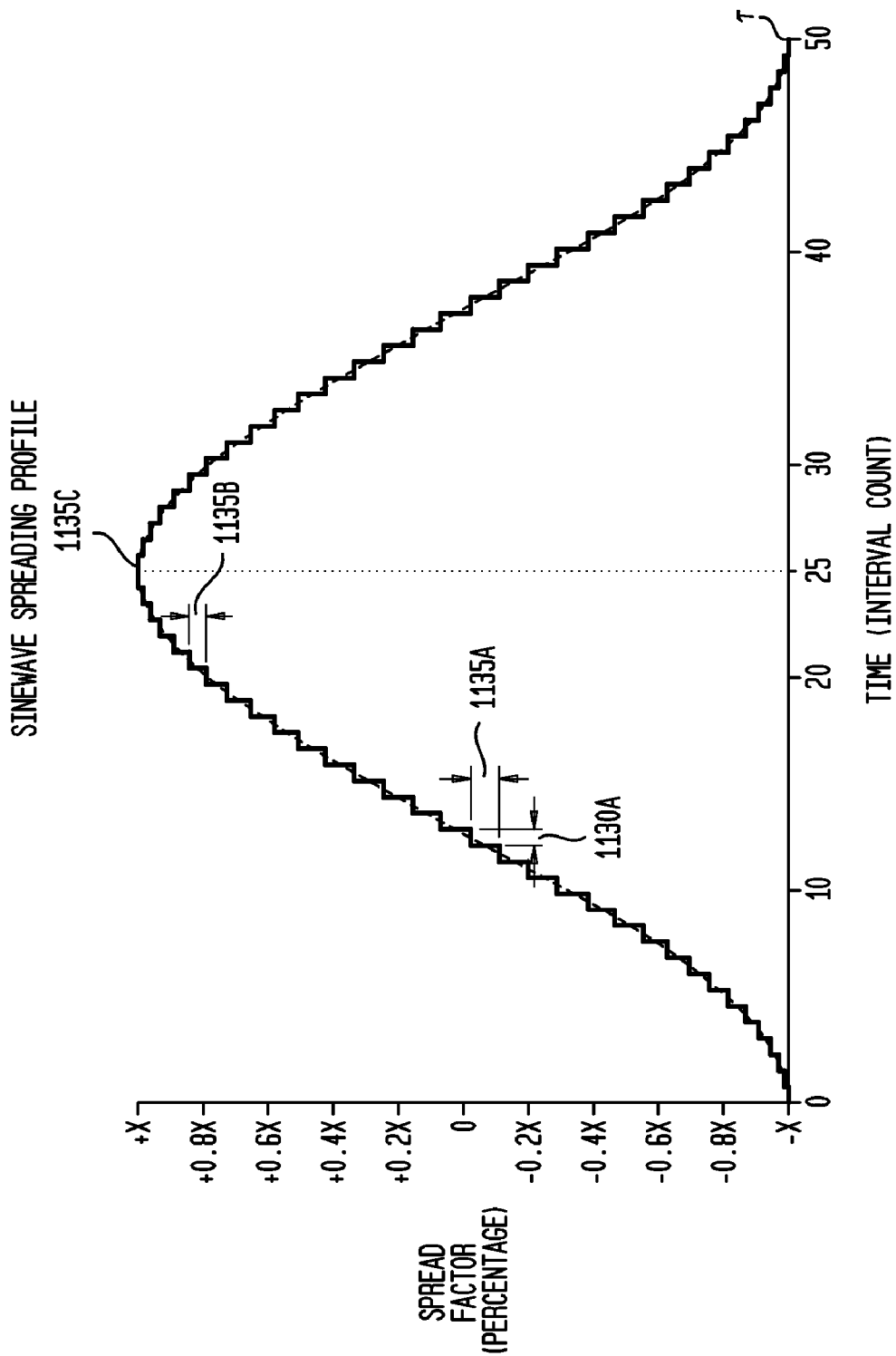
FIG. 40 is a graphical diagram illustrating a sinusoidal spreading profile in accordance with the teachings of the present invention.

In an exemplary embodiment, two types of cycle counts of the reference signal $f_N$ are utilized, a terminal count corresponding to the spreading (modulation) period, and an interval count, corresponding to a selected time interval. The counter 1105 is utilized by the state machine 1110 to provide both: (1) the terminal count corresponding to the selected modulation period (rate) for a selected center reference frequency, such that the series of sets of control coefficients is repeated upon reaching a terminal count corresponding to the selected modulation rate; and (2) a series of time interval counts (also referred to as interval counts or time steps, and generally corresponding to a time interval), with each selected interval count utilized for changing or maintaining the then current reference frequency (via changing or maintaining the values of the control coefficients). As illustrated in FIG. 38, the counter 1105 counts the cycles of the divided reference frequency $f_N$, which is monitored by the state machine 1110, providing a measure of time as a corresponding interval count. Various time increments 1130, 1130A, as corresponding interval counts, are illustrated in FIGS. 39-40.

Upon reaching a selected first time interval count, the state machine 1110 will then determine whether, and how much, the control coefficients are to be incremented or decremented for a selected spread spectrum profile. That increment or decrement (from and maintained in increment register(s) 1120) is then added by adder 1115 to the current control coefficients (from and maintained in spread spectrum coefficient register(s) 1125), and provided to the control coefficient registers 350, as illustrated. Changes (increments or decrements) in the control coefficients then provide corresponding changes in the reference frequency, illustrated as corresponding frequency increments 1135, 1135A in FIGS. 39-40. This process of incrementing or decrementing the control coefficients is repeated upon reaching a selected second time interval count, a selected third time interval count, a selected fourth time interval count, through a selected $n^{th}$ (or terminal) time interval count, to complete one spread spectrum (modulation) period (e.g., 0.0333 msec period corresponding to a 30 kHz spreading modulation rate). Upon completion of a spread spectrum modulation period, the counter 1105 is reset to zero, and the process of time interval counting and incrementing/decrementing the control coefficients at each selected time interval count (of the plurality of selected time interval counts) continues, providing the selected spread spectrum profile at the selected spreading modulation rate.

In another equivalent variation, the counter 1105 is utilized to count to a single (or terminal) time interval count, at which point state machine 1110 provides for incrementing, decrementing, or maintaining the control coefficients. The number of occurrences of reaching such a terminal time interval count is tracked by the state machine 1110, such as through incrementing a corresponding time step number, with a corresponding increment or decrement selected to provide the selected spreading profile at the selected modulation rate.

Accordingly, at selected time interval counts, the state machine 1110 increments, maintains, or decrements the plurality of control coefficients which, in turn, correspondingly modifies or maintains the resonant or divided frequency provided by the oscillator (210, 310, 320), such as by changing or maintaining the amount of reactance or impedance effectively coupled to the oscillator/resonator, by switching a reactance or by switching/changing a control voltage, for example. Selected spread spectrum profiles are then defined, in accordance with the present invention, by a plurality of time interval counts and a corresponding plurality of increments and/or decrements for modifying the control coefficients, with no frequency modification corresponding to an increment/decrement of zero. The plurality of time interval counts generally correspond to time increments, which may be substantially equal increments or varying increments, depending upon the reference signal utilized for counting. The corresponding time increments may or may not be uniform, depending upon whether a second oscillator 1190 or the spread spectrum reference frequency (or divided spread spectrum reference frequency $f_N$) is utilized for counting by the counter 1105. The actual counts utilized with the plurality of time interval counts will vary according to both the center reference frequency, the desired spread spectrum resolution (i.e., amount of change in frequency for a given increment of time represented by a time interval count), and the spread spectrum modulation rate. The plurality of increments and/or decrements of the control coefficients then correspond to reference frequency increments and/or decrements. Such exemplary spread spectrum profiles are illustrated in FIGS. 39-42.

FIG. 39 is a graphical diagram illustrating a triangular spreading profile in accordance with the teachings of the present invention. The x-axis illustrates time (as corresponding time interval counts 1130, 1130A), and the y-axis illustrates corresponding changes in frequency, as a fraction or percentage of the spreading factor "x". As illustrated for the triangular profile of FIG. 39, the magnitude of the frequency increments/decrements 1135 are substantially uniform for all corresponding time interval counts 1130. As indicated above, depending upon the reference utilized in the time interval counting, the actual time intervals may or may not be uniform for equal time interval counts. As the control coefficients are changed incrementally, the spread spectrum profile is also substantially incremental, exhibiting a "staircase" pattern as illustrated, with smaller frequency increments and higher resolution provided by the number of control coefficients and corresponding available increments of the reactances/impedances and/or control voltages provided in or to the controlled reactance modules 335, or other available variations for amplitude, common mode voltage, or frequency division. The pattern of incrementing/decrementing the control coefficients for each of the plurality of time interval counts (illustrated as time interval counts one through thirty-one for the spread spectrum period) is repeated at the selected spread spectrum modulation rate.

FIG. 40 is a graphical diagram illustrating a sinusoidal spreading profile in accordance with the teachings of the present invention. As illustrated for the sinusoidal profile of FIG. 40, the magnitude of the frequency increments/decrements 1135A, 1135B, and 1135C (and corresponding increments/decrements in control coefficients) are not substantially uniform for all corresponding time increments 1130A, with the magnitude of frequency increment 1135A being greater than the magnitude of frequency increment 1135B, and with the magnitude of frequency increment 1135C being zero (thereby maintaining a selected reference frequency for those corresponding time increments). In addition, the sinusoidal spreading profile may also be implemented with non-uniform time increments 1130A, if desired.

Figure 41:
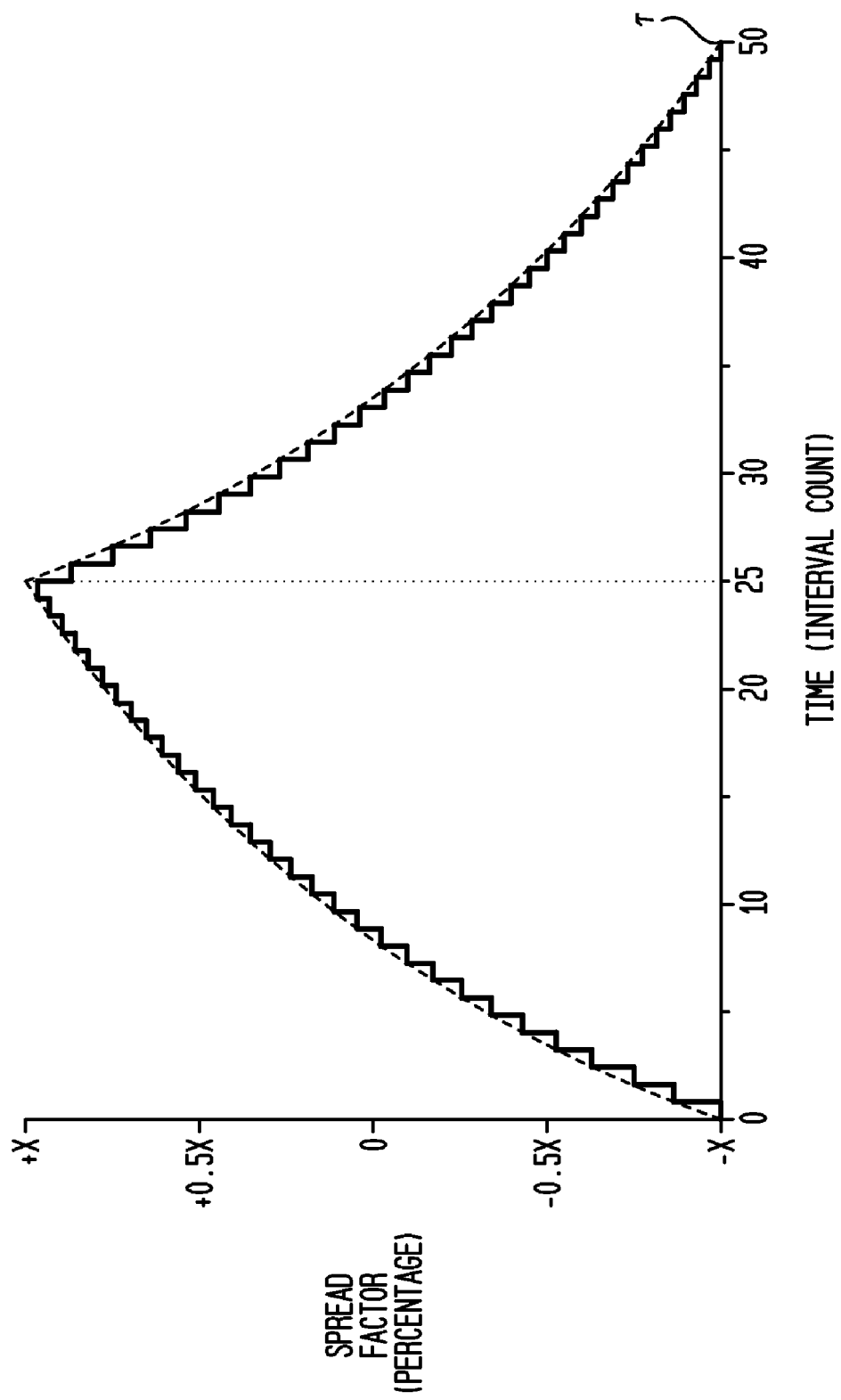
FIG. 41 is a graphical diagram illustrating an exponential spreading profile in accordance with the teachings of the present invention.
Figure 42:
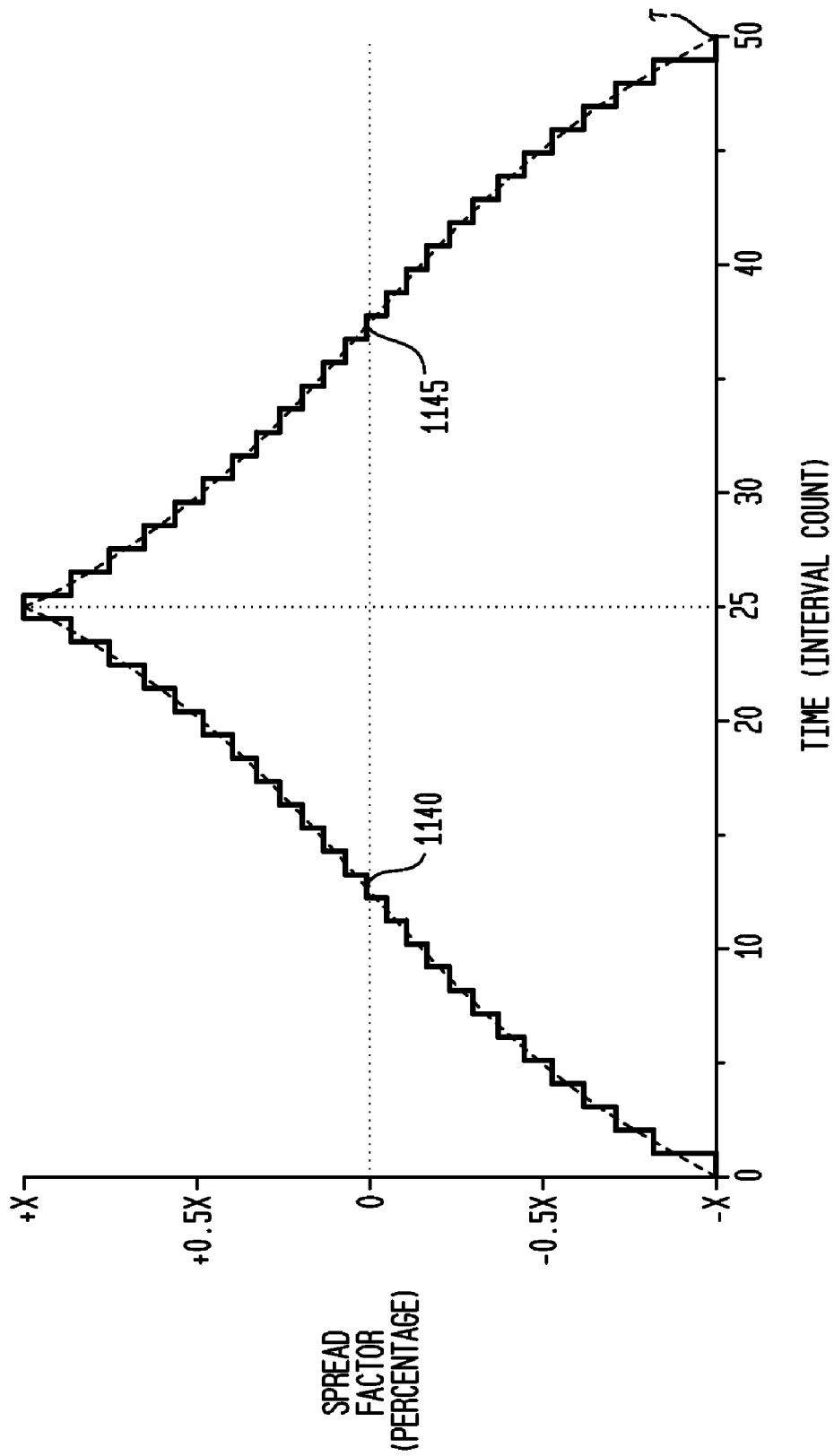
FIG. 42 is a graphical diagram illustrating a dual-inflection spreading profile in accordance with the teachings of the present invention.

FIG. 41 is a graphical diagram illustrating an exponential spreading profile in accordance with the teachings of the present invention, also having non-uniform frequency increments and decrements. FIG. 42 is a graphical diagram illustrating a dual-inflection spreading profile in accordance with the teachings of the present invention, also having non-uniform frequency increments and decrements, with inflection points 1140 and 1145. (The dual-inflection spreading profile and its corresponding mathematical formulas are described in greater detail in U.S. Pat. No. 6,404,834 and U.S. Pat. No. 5,872,807, which by this reference are incorporated herein in their entirety.) In addition, the exponential and dual-inflection spreading profiles may also be implemented with non-uniform time increments 1130, if desired.

It should also be noted that any of these spreading profiles may be implemented piece-wise, such as a first spreading period implementing a triangular profile, followed by a second spreading period implementing a sinusoidal profile, etc. In addition, different profiles may be implemented within the same spreading period, such as a first portion of the a first spreading period implementing a triangular profile, followed by a second portion of the first spreading period implementing an exponential profile, etc. In addition, the various profiles illustrated in FIGS. 39-42 are for purposes of example, and should not be regarded as limiting the scope of the present invention.

Referring again to FIG. 38, the increments and decrements for the control coefficients, for a corresponding time interval count, are stored in the increment register(s) 1120. The current set (or plurality) of control coefficients (and possibly also the control coefficients corresponding to the calibrated center reference frequency), are stored in spread spectrum coefficient register(s) 1125. For each first, second, third, etc. selected time interval count, the state machine 1110 provides (or equivalently signals the increment register(s) 1120 to provide) the corresponding increment/decrement to the adder 1110, which adds it to the current set of control coefficients, to create the next set of control coefficients for the selected spread spectrum profile, and provides the next set of control coefficients to the control coefficient registers 350, for use in modifying or maintaining the resonant or divided frequency as described above, and for storage in the spread spectrum coefficient register(s) 1125 for use in the next spreading iteration. Increments/decrements are selected based on the selected center reference frequency and the selected spread spectrum amount (or range of spreading), type, and profile.

Alternatively, corresponding sets of coefficients may be predetermined (e.g., by being calibrated or by providing a linear response as discussed above), stored in spread spectrum coefficient register(s) 1125, and provided by the state machine 1110 to the control coefficient registers 350 at selected time interval counts. For this embodiment, an adder 1115 and increment register 1120, and their corresponding functions, are not utilized.

When spread spectrum functionality may be disabled, in the exemplary embodiment, the state machine 1110 may complete the current spreading modulation period and return the oscillator/resonator to the center or starting reference frequency, or may simply provide the control coefficients corresponding to the calibrated center or starting reference frequency to the coefficient registers 350 for an immediate return to the center (starting or original) reference frequency.

Figure 43:
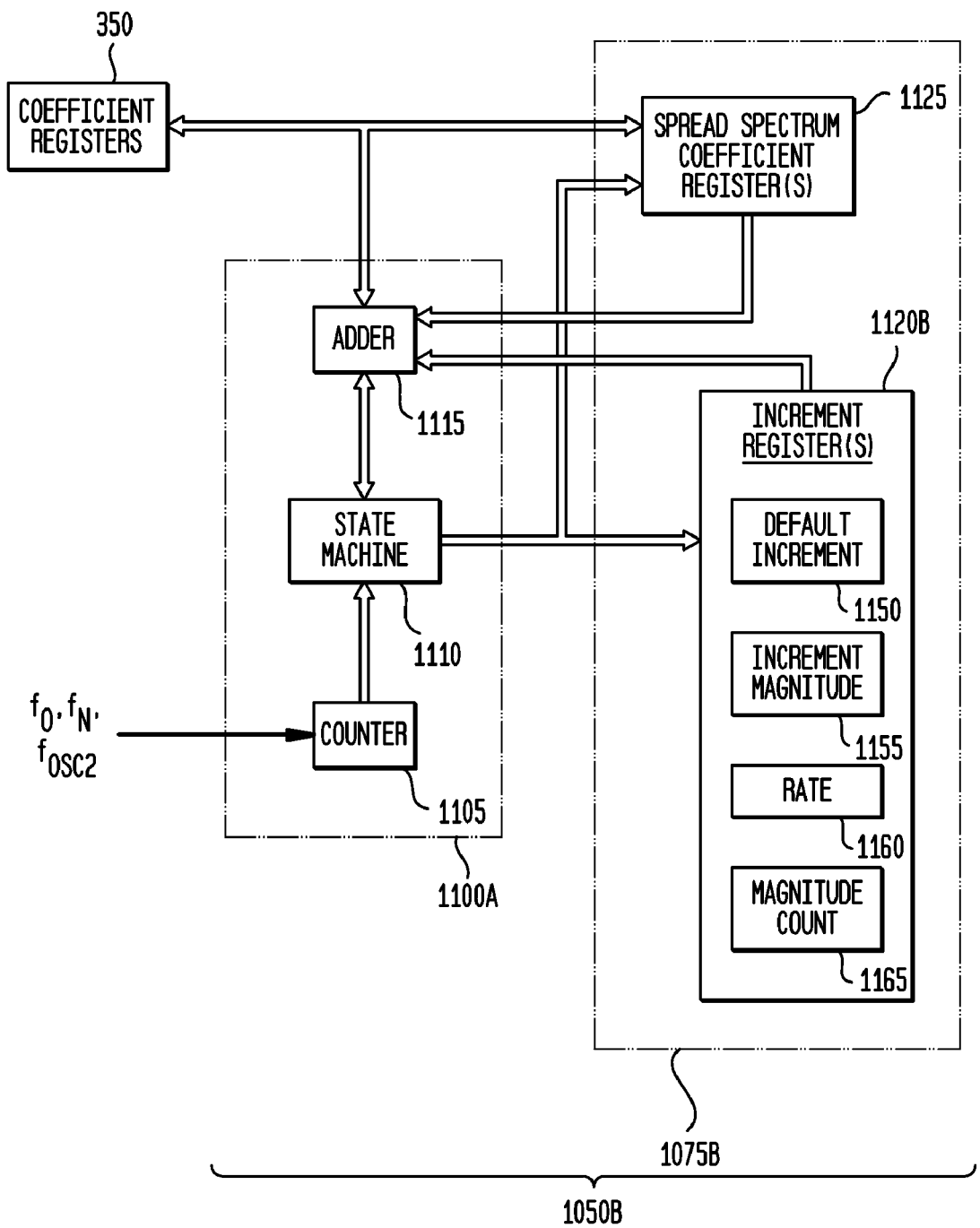
FIG. 43 is a block diagram illustrating in greater detail an exemplary third spread spectrum apparatus embodiment in accordance with the teachings of the present invention.

FIG. 43 is a block diagram illustrating in greater detail an exemplary third spread spectrum apparatus 1050B embodiment in accordance with the teachings of the present invention. Third spread spectrum apparatus 1050B differs from the apparatuses previously described insofar as it is specifically configured to provide spread spectrum functionality using a the reference signal $f_N$ having a changing frequency (rather than a substantially constant frequency from, for example, a second oscillator 1190), and to provide a triangular spreading profile at a selectable center reference frequency and a selectable modulation rate, which selection may be input through an I/O interface 120 (not separately illustrated in FIG. 43) or otherwise input, such as during a calibration process. The third spread spectrum apparatus 1050B may also be utilized for other spreading profiles, such as by changing the values of the various increments and the time intervals during which they are utilized. As mentioned above, those having skill in the electronic arts will recognize that simpler implementations are available when a substantially constant reference frequency is utilized, rather than the spread spectrum reference signal $f_N$ itself.

For this embodiment for a triangular spreading profile, each spread spectrum modulation period is divided into a fixed number of time intervals (or time steps), with corresponding time interval counts. Four types of parameters are stored within corresponding registers of an increment register 1120B, namely: (1) a default increment or decrement value (corresponding to a change in frequency) stored in default increment register 1150, to be utilized for each time interval (corresponding time interval count) unless otherwise modified; (2) an increment or decrement magnitude stored in increment magnitude register 1155, providing the amount of the non-default increment or decrement; (3) a spreading modulation rate or period (corresponding to the number of time intervals or steps (or the total number of time interval counts) per spreading modulation period, e.g., 31 in FIG. 39, 50 in FIGS. 40-42) stored in rate register 1160; and (4) a magnitude count stored in magnitude count register 1165, indicating how often (in the series of time intervals or series of time interval counts) to utilize the non-default increment or decrement magnitude. (It should also be noted that decrement values may be implemented as a 2s complement value.) The state machine 1110 utilizes these various parameters to provide the triangular (or other) spreading profile at the selected spreading modulation rate for the selected/calibrated center reference frequency. For example, the state machine 1110 generally provides the default increment to the adder 1115. At predetermined time interval counts (time steps) determined by the magnitude count parameter, the state machine 1110 provides a non-default increment/decrement to the adder 1115. This process continues until the end of the current spreading modulation period, defined by the spreading modulation rate parameter, at which point the counter 1105 is reset, and the spreading process repeats for another, next spreading modulation period. Those having skill in the electronic arts will recognize innumerable additional ways of defining or creating parameters for use by a state machine 1110 or other processor to implement a selected spreading modulation profile at a selected modulation rate, all of which are considered equivalent and within the scope of the present invention.

Figure 44:
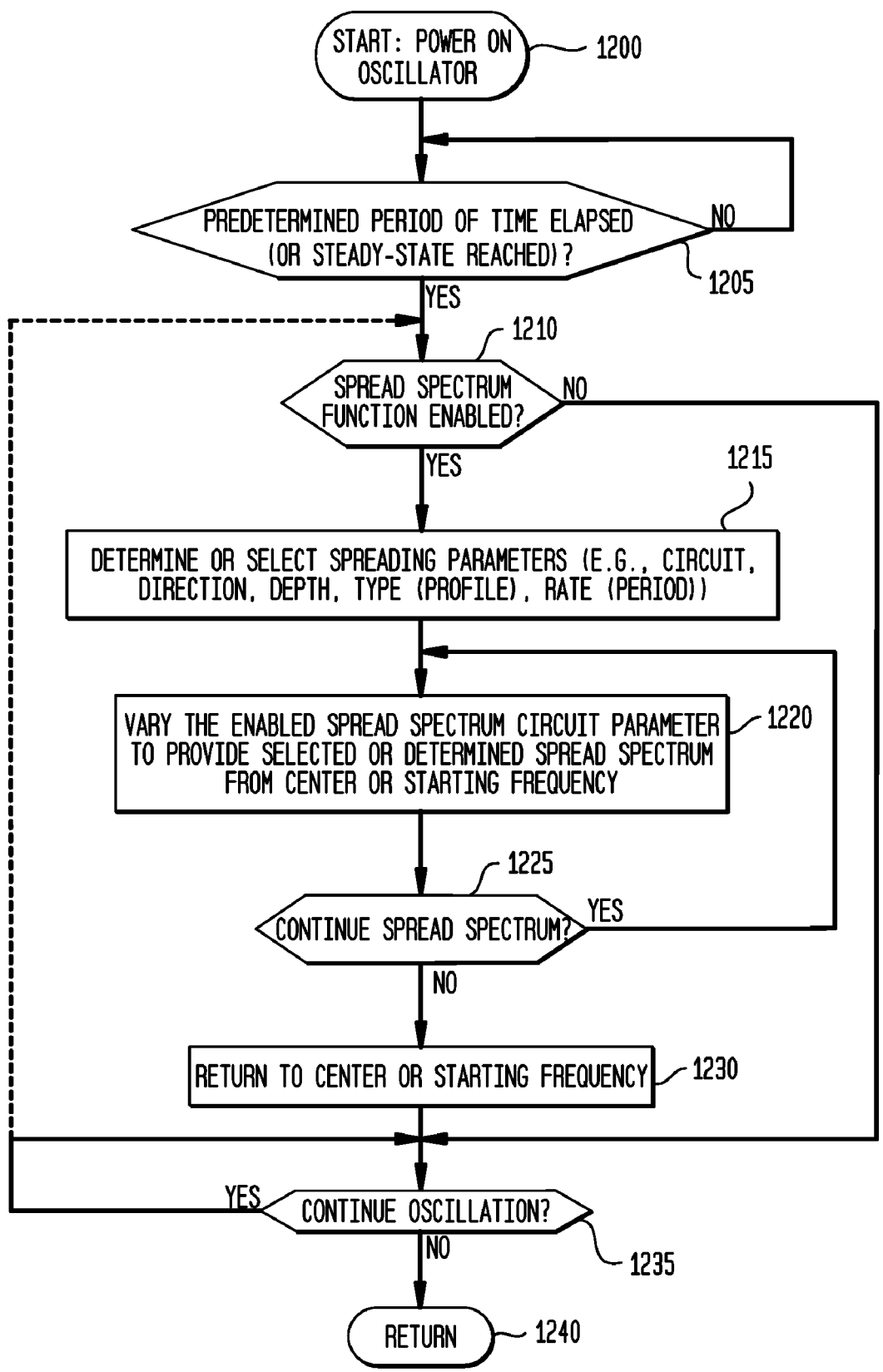
FIG. 44 is a flow diagram illustrating an exemplary first spread spectrum method embodiment in accordance with the teachings of the present invention.

FIG. 44 is a flow diagram illustrating an exemplary first spread spectrum method embodiment in accordance with the teachings of the present invention. Beginning with start step 1200, the oscillator (210, 310, 320) is powered on. As an option, the method then determines whether a predetermined period of time has elapsed or that the oscillator (210, 310, 320) has otherwise reached a steady-state at its center or starting frequency, step 1205. When spread spectrum functionality is enabled, step 1210, the method then determines or selects the spread spectrum parameters, such as the spread spectrum circuit parameter (e.g., reactance, control voltage, etc.) to be utilized to vary the frequency of the oscillator (210, 310, 320), the spreading direction (e.g., up, down, center), the degree or amount of spreading, the type (or profile) of spreading (e.g., triangular, exponential), and the spreading (modulation) rate or period, step 1215. As indicated above, these selections may be predetermined and stored in memory 1075 or coefficient register 350, such as during calibration or IC fabrication. For example, for the system 950, the spread spectrum functionality is enabled using switching of controlled reactance modules 335 as the spread spectrum circuit parameter, as part of IC fabrication, along with a triangular spreading profile at 30 kHz and a 1% modulation depth at a 24 MHz center frequency, predetermined during calibration of the oscillator 210, 310, 320. During operation, the spread spectrum controller 1100 obtains these spread spectrum parameters from memory 1075 or coefficient register 350, modifies the control coefficients accordingly.

Continuing to refer to FIG. 44, in step 1220, the spread spectrum controller 1100 varies the enabled spread spectrum circuit parameter to provide the selected or predetermined spread spectrum from the center or starting frequency. When the spread spectrum functionality is to continue, step 1225, the method returns to step 1220, and continues to vary the spread spectrum circuit parameter, and otherwise, as an option, the spread spectrum controller 1100 returns the oscillator (210, 310, 320) to its center or starting frequency, step 1230. The oscillation may continue at the center or starting frequency, step 1235, and/or the spread spectrum controller 1100 may monitor whether spread spectrum functionality may be re-enabled (returning to step 1210), or the oscillation may end, return step 1240, such as when the oscillator (210, 310, 320) is powered off.

Figure 45:
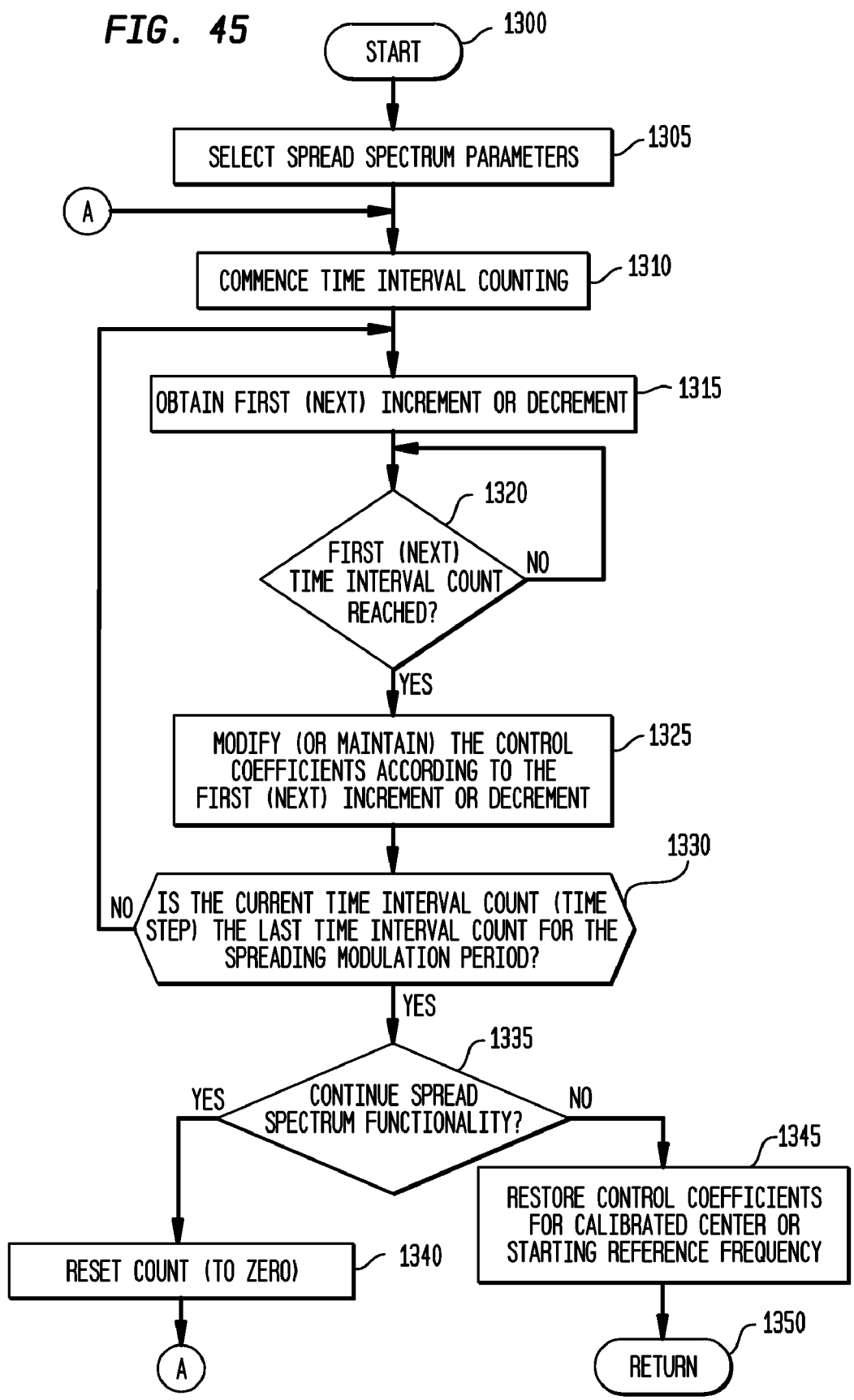
FIG. 45 is a flow diagram illustrating an exemplary second spread spectrum method embodiment in accordance with the teachings of the present invention.

FIG. 45 is a flow diagram illustrating an exemplary second spread spectrum method embodiment in accordance with the teachings of the present invention, and provides a useful summary of the operation of the exemplary apparatus embodiment 1050B. As indicated above, the methodology of the invention is typically implemented in the spread spectrum controller 1100 in conjunction with memory 1075 or coefficient register 350. Beginning with start step 1300, such as when spread spectrum functionality is enabled, spread spectrum parameters are obtained or selected, such as from memory 1075 or coefficient register 350, step 1305, such as the spread spectrum circuit parameters, the direction of spreading (center or down), the amount or degree of spreading (e.g., 1%, 2%), the type of spreading profile (e.g., triangular, sinusoidal, etc.), and the selected spreading modulation rate, for example and as discussed above. Alternatively, other parameters may be obtained, such as the default increment value, increment magnitude, spreading modulation rate, and magnitude count discussed above. Time interval counting is commenced, step 1310, such as by counter 1105 under the control of a state machine 1110, and the first (or next) increment or decrement is obtained, step 1315, such as from increment register(s) 1120. The method then determines whether the first (or next) time interval count has been reached, step 1320. When the first (or next) time interval count has been reached in step 1320, the method modifies or maintains the control coefficients according to the first (or next) increment or decrement, step 1325, such as by adding the first (or next) increment or decrement to the current set of control coefficients in adder 1115. The method then determines if the current time interval count (time step) is the last time interval count for the spreading modulation period, step 1130. When the current time interval count (time step) is not the last time interval count for the spreading modulation period in step 1330, such that the current spreading modulation period continues, the method returns to step 1315, and obtains the first (or next) increment or decrement, and spread spectrum functionality continues. When the current time interval count (time step) is the last time interval count for the spreading modulation period in step 1330, the method determines whether spread spectrum functionality will continue (i.e., has not been disabled), step 1335, and when it will continue, the count is reset to zero (in counter 1105), step 1340, and the method returns to step 1310, to commence time interval counting for the next spreading modulation period. When spread spectrum functionality will not continue in step 1335, having finished the current spreading modulation period, the method restores the control coefficients for the calibrated center or starting reference frequency, step 1345, and the method may end, return step 1350. Alternatively, without waiting for the end of the current spreading (modulation) period, the spread spectrum controller 1100 may just restore the control coefficients for the calibrated center reference frequency without finishing the spreading modulation period, and the method may end, return step 1350.

Figure 46:
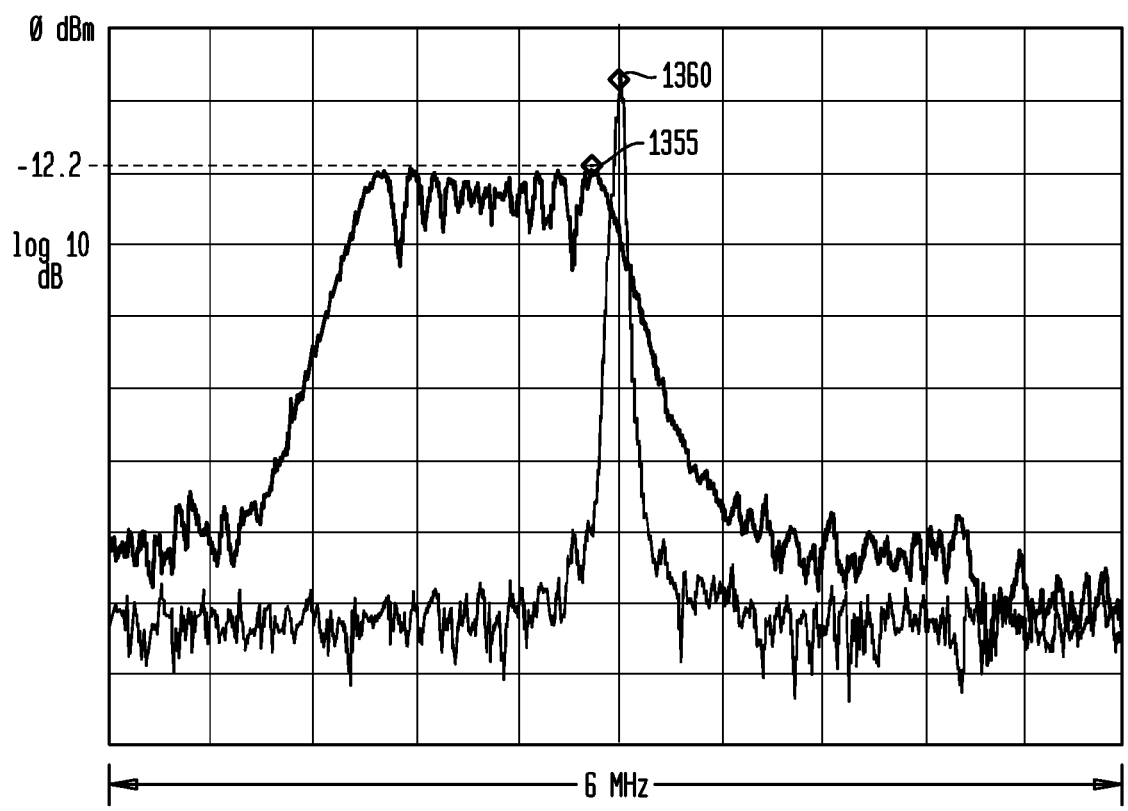
FIG. 46 is a graphical diagram illustrating the measured spread spectrum power reduction at the seventh harmonic for the third system embodiment in accordance with the teachings of the present invention.

FIG. 46 is a graphical diagram illustrating the measured spread spectrum power reduction at the seventh harmonic for the third system 950 embodiment in accordance with the teachings of the present invention. As illustrated, at the seventh harmonic, the spread spectrum functionality of the present invention provided a power reduction of 12.2 dB (1355), from the peak at the starting frequency (1360), using a down spread (triangular profile) of the controlled reactance modules 335 (specifically, switchable fixed capacitance modules 885), for a center or starting frequency of 24 MHz, spread at a 30 kHz rate and with a 1% modulation depth or range (240 kHz).

Figure 47:
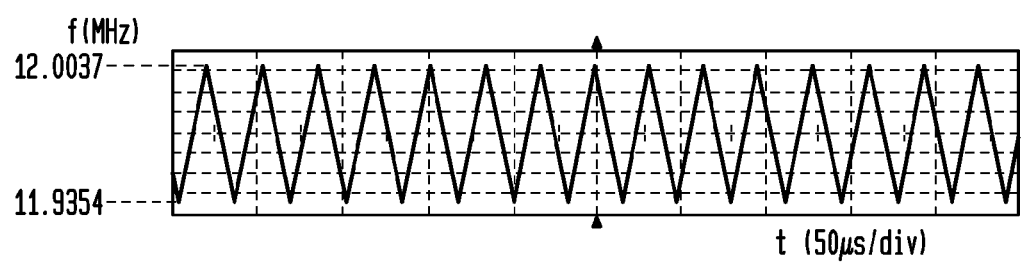
FIG. 47 is a graphical diagram illustrating the measured time domain demodulation for the spread spectrum for the third system embodiment in accordance with the teachings of the present invention.

FIG. 47 is a graphical diagram illustrating the measured time domain demodulation for the spread spectrum for the third system 950 embodiment in accordance with the teachings of the present invention. As illustrated, the spread spectrum functionality of the present invention did not generate any non-monotonic or spurious transitions, using a down spread (triangular profile) of the controlled reactance modules 335 (specifically, switchable fixed capacitance modules 885), for a center or starting frequency of 12 MHz, spread at a 30 kHz rate and with a 1.2% modulation depth or range (144 kHz).

Numerous advantages of the exemplary embodiments of the invention are readily apparent. The exemplary embodiments include a reference signal generator, system and method which provide a superior reference signal. The exemplary apparatus and system are capable of being fully integrated with other electronics. The exemplary reference signal generator and system provides a very accurate reference and/or clock signal, with very low error, very low phase noise and period jitter, and with extremely fast rise and fall times, rendering the exemplary embodiments suitable for highly exacting applications. The exemplary embodiments also provide for accurate frequency control over variable parameters such as temperature, fabrication process variation, and IC aging. The exemplary embodiments of the invention provide a spread spectrum reference signal which is considered to be superb by those having skill in the art, having a significant measured spread spectrum power reduction at the seventh harmonic, without generating any non-monotonic or spurious transitions.

Although the invention has been described with respect to specific embodiments thereof, these embodiments are merely illustrative and not restrictive of the invention. In the description herein, numerous specific details are provided, such as examples of electronic components, electronic and structural connections, materials, and structural variations, to provide a thorough understanding of embodiments of the present invention. One skilled in the relevant art will recognize, however, that an embodiment of the invention can be practiced without one or more of the specific details, or with other apparatus, systems, assemblies, components, materials, parts, etc. In other instances, well-known structures, materials, or operations are not specifically shown or described in detail to avoid obscuring aspects of embodiments of the present invention. In addition, the various Figures are not drawn to scale and should not be regarded as limiting.

Second circuitry 180, 925 may be any type of electronic or microelectromechanical device or circuit, and may include use of a single integrated circuit ("IC"), or may include use of a plurality of integrated circuits or other components connected, arranged or grouped together, such as controllers, microprocessors, digital signal processors ("DSPs"), parallel processors, multiple core processors, custom ICs, application specific integrated circuits ("ASICs"), field programmable gate arrays ("FPGAs"), adaptive computing ICs, associated memory (such as RAM, DRAM and ROM), other ICs and components, with associated memory, such as microprocessor memory or additional RAM, DRAM, SDRAM, SRAM, MRAM, ROM, FLASH, EPROM or E²PROM.

The coefficient register(s) 350, 935 and memory 710 may be embodied in any number of forms, including within any computer or other machine-readable data storage medium, memory device or other storage or communication device for storage or communication of information, currently known or which becomes available in the future, including, but not limited to, a memory integrated circuit ("IC"), or memory portion of an integrated circuit (such as the resident memory within a controller or processor IC), whether volatile or nonvolatile, whether removable or non-removable, including without limitation RAM, FLASH, DRAM, SDRAM, SRAM, MRAM, FeRAM, ROM, EPROM or E²PROM, or any other form of memory device, such as a magnetic hard drive, an optical drive, a magnetic disk or tape drive, a hard disk drive, other machine-readable storage or memory media such as a floppy disk, a CDROM, a CD-RW, digital versatile disk (DVD) or other optical memory, or any other type of memory, storage medium, or data storage apparatus or circuit, which is known or which becomes known, depending upon the selected embodiment. In addition, such computer readable media includes any form of communication media which embodies computer readable instructions, data structures, program modules or other data in a data signal or modulated signal, such as an electromagnetic or optical carrier wave or other transport mechanism, including any information delivery media, which may encode data or other information in a signal, wired or wirelessly, including electromagnetic, optical, acoustic, RF or infrared signals, and so on. The coefficient register(s) 350, 935 and memory 710 may be adapted to store various look up tables, parameters, coefficients, other information and data, programs or instructions, and other types of tables such as database tables.

Reference throughout this specification to "one embodiment", "an embodiment", or a specific "embodiment" means that a particular feature, structure, or characteristic described in connection with the embodiment is included in at least one embodiment of the present invention and not necessarily in all embodiments, and further, are not necessarily referring to the same embodiment. Furthermore, the particular features, structures, or characteristics of any specific embodiment of the present invention may be combined in any suitable manner and in any suitable combination with one or more other embodiments, including the use of selected features without corresponding use of other features. In addition, many modifications may be made to adapt a particular application, situation or material to the essential scope and spirit of the present invention. It is to be understood that other variations and modifications of the embodiments of the present invention described and illustrated herein are possible in light of the teachings herein and are to be considered part of the spirit and scope of the present invention.

It will also be appreciated that one or more of the elements depicted in the Figures can also be implemented in a more separate or integrated manner, or even removed or rendered inoperable in certain cases, as may be useful in accordance with a particular application. Integrally formed combinations of components are also within the scope of the invention, particularly for embodiments in which a separation or combination of discrete components is unclear or indiscernible. In addition, use of the term "coupled" herein, including in its various forms such as "coupling" or "couplable", means and includes any direct or indirect electrical, structural or magnetic coupling, connection or attachment, or adaptation or capability for such a direct or indirect electrical, structural or magnetic coupling, connection or attachment, including integrally formed components and components which are coupled via or through another component.

Furthermore, any signal arrows in the drawings/Figures should be considered only exemplary, and not limiting, unless otherwise specifically noted. Combinations of components of steps will also be considered within the scope of the present invention, particularly where the ability to separate or combine is unclear or foreseeable. The disjunctive term "or", as used herein and throughout the claims that follow, is generally intended to mean "and/or", having both conjunctive and disjunctive meanings (and is not confined to an "exclusive or" meaning), unless otherwise indicated. As used in the description herein and throughout the claims that follow, "a", "an", and "the" include plural references unless the context clearly dictates otherwise. Also as used in the description herein and throughout the claims that follow, the meaning of "in" includes "in" and "on" unless the context clearly dictates otherwise.

The foregoing description of illustrated embodiments of the present invention, including what is described in the summary or in the abstract, is not intended to be exhaustive or to limit the invention to the precise forms disclosed herein. From the foregoing, it will be observed that numerous variations, modifications and substitutions are intended and may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. An apparatus, comprising:
   a reference oscillator to provide a reference signal having a reference frequency;
   a coefficient register to store a plurality of coefficients;
   a plurality of controlled reactance modules coupled to the coefficient register, each controlled reactance module responsive to a corresponding coefficient of the plurality of coefficients to modify an effective reactance of the reference oscillator; and
   a spread spectrum controller comprising a counter and a state machine, the counter to provide a plurality of time interval counts and the state machine, in response to a predetermined time interval count of the plurality of time interval counts, to select or modify a plurality of coefficients from the coefficient register to generate a spread spectrum reference signal at a plurality of different reference frequencies over a predetermined time period.

2. The apparatus of claim 1, wherein the spread spectrum controller further is to modify a spread spectrum parameter of the reference oscillator to modify the reference frequency.

3. The apparatus of claim 2, wherein the spread spectrum parameter is at least one of the following spread spectrum parameters: the effective reactance, a control voltage, an oscillation amplitude, a common mode voltage, or a transconductance.

4. The apparatus of claim 1, wherein the spread spectrum reference signal is configurable to have a selected spread spectrum profile having a spreading direction, a depth of spreading, and a spreading modulation rate or period.

5. The apparatus of claim 1, wherein the spread spectrum controller further is to modify the effective reactance by switching a capacitance of the plurality of controlled reactance modules to or from the reference oscillator.

6. The apparatus of claim 1, wherein the spread spectrum controller further is to modify the effective reactance by selecting or modifying a plurality of coefficients to control switching of a capacitance of the plurality of controlled reactance modules to or from the reference oscillator.

7. The apparatus of claim 1, wherein the plurality of controlled reactance modules comprises at least one varactor, and wherein the spread spectrum controller further is to modify the effective reactance by modifying a control voltage of the varactor.

8. The apparatus of claim 7, wherein the spread spectrum controller further is to select or modify the plurality of coefficients to modify the control voltage.

9. The apparatus of claim 7, wherein the reference oscillator further comprises a control voltage generator having a variable resistance, and wherein the spread spectrum controller further is to modify the control voltage by varying the variable resistance.

10. The apparatus of claim 1, wherein the spread spectrum controller further is to modify the effective reactance by switching an inductance to or from the reference oscillator.

11. The apparatus of claim 1, wherein the spread spectrum controller further is to modify an effective impedance of the reference oscillator.

12. The apparatus of claim 1, wherein the spread spectrum controller further is to modify an effective resistance of the reference oscillator.

13. The apparatus of claim 1, wherein the spread spectrum controller further is to modify an amplitude of the reference signal of the reference oscillator.

14. The apparatus of claim 13, wherein the spread spectrum controller further is to modify the amplitude by modifying a current of the reference oscillator.

15. The apparatus of claim 1, wherein the spread spectrum controller further is to modify a common mode voltage of the reference oscillator.

16. The apparatus of claim 15, wherein the spread spectrum controller further is to modify the common mode voltage by modifying a current of the reference oscillator.

17. The apparatus of claim 1, wherein the spread spectrum controller further is to modify a current of the reference oscillator by modifying a reference voltage.

18. The apparatus of claim 1, wherein the spread spectrum controller further is to modify a divide ratio of the reference signal of the reference oscillator.

19. The apparatus of claim 1, wherein the spread spectrum controller further is to modify a transconductance of the reference oscillator.

20. The apparatus of claim 1, wherein the spread spectrum controller further is to select or modify at least one coefficient of the plurality of coefficients to control the reference oscillator to generate the spread-spectrum reference signal.

21. The apparatus of claim 1, wherein each controlled reactance module comprises a capacitance, an inductance, and/or a resistance.

22. The apparatus of claim 1, wherein each controlled reactance module comprises one or more capacitors, each capacitor having a single predetermined unit of capacitance.

23. The apparatus of claim 1, wherein each controlled reactance module comprises one or more capacitors and a resistor, each capacitor having a single predetermined unit of capacitance.

24. The apparatus of claim 1, wherein the effective reactance is modified by switching a controlled reactance module to or from the reference oscillator in response to the corresponding coefficient.

25. The apparatus of claim 1, wherein the reference oscillator further comprises a control voltage generator, and wherein the effective reactance is modified by changing a control voltage, in response to the corresponding coefficient, to a controlled reactance module coupled to the reference oscillator.

26. The apparatus of claim 1, wherein the spread spectrum controller is coupled to the coefficient register and further is to sequentially modify the plurality of coefficients during the predetermined time period to provide the spread-spectrum reference signal.

27. The apparatus of claim 1, wherein each controlled reactance module of the plurality of controlled reactance modules is responsive to a corresponding coefficient of the plurality of coefficients to modify an amount of reactance coupled to the reference oscillator.

28. The apparatus of claim 27, wherein the spread spectrum controller further is to increment or decrement the plurality of coefficients to modify the reference frequency.

29. The apparatus of claim 27, wherein the plurality of controlled reactance modules is linearly responsive to the plurality of coefficients to modify substantially linearly the amount of reactance coupled to the reference oscillator.

30. The apparatus of claim 1, further comprising:
a memory to store a plurality of increment values; and
wherein the spread spectrum controller further comprises an adder; and wherein the state machine, in response to a predetermined time interval count of the plurality of time interval counts, is to signal the adder to add a corresponding increment value, of the plurality of increment values, to the plurality of coefficients to provide a next plurality of coefficients to the coefficient register.

31. The apparatus of claim 30, wherein the state machine further is to modify or select the increment value, of the plurality of increment values, in response to a predetermined time interval count of the plurality of time interval counts.

32. The apparatus of claim 1, wherein the spread-spectrum reference signal has at least one of the following types of spread spectrum profiles: a triangular spread spectrum profile, a sinusoidal spread spectrum profile, an exponential spread spectrum profile, or a dual-inflection spread spectrum profile.

33. An apparatus, comprising:
a reference resonator to provide a reference signal having a resonant frequency;
a coefficient register to store a plurality of coefficients;
a plurality of controlled reactance modules coupled to the reference resonator and to the coefficient register; and
a spread spectrum controller coupled to the coefficient register, the spread spectrum controller comprising a counter and a state machine, the counter to provide a plurality of time interval counts; and the state machine, in response to a predetermined time interval count of the plurality of time interval counts, to select or modify a plurality of coefficients from the coefficient register to provide the reference signal at a plurality of different resonant frequencies during a selected or predetermined time period.

34. The apparatus of claim 33, wherein each controlled reactance module of the plurality of controlled reactance modules is responsive to a corresponding coefficient of the plurality of coefficients to modify an amount of reactance coupled to the reference resonator.

35. The apparatus of claim 34, wherein the spread spectrum controller further is to increment or decrement the at least one coefficient to modify the resonant frequency.

36. The apparatus of claim 34, wherein the spread spectrum controller further is to sequentially increment and sequentially decrement the at least one coefficient to provide a triangular spread spectrum profile.

37. The apparatus of claim 34, wherein the spread spectrum controller further is to increment or decrement the at least one coefficient to modify the resonant frequency and provide the plurality of different resonant frequencies having a selected spread spectrum profile during the selected time period.

38. The apparatus of claim 37, wherein the selected spread spectrum profile is at least one of the following types of spread spectrum profiles: a triangular spread spectrum profile, a sinusoidal spread spectrum profile, an exponential spread spectrum profile, or a dual-inflection spread spectrum profile.

39. The apparatus of claim 34, wherein the plurality of controlled reactance modules is substantially linearly responsive to the plurality of coefficients to modify substantially linearly the amount of reactance coupled to the reference resonator.

40. The apparatus of claim 34, wherein a controlled reactance module of the plurality of controlled reactance modules is responsive to a corresponding coefficient of the plurality of coefficients to switch a corresponding reactance to the reference resonator.

41. The apparatus of claim 34, wherein a controlled reactance module of the plurality of controlled reactance modules is responsive to a corresponding coefficient of the plurality of coefficients to switch a corresponding reactance to a control voltage.

42. The apparatus of claim 34, further comprising a control voltage generator, and wherein the control voltage generator is responsive to a corresponding coefficient of the plurality of coefficients to modify a control voltage for a corresponding controlled reactance module of the plurality of controlled reactance modules.

43. The apparatus of claim 33, wherein the plurality of controlled reactance modules further comprises:
a plurality of switchable capacitive modules coupled to the coefficient register and to the reference resonator, each switchable capacitive module having a fixed capacitance and a variable capacitance, each switchable capacitive module responsive to a corresponding coefficient of the plurality of coefficients to switch between the fixed capacitance and the variable capacitance and to switch each variable capacitance to a control voltage.

44. The apparatus of claim 43, wherein the plurality of controlled reactance modules further comprises:
a plurality of switchable resistive modules coupled to the coefficient register, each switchable resistive module responsive to a corresponding coefficient of the plurality of coefficients to switch the switchable resistive module to a control voltage or to the reference resonator.

45. The apparatus of claim 33, wherein the plurality of controlled reactance modules further comprises:
a plurality of switchable capacitive modules coupled to the coefficient register and to the reference resonator, each switchable capacitive module having a first fixed capacitance and a second fixed capacitance, each switchable capacitive module responsive to a corresponding coefficient of the plurality of calibration coefficients to switch between the first fixed capacitance and the second fixed capacitance.

46. The apparatus of claim 33, wherein the plurality of controlled reactance modules further comprises:
an array having a plurality of switchable variable capacitive modules coupled to the coefficient register and to the reference resonator, each switchable variable capacitive module responsive to a corresponding coefficient of the plurality of calibration coefficients to switch between a first voltage and a second voltage.

47. The apparatus of claim 46, wherein at least one of the first voltage and second voltage is a fixed voltage.

48. The apparatus of claim 46, wherein at least one of the first voltage and second voltage is a variable voltage.

49. The apparatus of claim 33, wherein the plurality of controlled reactance modules further comprises:
an array having a plurality of variable capacitive modules coupled to the reference resonator and to a control voltage.

50. The apparatus of claim 49, wherein the control voltage is variable in response to the plurality of coefficients.

51. The apparatus of claim 33, wherein the plurality of controlled reactance modules further comprises:
a plurality of switchable capacitive modules coupled to the coefficient register and to the reference resonator, each switchable capacitive module responsive to a corresponding coefficient of the plurality of calibration coefficients to switch to or from the reference resonator.

52. The apparatus of claim 51, wherein each switchable capacitive module comprises one or more capacitors, each capacitor having a single predetermined unit of capacitance.

53. The apparatus of claim 51, wherein each switchable capacitive module comprises one or more capacitors and a resistor, each capacitor having a single predetermined unit of capacitance.

54. The apparatus of claim 33, wherein the spread spectrum controller further comprises an adder; and wherein the state machine, in response to a predetermined time interval count of the plurality of time interval counts, is to signal the adder to add an increment value to the plurality of coefficients to provide a next plurality of coefficients to the coefficient register.

55. The apparatus of claim 54, wherein the plurality of time interval counts are determined by counting successive rising or falling edges of the reference signal.

56. The apparatus of claim 54, further comprising a memory to store a plurality of increment values corresponding to a plurality of predetermined time interval counts to form a spread spectrum profile.

57. The apparatus of claim 56, wherein the state machine further, in response to each predetermined time interval count of the plurality of predetermined time interval counts, is to signal the adder to add a corresponding increment value, of the plurality of increment values, to the plurality of coefficients to provide a next plurality of coefficients to the coefficient register.

58. The apparatus of claim 54, wherein the state machine further is to modify or select the increment value in response to a predetermined time interval count of the plurality of time interval counts.

59. The apparatus of claim 33, further comprising:
an input-output interface to receive a plurality of spread spectrum parameters.

60. The apparatus of claim 59, wherein the plurality of spread spectrum parameters comprises at least two of the following parameters: a spreading direction, a depth of spreading, and a spreading modulation rate or period.

61. The apparatus of claim 33, further comprising:
a second oscillator coupled to the spread spectrum controller and to provide a clock signal at a substantially fixed frequency.

62. The apparatus of claim 33, wherein the state machine comprises a finite state machine and wherein the spread spectrum controller further comprises combinational logic circuitry.

63. The apparatus of claim 33, wherein the spread spectrum controller comprises a processor having the counter and the state machine.

64. The apparatus of claim 33, further comprising:
a frequency divider coupled to the reference resonator, the frequency divider to divide the resonant frequency by a rational number into a plurality of second signals having a corresponding plurality of frequencies, the plurality of frequencies substantially equal to or lower than the resonant frequency.

65. A spread spectrum clock generator comprising:
a reference oscillator to provide a reference signal having a reference frequency;
a coefficient register to store a plurality of coefficients;
a plurality of controlled reactance modules coupled to the reference oscillator and to the coefficient register, each controlled reactance module responsive to a corresponding coefficient of the plurality of coefficients to modify an amount of effective reactance coupled to the reference oscillator; and
a spread spectrum controller comprising a counter, an adder and a state machine, the counter to provide a plurality of time interval counts and the state machine, in response to a predetermined time interval count of the plurality of time interval counts, to select or modify a plurality of coefficients from the coefficient register to control the reference oscillator to generate a reference signal at a plurality of different reference frequencies.

66. The apparatus of claim 65, wherein the spread spectrum controller further is to signal the adder to increment or decrement the plurality of coefficients to modify the reference frequency.

67. The apparatus of claim 65, wherein the plurality of controlled reactance modules is linearly responsive to the plurality of coefficients to modify substantially linearly the amount of reactance coupled to the reference oscillator.

68. The apparatus of claim 65, wherein a controlled reactance module of the plurality of controlled reactance modules is responsive to a corresponding coefficient of the plurality of coefficients to switch a corresponding reactance to the reference oscillator or to switch a corresponding reactance to a control voltage.

69. The apparatus of claim 65, further comprising a control voltage generator coupled to the plurality of controlled reactance modules, wherein the control voltage generator is responsive to a corresponding coefficient of the plurality of coefficients to modify a control voltage for a corresponding reactance.

70. The apparatus of claim 65, wherein the reference signal has at least one of the following types of spread spectrum profiles: a triangular spread spectrum profile, a sinusoidal spread spectrum profile, an exponential spread spectrum profile, or a dual-inflection spread spectrum profile.

71. The apparatus of claim 65, wherein the coefficient register is a memory to also store a plurality of increment values, and wherein the state machine, in response to a predetermined time interval count of the plurality of time interval counts, is to signal the adder to add a corresponding increment value, of the plurality of increment values, to the plurality of coefficients to provide a next plurality of coefficients to the coefficient register.

72. The apparatus of claim 71, wherein the state machine further is to modify or select the increment value, of the plurality of increment values, in response to a predetermined time interval count of the plurality of time interval counts.

73. A method of spread-spectrum clock generation, comprising:
generating a reference signal from a reference oscillator;
counting the reference signal to provide a plurality of time interval counts; and
modifying a plurality of coefficients to modify an amount of reactance effectively coupled to the reference oscillator at a plurality of predetermined time interval counts of the plurality of time interval counts to generate a spread-spectrum reference signal at a plurality of different reference frequencies during a predetermined time period.

74. The method of claim 43, wherein the modifying step further comprises:
sequentially modifying the plurality of coefficients during the predetermined time period to provide the spread-spectrum reference signal.

75. The method of claim 73, wherein the modifying step further comprises:
responding to a corresponding coefficient of the plurality of coefficients to modify an amount of reactance coupled to the reference oscillator.

76. The method of claim 73, wherein the modifying step further comprises:
switching a corresponding reactance to the reference oscillator or switching a corresponding reactance to a control voltage.

77. The method of claim 73, wherein the modifying step further comprises:
incrementing or decrementing the plurality of coefficients to modify the reference frequency.

78. The method of claim 73, wherein the modifying step further comprises:
modifying a control voltage during the predetermined time period to provide the spread-spectrum reference signal.

79. The method of claim 73, wherein the modifying step further comprises:
modifying a current of the reference oscillator during the predetermined time period to provide the spread-spectrum reference signal.

80. The method of claim 73, wherein the modifying step further comprises:
modifying an oscillation amplitude of the reference signal during the predetermined time period to provide the spread-spectrum reference signal.

81. The method of claim 73, wherein the modifying step further comprises:
modifying a common mode voltage of the reference oscillator during the predetermined time period to provide the spread-spectrum reference signal.

82. The method of claim 73, wherein the modifying step further comprises:
modifying a divide ratio of the reference oscillator during the predetermined time period to provide the spread-spectrum reference signal.

83. The method of claim 73, further comprising:
restoring an initial plurality of coefficients to generate the reference signal having a calibrated, staffing or center reference frequency.

84. The method of claim 73, wherein the modifying step further comprises:

determining an increment value, of a plurality of increment values, corresponding to a predetermined time interval count of the plurality of time interval counts; and in response to the predetermined time interval count, incrementing or decrementing the plurality of coefficients.

85. A spread spectrum controller couplable to a reference oscillator, the reference oscillator to provide a reference signal having a reference frequency, the spread spectrum controller comprising:

a memory to store a plurality of coefficients and a plurality of increment values; and a controller comprising a counter, an adder and a state machine, the counter to provide a plurality of time interval counts, and the state machine, in response to a predetermined time interval count of the plurality of time interval counts, to signal the adder to add a corresponding increment value, of the plurality of increment values, to the plurality of coefficients to provide a next plurality of coefficients to the coefficient register to control the reference oscillator to generate a spread-spectrum reference signal at a plurality of different reference frequencies during a predetermined time period.

86. The spread spectrum controller of claim 85, wherein a plurality of controlled reactance modules are coupled to the reference oscillator and responsive to a corresponding coefficient of the plurality of coefficients to modify an amount of effective reactance coupled to the reference oscillator, and wherein the controller further is to sequentially modify the plurality of coefficients during the predetermined time period to provide the spread-spectrum reference signal.

87. The spread spectrum controller of claim 85, wherein the controller further is to decrement the plurality of coefficients to modify the reference frequency.

88. The spread spectrum controller of claim 85, wherein the state machine further is to modify or select the increment value, of the plurality of increment values, in response to a predetermined time interval count of the plurality of time interval counts.

\* \* \* \* \*

UNITED STATES PATENT AND TRADEMARK OFFICE
CERTIFICATE OF CORRECTION

PATENT NO. : 7,719,371 B2  Page 1 of 1
APPLICATION NO. : 11/967234
DATED : May 18, 2010
INVENTOR(S) : Pernia et al.

It is certified that error appears in the above-identified patent and that said Letters Patent is hereby corrected as shown below:

In the Claims:
Column 66, Claim 74, Line 20: Please correct "43" to read -- 73 --

Column 66, Claim 83, Line 66: Please correct "staffing" to read -- starting --

Signed and Sealed this

Sixteenth Day of November, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,719,371 B2 | Page 1 of 1 |
| APPLICATION NO. | : 11/967234 | |
| DATED | : May 18, 2010 | |
| INVENTOR(S) | : Pernia et al. | |

It is certified that error appears in the above-identified patent and that said Letters Patent is hereby corrected as shown below:

Column 2, Line 33; Please insert the following language before FIELD OF INVENTION:

--GOVERNMENT FUNDING

This invention was made with Government support under NSF Grant (EEC) 9986866 awarded by the National Science Foundation. The Government has certain rights in this invention.--

Signed and Sealed this
Sixteenth Day of October, 2012

David J. Kappos
*Director of the United States Patent and Trademark Office*